(12) United States Patent
Itonaga et al.

(10) Patent No.: US 12,445,580 B2
(45) Date of Patent: Oct. 14, 2025

(54) LIGHT-EMITTING ELEMENT, DISPLAY DEVICE AND SURFACE-EMITTING DEVICE

(71) Applicant: SONY GROUP CORPORATION, Tokyo (JP)

(72) Inventors: Kazuichiro Itonaga, Tokyo (JP); Kiyoshi Kaneuchi, Kumamoto (JP); Nobuaki Hokazono, Kumamoto (JP)

(73) Assignee: Sony Group Corporation, Tokyo (JP)

( * ) Notice: Subject to any disclaimer, the term of this patent is extended or adjusted under 35 U.S.C. 154(b) by 746 days.

(21) Appl. No.: 17/775,847

(22) PCT Filed: Oct. 23, 2020

(86) PCT No.: PCT/JP2020/039912
§ 371 (c)(1),
(2) Date: May 10, 2022

(87) PCT Pub. No.: WO2021/100406
PCT Pub. Date: May 27, 2021

(65) Prior Publication Data
US 2022/0407037 A1 Dec. 22, 2022

(30) Foreign Application Priority Data
Nov. 22, 2019 (JP) ................. 2019-211180

(51) Int. Cl.
*H10K 59/126* (2023.01)
*H04N 9/31* (2006.01)
*H10K 59/80* (2023.01)
*H10K 59/122* (2023.01)
*H10K 59/35* (2023.01)

(52) U.S. Cl.
CPC ......... *H04N 9/3138* (2013.01); *H10K 59/878* (2023.02); *H10K 59/879* (2023.02);
(Continued)

(58) Field of Classification Search
CPC ...... H10K 59/35; H10K 59/88; H10K 59/122; H10K 59/126; H10K 59/878;
(Continued)

(56) References Cited

U.S. PATENT DOCUMENTS

2004/0223234 A1* 11/2004 Konno ........... G02B 15/143507
359/738
2010/0060149 A1   3/2010 Song et al.
(Continued)

FOREIGN PATENT DOCUMENTS

CN       1838425 A      9/2006
JP     2000-284726     10/2000
(Continued)

OTHER PUBLICATIONS

International Search Report and Written Opinion prepared by the Japan Patent Office on Dec. 22, 2020, for International Application No. PCT/JP2020/039912, 3 pgs.

*Primary Examiner* — Ajay Ojha
(74) *Attorney, Agent, or Firm* — Sheridan Ross PC

(57) ABSTRACT

A light-emitting element of the present disclosure includes a light-emitting section including a plurality of light-emitting regions, and one or a plurality of microlens members controlling a traveling direction of light emitted from each of the light-emitting regions. Alternatively, the light-emitting element of the present disclosure includes a light-emitting section including one light-emitting region, and a plurality of microlens members controlling a traveling direction of light emitted from the one light-emitting region. Alternatively, the light-emitting element of the present disclosure includes a light-emitting section including a plurality of light-emitting regions, and one or a plurality of microlens members controlling a traveling direction of each light emitted from the plurality of light-emitting regions.

20 Claims, 30 Drawing Sheets

(52) U.S. Cl.
CPC ........... *H10K 59/122* (2023.02); *H10K 59/35* (2023.02); *H10K 59/8051* (2023.02); *H10K 59/8052* (2023.02); *H10K 59/876* (2023.02)

(58) Field of Classification Search
CPC ............. H10K 59/879; H10K 59/8051; H10K 59/8052; H10K 59/8761; H10K 50/856; H10K 50/858; H10K 71/50; H10K 102/00; H10K 2102/3026; H04N 9/31; H04N 9/3138; H05B 33/12; H05B 33/24; H05B 33/02; H05B 33/22; G02B 3/00; G02B 6/0001; G02B 3/02; G09F 9/30; F21Y 115/15; F21Y 2115/15
USPC .......................................................... 257/40
See application file for complete search history.

(56) References Cited

U.S. PATENT DOCUMENTS

| | | | |
|---|---|---|---|
| 2013/0272028 A1* | 10/2013 | Hong | G02B 6/0036 362/619 |
| 2017/0062770 A1 | 3/2017 | Jang | |
| 2018/0284465 A1* | 10/2018 | Kwon | H10F 39/802 |
| 2019/0363273 A1 | 11/2019 | Tanaka | |
| 2019/0393285 A1* | 12/2019 | Kato | H10K 59/38 |

FOREIGN PATENT DOCUMENTS

| | | |
|---|---|---|
| JP | 2001-265240 | 9/2001 |
| JP | 2003-317931 | 11/2003 |
| JP | 2009-049135 | 3/2009 |
| JP | 2011-076799 | 4/2011 |
| JP | 2012-014905 | 1/2012 |
| JP | 2018-107031 | 7/2018 |
| JP | 2019-133816 | 8/2019 |
| KR | 20090131478 A | 12/2009 |
| KR | 20100030982 A | 3/2010 |
| KR | 20160091402 A | 8/2016 |
| KR | 20180110715 A | 10/2018 |
| KR | 20190098874 A | 8/2019 |
| WO | WO 01/39554 | 5/2001 |
| WO | WO 2018/139171 | 8/2018 |

* cited by examiner

LIGHT-EMITTING ELEMENT, DISPLAY DEVICE AND SURFACE-EMITTING DEVICE

CROSS REFERENCE TO RELATED APPLICATIONS

This application is a national stage application under 35 U.S.C. 371 and claims the benefit of PCT Application No. PCT/JP2020/039912, having an international filing date of 23 Oct. 2020, which designated the United States, which PCT application claimed the benefit of Japanese Patent Application No. 2019-211180, filed 22 Nov. 2019, the entire disclosures of each of which are incorporated herein by reference.

TECHNICAL FIELD

The present disclosure relates to a light-emitting element as well as a display device and a surface-emitting device including such a light-emitting element, and more particularly to a self-luminous light-emitting element as well as a display device and a surface-emitting device including such a self-luminous light-emitting element.

BACKGROUND ART

Recently, an illumination device and an organic electroluminescence display device (hereinafter, simply abbreviated as organic EL display device) using, as a light-emitting element, an organic electroluminescence element (hereinafter, simply abbreviated as an organic EL element) have been becoming popular. In addition, a technique to efficiently extract light has been strongly required to be developed in the organic EL display device. When light extraction efficiency is low, it follows that actual light emission amount in the organic EL element is not effectively utilized, which causes a large loss in terms of power consumption, or the like. Further, attempts have been made in the organic EL element to control light generated in a light-emitting layer, such as introducing a resonator structure to thereby improve color purity of light emission colors and enhance luminous efficiency (e.g., see International Publication No. WO2001/039554). Furthermore, Japanese Unexamined Patent Application Publication No. 2009-049135, for example, discloses that bringing light generated in the resonator structure and light returned by reflection at each reflection end into a mutually reinforcing relationship makes it possible to maximize light emission intensity.

In addition, an existing projection display device is configured by, for example, a light source that emits light, a spatial modulator that modulates the light from the light source to form an image, and a projection optical system that projects the image from the spatial modulator onto a screen, for example.

CITATION LIST

Patent Literature

PTL 1: International Publication No. WO2001/039554
PTL 2: Japanese Unexamined Patent Application Publication No. 2009-049135

SUMMARY OF THE INVENTION

Problem to be Solved by the Invention

However, as far as the present inventor investigated, there has not been known a projection display device in which a light source emitting light and a spatial modulator forming an image are integrated, i.e., a projection display device or surface-emitting device enabling formation of an image by a self-luminous light-emitting element instead of the light source and the spatial modulator.

Accordingly, an object of the present disclosure is to provide a display device including a projection display device enabling formation of an image by a self-luminous light-emitting element, a surface-emitting device configured by the self-luminous light-emitting element, and a light-emitting element suitable for use in such a display device or a surface-emitting device.

Means for Solving the Problem

A light-emitting element according to a first aspect of the present disclosure to achieve the above-described object includes:
 a light-emitting section including a plurality of light-emitting regions; and
 one or a plurality of microlens members controlling a traveling direction of light emitted from each of the light-emitting regions.

A light-emitting element according to a second aspect of the present disclosure to achieve the above-described object includes:
 a light-emitting section including one light-emitting region; and
 a plurality of microlens members controlling a traveling direction of light emitted from the one light-emitting region.

A light-emitting element according to a third aspect of the present disclosure to achieve the above-described object includes:
 a light-emitting section including a plurality of light-emitting regions; and
 one or a plurality of microlens members controlling a traveling direction of each light emitted from the plurality of light-emitting regions.

A light-emitting element according to a fourth aspect of the present disclosure to achieve the above-described object includes:
 a light-emitting section including a plurality of light-emitting regions; and
 a light-guiding section controlling a traveling direction of light emitted from each of the light-emitting regions, in which the light-emitting region has a convex shape in a direction away from the light-guiding section.

A display device of the present disclosure to achieve the above-described object includes:
 a first substrate;
 a second substrate; and
 a panel including a plurality of light-emitting elements interposed between the first substrate and the second substrate, in which
 each of the light-emitting elements is configured by the light-emitting element according to any of the first to fourth aspects of the present disclosure.

A surface-emitting device of the present disclosure to achieve the above-described object includes:
 a first substrate;
 a second substrate; and
 a panel including a plurality of light-emitting elements interposed between the first substrate and the second substrate, in which each of the light-emitting elements is configured by the light-emitting element according to any of the first to fourth aspects of the present disclosure.

MODES FOR CARRYING OUT THE INVENTION

Figure 1:
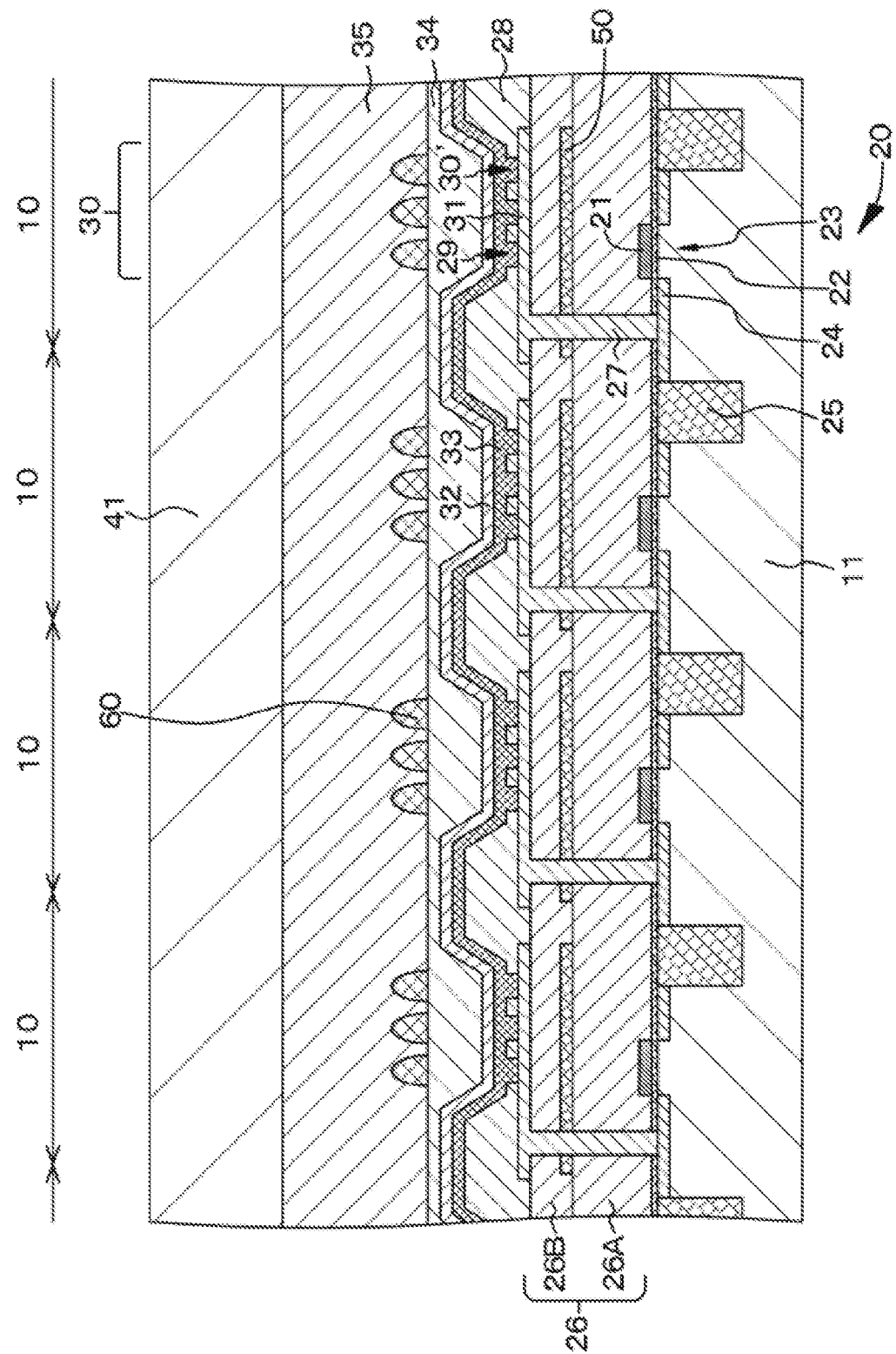
FIG. 1 is a schematic partial cross-sectional view of a light-emitting element of Example 1 and a panel configuring a projection display device of Example 1.

Hereinafter, description is given of the present disclosure on the basis of Examples with reference to the drawings.

However, the present disclosure is not limited to Examples, and various numerical values and materials in Examples are illustrative. It is to be noted that the description is given in the following order.

1. Light-Emitting Element of First to Fourth Aspects of Present Disclosure, Display Device of Present Disclosure, Surface-Emitting Device of Present Disclosure, and General Description
2. Example 1 (Light-Emitting Element of First Aspect of Present Disclosure, Light-Emitting Element of First Embodiment, and Display Device of Present Disclosure)
3. Example 2 (Light-Emitting Element according to Second Aspect of Present Disclosure)
4. Example 3 (Light-Emitting Element according to Third Aspect of Present Disclosure)
5. Example 4 (Light-Emitting Element according to Fourth Aspect of Present Disclosure)
6. Example 5 (Light-Emitting Element of Second Embodiment)
7. Example 6 (Combination of Light-Emitting Element of First Embodiment and Light-Emitting Element of Second Embodiment)
8. Others

[Light-Emitting Element of First to Fourth Aspects of Present Disclosure, Display Device of Present Disclosure, Surface-Emitting Device of Present Disclosure, and General Description]

A light-emitting element according to a first aspect of the present disclosure, a light-emitting element according to the first aspect of the present disclosure provided in a display device of the present disclosure, and a light-emitting element according to the first aspect according to the present disclosure provided in a surface-emitting device of the present disclosure may be collectively referred to as a "light-emitting element or the like according to the first aspect of the present disclosure" in some cases. In addition, a light-emitting element according to a second aspect of the present disclosure, a light-emitting element according to the second aspect of the present disclosure provided in the display device of the present disclosure, and a light-emitting element according to the second aspect according to the present disclosure provided in a surface-emitting device of the present disclosure may be collectively referred to as a "light-emitting element or the like according to the second aspect of the present disclosure" in some cases. Further, a light-emitting element according to a third aspect of the present disclosure, a light-emitting element according to the third aspect of the present disclosure provided in the display device of the present disclosure, and a light-emitting element according to the third aspect according to the present disclosure provided in a surface-emitting device of the present disclosure may be collectively referred to as a "light-emitting element or the like according to the third aspect of the present disclosure" in some cases. In addition, a light-emitting element according to a fourth aspect of the present disclosure, a light-emitting element according to the fourth aspect of the present disclosure provided in the display device of the present disclosure, and a light-emitting element according to the fourth aspect according to the present disclosure provided in a surface-emitting device of the present disclosure may be collectively referred to as a "light-emitting element or the like according to the fourth aspect of the present disclosure" in some cases. Further, the light-emitting element or the like according to the first aspect of the present disclosure, the light-emitting element or the like according to the second aspect of the present disclosure, the light-emitting element or the like according to the third aspect of the present disclosure, and the light-emitting element or the like according to the fourth aspect of the present disclosure may be collectively referred to as a "light-emitting element or the like of the present disclosure" in some cases.

The light-emitting element or the like according to the first aspect of the present disclosure includes a light-emitting section including a plurality of light-emitting regions, and one or a plurality of microlens members controlling a traveling direction of light emitted from each of the light-emitting regions. For example, a mode may be adopted in which the light-emitting section includes M×N (where M and N stand for integers of one or more, excluding a case of M=1 and N=1) light-emitting regions, and includes P×Q (where P=p×M and Q=q×N hold true, and p and q stand for integers of one or more) microlens members controlling a traveling direction of each light emitted from the M×N light-emitting regions. It is sufficient for the plurality of light-emitting regions to be arranged at desired positions; the plurality of light-emitting regions may be regularly arranged (specifically, e.g., the center of the light-emitting region may be arranged on a lattice point of a virtual lattice), or may not be regularly arrayed. In a case where one microlens member controlling the traveling direction of light emitted from each of the light-emitting regions is provided, it is sufficient for an optical axis of the microlens member to be disposed at a desired position; the optical axis may be regularly arrayed (specifically, e.g., the optical axis of the microlens member may be disposed on lattice points of the virtual lattice), or may not be regularly arrayed. In addition, the size and shape of the light-emitting region in the light-emitting section may be changed depending on an arrangement position of the light-emitting section in a display device or a surface-emitting device, or may be constant. The size and shape, curvature radius, various physical properties such as optical power, and constituent material of each of the plurality of microlens members may be changed depending on the arrangement position in the light-emitting section, or may be constant. It is to be noted that a square lattice, a rectangular lattice, and a regular hexagonal lattice may be exemplified as the virtual lattice, although no limitation is made thereto. The same applies to the following description.

The light-emitting element or the like according to the second aspect of the present disclosure includes a plurality of microlens members controlling a traveling direction of light emitted from one light-emitting region. For example, a mode may be adopted in which there are provided P×Q (where P and Q stand for integers of one or more, excluding a case of P=1 and Q=1) microlens members controlling a traveling direction of light emitted from one light-emitting region. It is sufficient for the plurality of microlens members to be arranged at desired positions; the plurality of microlens members may be regularly arranged (specifically, e.g., the optical axis of the microlens member may be disposed on lattice points of the virtual lattice), or may not be regularly arranged. The size and shape, curvature radius, various physical properties such as optical power, and constituent material of each of the plurality of microlens members may be changed depending on the arrangement position in the light-emitting section, or may be constant.

In the light-emitting element or the like according to the third aspect of the present disclosure, the light-emitting section includes a plurality of light-emitting regions and one or a plurality of microlens members controlling a traveling direction of each light emitted from the plurality of light-emitting regions. For example, the light-emitting section includes M×N (where M and N stand for integers of one or more, excluding the case of M=1 and N=1) light-emitting regions, and the microlens members controlling a traveling direction of each light emitted from the M×N light-emitting regions may be one or more. For example, the number of the plurality of microlens members may be P'×Q' (where P'=M/p' and Q'=N/q' hold true, and p' and q' stand for integers of one or more). The plurality of light-emitting regions may be arranged at desired positions; the plurality of light-emitting regions may be regularly arranged (specifically, e.g., the center of the light-emitting region may be arranged on a lattice point of the virtual lattice), or may not be regularly arrayed. It is sufficient for the plurality of microlens members to be arranged at desired positions; the plurality of microlens members may be regularly arrayed (specifically, e.g., the optical axis of the microlens member may be disposed on lattice points of the virtual lattice), or may not be regularly arrayed. The size and shape of the light-emitting region in the light-emitting section may be changed depending on an arrangement position of the light-emitting section in a display device or a surface-emitting device, or may be constant. The size and shape, curvature radius, various physical properties such as optical power, and constituent material of each of the plurality of microlens members may be changed depending on the arrangement position in the light-emitting section, or may be constant.

In the light-emitting element or the like according to the fourth aspect of the present disclosure, the light-emitting section includes a plurality of light-emitting regions, and a light-guiding section controlling a traveling direction of light emitted from each of the light-emitting regions. For example, the light-emitting section may include M×N (where M and N stand for integers of one or more, excluding the case of M=1 and N=1) light-emitting regions, and the number of the light-guiding section controlling a traveling direction of light emitted from each of the light-emitting regions may be one or more. That is, the number of the plurality of light-guiding sections may be P×Q (where P=p×M and Q=q×N hold true, and p and q stand for integers of one or more), or may be P'×Q' (where P'=M/p' and Q'=N/q' hold true, and p' and q' stand for integers of one or more). The plurality of light-emitting regions may be arranged at desired positions; the plurality of light-emitting regions may be regularly arranged (specifically, e.g., the center of the light-emitting region may be arranged on a lattice point of the virtual lattice), or may not be regularly arrayed. It is sufficient for the plurality of light-guiding sections to be arranged at desired positions; the plurality of light-guiding sections may be regularly arrayed (specifically, e.g., the optical axis of the light-guiding section may be disposed on lattice points of the virtual lattice), or may not be regularly arrayed. The size and shape of the light-emitting region in the light-emitting section may be changed depending on an arrangement position of the light-emitting section in the display device or the surface-emitting device, or may be constant. Various physical properties such as size and shape, and constituent material of each of the plurality of light-guiding sections may be changed depending on the arrangement position in the light-emitting section, or may be constant.

In addition, the light-emitting element or the like according to any of the first to third aspects of the present disclosure includes the microlens member (a lens member and an on-chip lens), thus making it possible to bring light emitted from the light-emitting region of the light-emitting element into a desired state such as parallel light. In addition, the light-emitting element or the like according to the fourth aspect of the present disclosure includes the light-guiding section (a light reflective section and a reflector section), thus making it possible to bring light emitted from the light-emitting region of the light-emitting element into a desired state such as parallel light.

the light emitted from the light-emitting region of the light-emitting element can be a desired state such as parallel light.

In the light-emitting element or the like according to the first aspect of the present disclosure, a mode may be adopted in which the optical axis of the microlens member is not positioned on a center line passing through the center of the light-emitting region. As a matter of course, the light-emitting element or the like according to the first aspect of the present disclosure includes a mode in which the optical axis of the microlens member is positioned on the center line passing through the center of light-emitting region. Specifically, as described above, a mode may be adopted in which the plurality of light-emitting regions are regularly arrayed (specifically, the center of the light-emitting region is disposed on a lattice point of the virtual lattice), and the optical axis of the microlens member is not positioned on this lattice point. Alternatively, a mode may be adopted in which the plurality of light-emitting regions are not regularly arrayed (specifically, e.g., the center of the light-emitting region is not disposed on a lattice point of the virtual lattice), and the optical axis of the microlens member is positioned on this lattice point; a combination of these modes may also be adopted.

In the light-emitting element or the like according to any of the first to third aspects of the present disclosure, a mode may be adopted in which the planar shape of the microlens member is a shape of a rectangle or a square with corner portions being rounded. It is to be noted that, in this case, a rectangle, a square, a polygon, the rectangle or square with corner portions being rounded, a polygon with corner portions being rounded, a circle, and an ellipse may be exemplified as a planar shape of the light-emitting region. Adopting, in particular, the rectangular shape or the square shape as the planar shape of the microlens member makes it possible to efficiently control a traveling direction of light emitted from the light-emitting region, regardless of the shape of the planar shape of the light-emitting region, or regardless of a positional relationship between the microlens member and the light-emitting region. The microlens member is a spherical lens or an aspherical lens. In a case where the microlens member is configured by a plano-convex lens, for example, the microlens member may have a convex surface in a direction away from the light-emitting region, or may have a convex surface in a direction toward the light-emitting region.

Further, in the light-emitting element or the like according to any of the first to third aspects of the present disclosure including the preferred modes described above, a mode may be adopted in which, in a case where the optical axis of the microlens member is positioned on the center line passing through the center of the light-emitting region, an orthogonal projection image of the light-emitting region is included within an orthogonal projection image of the microlens member. Specifically, in the light-emitting element or the like according to the first aspect of the present disclosure, a mode may be adopted in which, in a case where the optical axis of the microlens member is positioned on the center line passing through the center of the light-emitting region, an orthogonal projection image of one light-emitting region is included within an orthogonal projection image of one microlens member. In addition, in the light-emitting element or the like according to the second aspect of the present disclosure, a mode may be adopted in which, in a case where the optical axis of the microlens member is positioned on the center line passing through the center of the light-emitting region, an orthogonal projection image of one light-emitting region is included within an orthogonal projection image of the entire P×Q microlens members. Further, in the light-emitting element or the like according to the third aspect of the present disclosure, a mode may be adopted in which, in a case where the optical axis of the microlens member is positioned on the center line passing through the center of the light-emitting region, an orthogonal projection image of the M×N light-emitting regions is included within an orthogonal projection image of one microlens member.

Further, in the light-emitting element or the like according to any of the first to third aspects of the present disclosure including the preferred modes described above, a mode may be adopted in which a second microlens member controlling a traveling direction of light emitted from the microlens member is further provided.

Further, in the light-emitting element or the like according to any of the first to third aspects of the present disclosure including the preferred modes described above, a mode may be adopted in which a light-guiding section controlling a traveling direction of light emitted from the microlens member is further provided. An inner surface of the light-guiding region (a surface of the light-guiding section with which the light emitted from the microlens member collides) when being cut by a virtual plane orthogonal to a normal direction of the light-emitting region may be parallel to the normal direction of the light-guiding section, or may be non-parallel. That is, the inner surface of the light-guiding section may have a forward tapered shape, or may have a reverse tapered shape, with respect to the light-emitting region; however, the reverse tapered shape is preferable from the viewpoint of light condensing. Further, in this case, the plurality of light-guiding sections has a structure in which they are stacked; a mode may be adopted in which axis lines of the plurality of light-guiding sections are not on the same straight line. As a matter of course, a mode may be adopted in which the axis lines of the plurality of light-guiding sections may be on the same straight line. In addition, a mode may be adopted in which an axis line at a bottom portion of the light-guiding section closest to the light-emitting region is not positioned on the center line passing through the center of the light-emitting region. As a matter of course, a mode is included in which the axis line at the bottom portion of the light-guiding section closest to the light-emitting region is positioned on the center line passing through the center of the light-emitting region. In addition, a mode may be adopted in which, in a case where the axis line at the bottom portion of the light-guiding section closest to the light-emitting region is positioned on the center line passing through the center of the light-emitting region, an orthogonal projection image of the light-emitting region is included within an orthogonal projection image at the bottom portion of the light-guiding section. The above description is applicable to the light-emitting element or the like according to the fourth aspect of the present disclosure. Here, the phrase "the inner surface of the light-guiding section has a forward tapered shape" refers to a shape in which the inner surface of the light-guiding section expands (a shape expanding toward a second substrate) as being away from the light-emitting region, and the phrase "the inner surface of the light-guiding section has a reverse tapered shape" refers to a shape in which the inner surface of the light-guiding section expands diminishes (a shape diminishing toward the second substrate) as being away from the light-emitting region.

Further, in the light-emitting element or the like of the present disclosure including the preferred modes described above, a mode may be adopted in which
the light-emitting section includes
a first electrode shared in a light-emitting region,
an organic layer formed on the first electrode and including a light-emitting layer including an organic light-emitting material, and
a second electrode formed on the organic layer, and
the light-emitting section further includes a light reflective layer below the first electrode, and
resonates light emitted by the light-emitting layer between an interface and the light reflective layer, the interface being between the second electrode and the organic layer, and emits a portion of the light from the second electrode,
with an insulating layer being formed between the first electrode and the organic layer,
the insulating layer having an opening defining the light-emitting region. It is to be noted that the light-emitting element of such a mode may be referred to as a "light-emitting element of a first embodiment" in some cases for the sake of convenience. When a surface of the light reflective layer on side of the first electrode is referred to as a "first interface" for the sake of convenience and the interface between the second electrode and the organic layer is referred to as a "second interface" for the sake of convenience, a resonator structure is formed between the first interface and the second interface. Alternatively, a mode may be adopted in which
the light-emitting section includes
a first electrode shared in a light-emitting region,
an organic layer formed on the first electrode and including a light-emitting layer including an organic light-emitting material, and
a second electrode formed on the organic layer, and
the light-emitting layer includes a plurality of stacked light-emitting layers emitting light beams of same color,
with an insulating layer being formed between the first electrode and the organic layer,
the insulating layer having an opening defining the light-emitting region. Here, a mode may be adopted in which the plurality of light-emitting layers have the same composition. It is to be noted that the light-emitting element of such a mode may be referred to as a "light-emitting element of a second embodiment" in some cases for the sake of convenience.

Further, in the light-emitting element or the like according to any of the first to third aspects of the present disclosure including the preferred modes described above, a configuration may be adopted in which the microlens member has positive optical power.

Further, in the light-emitting element or the like according to any of the first to third aspects of the present disclosure including the preferred modes and configuration described above, a configuration may be adopted in which the light-emitting region may have a convex shape in a direction away from the microlens member.

Alternatively, in the light-emitting element or the like according to any of the first to third aspects of the present disclosure including the preferred modes described above, a configuration may be adopted in which the microlens member has negative optical power.

Further, in the light-emitting element or the like according to the fourth aspect of the present disclosure including the preferred modes and configurations described above, a mode may be adopted in which the light-emitting region has positive optical power. Further, in the light-emitting element or the like according to the fourth aspect of the present disclosure including the preferred modes and configurations described above, a mode may be adopted in which the plurality of light-guiding sections has a stacked structure; and the axis lines of the plurality of light-guiding sections are not on the same straight line. As a matter of course, a mode is also included in which the axis lines of the plurality of light-guiding sections are on the same straight line.

Further, in the display device of the present disclosure including the preferred modes and configurations described above, a mode may be adopted in which the display device includes the projection display device.

The microlens member may be configured by, for example, a transparent resin material such as an acrylic resin, and the transparent resin material may be obtained by melt flowing, or may be obtained by etching back; alternatively, the transparent resin material may be obtained by a method of forming the transparent resin material into a lens shape on the basis of a nanoprinting method.

Specifically, it is sufficient for the light-guiding section to be configured by a material that reflects light emitted from the light-emitting region or the microlens member; examples thereof include a metal material or an alloy material, a dielectric material (insulating material) having a refractive index smaller than a refractive index of a medium through which light emitted from the light-emitting region or the microlens member passes, or a multilayer configuration of the dielectric material. Specific examples of the metal material and the alloy material may include an aluminum (Al) layer, an aluminum alloy layer (e.g., an Al—Nd layer), a chromium (Cr) layer, a silver (Ag) layer, and a silver alloy layer (e.g., an Ag—Cu layer, an Ag—Pd—Cu layer, and an Ag—Sm—Cu layer), which may be formed by, for example, a deposition method including an electron-beam deposition method, a thermal filament deposition method, or a vacuum deposition method, a sputtering method, a CVD method, or an ion plating method; a plating method (an electroplating method or an electroless plating method); a lift-off method; a laser ablation method; a sol-gel method; or the like.

In the light-emitting element or the like of the present disclosure including the preferred modes and configurations described above, a configuration may be adopted in which a value of full width at half maximum (FWHM) of light emitted from the light-emitting element is 30 nm or less. A value of full width at half maximum (FWHM) of light emitted from an existing organic EL element described later often ranges from 60 nm to 100 nm, and the light-emitting element or the like of the present disclosure has a sharper emission spectrum than that of the existing organic EL element.

Further, in the light-emitting element or the like of the present disclosure including the preferred modes and configurations described above, a mode may be adopted in which, when $I_0$ stands for light intensity (light intensity of light emitted from the light-emitting element) in the center line passing through the center of the light-emitting section of the light-emitting element, and $I_{conv}$ stands for light intensity (light intensity of light emitted from the light-emitting element) in the center line passing through the center of the light-emitting section of the light-emitting element not including the light reflective layer, $$I_0 / I_{conv} \geq 5$$

is satisfied.

Further, in the light-emitting element or the like of the present disclosure including the preferred modes and configurations described above, a mode may be adopted in which, when the light intensity (light intensity of light emitted from the light-emitting section) in the center line passing through the center of the light-emitting section of the light-emitting element is set to 100%, a directivity half-value angle, i.e., an angle formed between a direction with respect to the center line, which obtains 50% light intensity (light intensity of light emitted from the light-emitting section), and the center line is 25 degrees or less. It is to be noted that the directivity half-value angle in Lambertian radiation is about 70 degrees. That is, the light emitted from the light-emitting element or the like of the present disclosure is light having directivity higher than that of the existing organic EL element described later, or light close to parallel light. Accordingly, a telecentric optical system often required between a light source of an existing projection display device (projector) and a spatial modulator is unnecessary, thus enabling simplification of the projection display device. In addition, the light emitted from the light-emitting element or the like of the present disclosure is light having high directivity or light close to parallel light, and therefore light generated at the light-emitting layer repeatedly undergoes total reflection between a first substrate and the second substrate, and is emitted from a junction part (panel end face) between the first substrate and the second substrate, thus making it possible to prevent occurrence of a phenomenon in which a loss occurs in the light emitted from the panel.

In the light-emitting element of the first embodiment in which the resonator structure is formed between the first interface and the second interface, a configuration may be adopted in which, when $OL_1$ stands for an optical distance from a maximum light-emitting position of the light-emitting layer to the first interface, $OL_2$ stands for an optical distance from the maximum light-emitting position of the light-emitting layer to the second interface, and $m_1$ and $m_2$ stand for integers, the following expressions (1-1) and (1-2):

$$0.7\{-\Phi_1/(2\pi) + m_1\} \leq 2 \times OL_1/\lambda \leq 1.2\{-\Phi_1/(2\pi) + m_1\} \quad (1\text{-}1)$$

$$0.7\{-\Phi_2/(2\pi) + m_2\} \leq 2 \times OL_2/\lambda \leq 1.2\{-\Phi_2/(2\pi) + m_2\} \quad (1\text{-}2)$$

are satisfied, where $\lambda$ denotes a maximum peak wavelength of a spectrum of light generated at the light-emitting layer (or a desired wavelength among light beams generated at the light-emitting layer)

$\Phi_1$ denotes a phase shift amount (unit: radian) of reflected light generated at the first interface (light reflected at the first interface), provided that $-2\pi < \Phi_1 \leq 0$ holds true $\Phi_2$ denotes a phase shift amount (unit: radian) of reflected light generated at the second interface (light reflected at the second interface), provided that $-2\pi < \Phi_2 \leq 0$ holds true.

The value of $m_1$ is a value of zero or more, and the value of $m_2$ is a value of zero or more independently of the value of $m_1$; however, satisfying $m_1 \geq 1$ and $m_2 \geq 1$ is preferable from the viewpoint of potential designing in the organic layer, i.e., from the viewpoint of potential optimization in the organic layer. This makes it possible to reduce the value of full width at half maximum (FWHM) of the light emitted from the light-emitting element, although the description is given later.

The distance $L_1$ from the maximum light-emitting position of the light-emitting layer to the first interface refers to an actual distance (physical distance) from the maximum light-emitting position of the light-emitting layer to the first interface, and the distance $L_2$ from the maximum light-emitting position of the light-emitting layer to the second interface refers to an actual distance (physical distance) from the maximum light-emitting position of the light-emitting layer to the second interface. In addition, the optical distance is also referred to as an optical path length, and generally refers to n×L at the time when a light beam passes through the inside of a medium of a refractive index "n" by a distance L. The same also applies to the following description. Consequently, when $n_{ave}$ stands for the average refractive index, the following relationship:

$$OL_1 = L_1 \times n_{ave}$$

$$OL_2 = L_2 \times n_{ave}$$

holds true. Here, the average refractive index nave is obtained by summing up products of a refractive index and a thickness of respective layers configuring the organic layer (or organic layer and interlayer insulating layer, or organic layer, first electrode and interlayer insulating layer), and dividing the sum by the thickness of the organic layer (or organic layer and interlayer insulating layer, or organic layer, first electrode and interlayer insulating layer).

It is sufficient to determine a desired wavelength λ (specifically, a wavelength of a red color, a wavelength of a green color, and a wavelength of a blue color) among light beams generated at the light-emitting layer, to obtain various parameters such as $OL_1$ and $OL_2$ in the light-emitting element on the basis of the expressions (1-1) and (1-2), and to design the light-emitting element.

The light reflective layer and the second electrode absorb a portion of incident light, and reflect the remaining portion thereof. Accordingly, a phase shift occurs in the reflected light. The phase shift amounts $\Phi_1$ and $\Phi_2$ may be obtained by measuring values of a real number portion and an imaginary number portion of the complex refractive index of materials configuring the light reflective layer and the second electrode using an ellipsometer, for example, and performing calculations based on these values (see, e.g., "Principles of Optic", Max Born and Emil Wolf, 1974 (PERGAMON PRESS). The refractive indices of the organic layer, the interlayer insulating layer, the first electrode, and the like, or the refractive index of the first electrode in a case where the first electrode absorbs a portion of the incident light and reflects the remaining portion thereof may also be obtained using the ellipsometer.

Examples of the material configuring the light reflective layer may include aluminum, an aluminum alloy (e.g., Al—Nd or Al—Cu), an Al/Ti stacked structure, an Al—Cu/Ti stacked structure, chromium (Cr), silver (Ag), a silver alloy (e.g., Ag—Cu, Ag—Pd—Cu, Ag—Sm—Cu). In addition, for example, the formation may be performed by means of a deposition method including an electron-beam deposition method, a thermal filament deposition method, or a vacuum deposition method, a sputtering method, a CVD method, or an ion plating method; a plating method (an electroplating method or an electroless plating method); a lift-off method; a laser ablation method; a sol-gel method; or the like. Depending on materials configuring the light reflective layer, it is preferable to form a base film including, for example, TiN in order to control a crystalline state of the light reflective layer to be formed.

Further, in the light-emitting element of the first embodiment including the preferred modes and configurations described above, a mode may be adopted in which a light-absorbing layer (a black matrix layer) is formed between microlens members or light-guiding sections of adjacent light-emitting elements. Forming the light-absorbing layer (black matrix layer) between the microlens members or the light-guiding sections of the adjacent light-emitting elements makes it possible to reliably suppress occurrence of overlapping of minute images between the adjacent light-emitting elements. That is, it is possible to reliably suppress the occurrence of a phenomenon in which a unit image formed by a certain light-emitting element and a unit image formed by a light-emitting element adjacent to or positioned in the vicinity of the certain light-emitting element are partially overlapped (hereinafter, referred to as "partial overlap of unit pixels" for the sake of convenience). The light-absorbing layer includes, for example, a black resin film (specifically, e.g., a black polyimide-based resin) having an optical density of one or more mixed with a black colorant, or is configured by a thin film filter utilizing interference of a thin film. The thin film filter is obtained, for example, by stacking two or more layers of a thin film including a metal, a metal nitride or a metal oxide, and attenuates light utilizing the interference of the thin film. Specific examples of the thin film filter may include an alternate stack of Cr and chromium(III) oxide ($Cr_2O_3$).

Further, in the light-emitting element of the first embodiment including the preferred modes and configurations described above, a mode may be adopted in which the first electrode and the light reflective layer are surrounded by a light-blocking section. That is, the light-blocking section may be provided between the light-emitting elements. Adopting such a mode makes it possible to reliably prevent occurrence of the partial overlap of unit pixels. Specific examples of the light-blocking material configuring the light-blocking section may include a material that is able to block light, such as titanium (Ti), chromium (Cr), tungsten (W), tantalum (Ta), aluminum (Al), and $MoSi_2$. The light-blocking section may be formed by means of a deposition method including an electron-beam deposition method, a thermal filament deposition method, or a vacuum deposition method, a sputtering method, a CVD method, an ion plating method, or the like.

Further, in the light-emitting element of the first embodiment including the preferred modes and configurations described above, a mode may be adopted in which a metal thin film filter layer is further formed between the first electrode and the light reflective layer. The metal thin film filter layer includes, for example, gold (Au), silver (Ag), platinum (Pt), aluminum (Al), copper (Cu), tungsten (W), or an alloy including these materials, and has, for example, a large number of voids each having a size of about 200 nm and having a circular, elliptical, rectangular, U-shaped, or cross-shaped planar shape being formed and arranged thereon two-dimensionally (e.g., arranged on lattice points or in a staggered manner) or a large number of slits being formed thereon. It is to be noted that the metal thin film filter layer is disclosed, for example, in Japanese Unexamined Patent Application Publication No. 2015-232599. Only light of a certain wavelength is transmitted through the metal thin film filter layer in which a surface plasmon polariton (SPR) obtained by a combination of free electrons on a metal surface and an electromagnetic wave is used as a medium. The metal thin film filter layer having been subjected to such cyclic fine working is also referred to as a plasmonic filter (hole array filter). Although the metal thin film filter layer has been widely known in the field of imaging units, the use thereof in the projection display device including the self-luminous light-emitting element has not been known as far as the inventor investigated. Although the light-emitting element depends on the wavelength of emitted light (e.g., in a case where the light-emitting element emits an infrared ray), the metal thin film filter layer described above may be formed instead of the light reflective layer to cause the metal thin film filter layer to reflect the light.

In a case where the second electrode is caused to function as a cathode electrode, it is desirable to configure the second electrode using, as a material (semi-light-transmissive material or light-transmissive material) configuring the second electrode, an electrically-conductive material having a small work function value to transmit emitted light and inject electrons efficiently into the organic layer (light-emitting layer). A mode may be adopted in which the second electrode includes at least one type of a material selected from the group consisting of Ag, Ag—Mg, Ag—Nd—Cu, Ag—Cu, Au, Al, and Al—Cu. Alternative examples thereof may include metals or alloys each having a small work function, such as aluminum (Al), silver (Ag), magnesium (Mg), calcium (Ca), sodium (Na), strontium (Sr), an alloy of an alkali metal or alkaline earth metal and silver (Ag) [e.g., an alloy of magnesium (Mg) and silver (Ag) (an Mg—Ag alloy)], an alloy of magnesium-calcium (an Mg—Ca alloy), and an alloy of aluminum (Al) and lithium (Li) (an Al—Li alloy). Among those, the Mg—Ag alloy is preferable; as a volume ratio between magnesium and silver, Mg:Ag=5:1 to 30:1 may be exemplified. Alternatively, as a volume ratio between magnesium and calcium, Mg:Ca=2:1 to 10:1 may be exemplified. Alternatively, the second electrode may have a stacked structure of the material layer described above and a so-called transparent electrode (e.g., a thickness of $3 \times 10^{-8}$ m to $1 \times 10^{-6}$ m) including, for example, ITO or IZO from side of the organic layer. The second electrode may be provided with a bus electrode (auxiliary electrode) including a low-resistance material such as aluminum, an aluminum alloy, silver, a silver alloy, copper, a copper alloy, gold, or a gold alloy to achieve reduction in resistance of the entire second electrode. Meanwhile, in a case where the second electrode is caused to function as an anode electrode, it is desirable to configure the second electrode using an electrically-conductive material that transmits emitted light and has a large work function value. As a thickness of the second electrode, 4 nm to 50 nm, preferably 4 nm to 20 nm, and more preferably 6 nm to 12 nm may be exemplified. The second electrode desirably has an average optical transmittance of 50% to 90%, preferably 60% to 90%.

In a case where transparency is not required from the first electrode, examples of a material configuring the first electrode, which is to be caused to function as an anode electrode, may include metals each having a high work function, such as platinum (Pt), gold (Au), silver (Ag), chromium (Cr), tungsten (W), nickel (Ni), copper (Cu), iron (Fe), cobalt (Co), and tantalum (Ta), or alloys (e.g., an Ag—Pd—Cu alloy including silver, as a main component, and 0.3% by mass to 1% by mass of palladium (Pd) and 0.3% by mass to 1% by mass of copper (Cu) as well as an Al—Nd alloy, an Al—Cu alloy, and Al—Cu—Ni alloy). Further, in a case of using an electrically-conductive material having a small work function value and having a high optical reflectance such as aluminum (Al) and an alloy including aluminum, for example, providing an appropriate hole injection layer improves hole injection characteristic, thereby enabling the use thereof as an anode electrode. As a thickness of the first electrode, 0.1 µm to 1 µm may be exemplified. Alternatively, a structure may be adopted in which transparent electrically-conductive materials having superior hole injection characteristics such as an oxide of indium and tin (ITO) or an oxide of indium and zinc (IZO) may be stacked on a reflective film having high light reflectivity such as a dielectric multilayer film or aluminum (Al) or an alloy thereof (e.g., an Al—Cu—Ni alloy).

In a case where transparency is required from the first electrode, examples of a material configuring the first electrode may include, besides indium-tin oxide (ITO, Indium Tin Oxide, including Sn-doped $In_2O_3$, crystalline ITO, and amorphous ITO), indium-zinc oxide (IZO, Indium Zinc Oxide), various transparent electrically-conductive materials such as a transparent electrically-conductive material including, as a base layer, indium oxide, indium-gallium oxide (IGO), indium-doped gallium-zinc oxide (IGZO, In—GaZnO$_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel-type oxide, an oxide having a YbFe$_2$O$_4$ structure, a gallium oxide, a titanium oxide, a niobium oxide, a nickel oxide, or the like. It is to be noted that, in a case where the first electrode is caused to function as a cathode electrode, it is desirable to configure the first electrode using an electrically-conductive material having a small work function value and having a high optical reflectance; however, providing, for example, an appropriate electron injection layer for the electrically-conductive material having a high optical reflectance to be used as the anode electrode improves electron injection characteristic, thereby enabling the use thereof as a cathode electrode.

Examples of methods for forming the first electrode or the second electrode may include a deposition method including an electron-beam deposition method, a thermal filament deposition method, or a vacuum deposition method, a sputtering method, a chemical vapor deposition method (CVD method) or an MOCVD method, a combination of an ion plating method and an etching method; various printing methods such as a screen printing method, an inkjet printing method, and a metal mask printing method; a plating method (electroplating method or an electroless plating method); a lift-off method; a laser ablation method; a sol-gel method; and the like. According to the various printing methods and the plating method, it is possible to directly form the first electrode or the second electrode having a desired shape (pattern). It is to be noted that, because the second electrode is formed after formation of the organic layer, it is particularly preferable to perform the formation on the basis of a film-forming method with smaller energy of a film-forming particle such as a vacuum deposition method, or a MOCVD method, from the viewpoint of preventing occurrence of damage in the organic layer. When the damage occurs in the organic layer, there is a possibility that a non-luminous pixel (or non-luminous sub-pixel) called "dark spot" caused by generation of a leak current may be generated.

In the light-emitting element of the second embodiment, a mode may be adopted in which an interlayer (charge-generating layer) is formed between the light-emitting layers. Here, examples of a material configuring the interlayer may include at least one type of a material selected from the group consisting of lithium (Li), calcium (Ca), sodium (Na), cesium (Cs), molybdenum oxide ($MoO_3$), vanadium oxide ($V_2O_5$), and tungsten oxide ($WO_3$); broader examples thereof include metal materials, alloy materials, and metal compounds each having electric conductivity. The light-emitting layer should be prevented from being damaged due to film formation of the interlayer. The interlayer is formed on the light-emitting layer including an organic material by means of a sputtering method, for example; however, when the film-forming temperature of the interlayer exceeds 100° C., for example, there is a possibility that the light-emitting layer may be damaged. Therefore, in a case of forming the interlayer on the basis of the sputtering method, a material configuring the interlayer needs to be selected from materials enabling the film-forming temperature to be set to 100° C. or less. or less. Examples of a thickness of the interlayer may include, but not limited to, 2 nm to 10 nm.

In the light-emitting element of the second embodiment,
  a mode may be adopted in which the light reflective layer is further provided, and
  light emitted by the light-emitting layer is resonated between the light reflective layer and the second interface which is located between the second electrode and the organic layer to emit a portion of the light from the second electrode. Here, a mode may also be adopted in which the light reflective layer is disposed below the first electrode; alternatively, the reflective layer may also be configured to be disposed at a location above the first electrode and below the light-emitting layer. It is to be noted that such a preferred configuration of the light-emitting element of the second embodiment may include the light-emitting element of the first embodiment described above; in this case, the maximum light-emitting position of the light-emitting layer in the light-emitting layer including a plurality of stacked light-emitting layers emitting light beams of the same color refers to an average position in a thickness direction of the plurality of light-emitting layers. Specifically, a position corresponding to an average value of distances between the interface, which is located between the first electrode and the organic layer (first interface), and each center in the thickness direction of the light-emitting layers is defined as the maximum light-emitting position. In the configuration in which the light reflective layer is disposed at a location above the first electrode and below the light-emitting layer, the first electrode is not necessarily required to have transparency. In addition, in some cases, a mode may be adopted in which the formation of the light reflective layer is omitted to cause the first electrode to serve also as the light reflective layer; in this case, the distance from the maximum light-emitting position of the light-emitting layer to the first electrode is defined as $L_1$; the optical distance is defined as $OL_1$; and the phase shift amount of reflected light generated at the first electrode (light reflected at the light reflective layer) is defined as $\Phi_1$.

In the light-emitting element of the second embodiment, the number of the light-emitting layer (NL) is two or more; however, "4" may be exemplified as an upper limit value, although no limitation is made thereto. The number of the interlayer is (NL-1). Generally, as the number of the light-emitting layer (NL) is increased, a voltage to drive the light-emitting element is increased; therefore, the number of the light-emitting layer (NL) is limited by the voltage to drive the light-emitting element, and, further, by voltage resistance of a light-emitting element drive section.

In the display device (e.g., projection display device) of the present disclosure or the surface-emitting device of the present disclosure, the panel emits a single color light beam [e.g., red light (having an emission spectrum peak within a range of a wavelength from 620 nm to 750 nm), green light (having an emission spectral peak within a range of a wavelength from 495 nm to 570 nm), or blue light (having an emission spectral peak within a range of a wavelength from 450 nm to 495 nm].

A mode may be adopted in which the display device (e.g., projection display device) of the present disclosure is configured by three panels of
  one red light emission panel emitting red light,
  one green light emission panel emitting green light, and
  one blue light emission panel emitting blue light. Further, in this case, a mode may also be adopted in which one blue light emission panel emitting blue light or one green light emission panel emitting green light may be further provided to have a four-panel configuration. In this case, the four panels may be configured to be arranged in an array (1×4 state); alternatively, the four panels may be configured to be arranged in a 2×2 state.

In the display device of the present disclosure, specifically, in the projection display device including the preferred modes and configurations described above, a mode may be adopted in which a projection lens system is further provided on light emission side.

Alternatively, a mode may be adopted in which there are provided
  an image synthesizing means (e.g., a non-polarizing dichroic prism or a Philips prism) synthesizing images emitted from a plurality of panels into one image, and
  a projection lens system on the light emission side of the image synthesizing means (e.g., non-polarizing dichroic prism or Philips prism); in this case, the three panels or the four panels configuring the projection display device may be arranged at optimal positions in the image synthesizing means.

It is preferable to use, as a lens configuring the projection lens system, a lens having a high F-number or high depth of field (DOF). In addition, light to be incident on the projection lens system or the image synthesizing means is preferably parallel light relative to an optical axis of the lens in a paraxial region of the lens. It is to be noted that, in a case of using the lens having a high F-number, it is necessary to reduce a divergence angle (directivity half-value angle) of the light emitted from the light-emitting element. For this reason, the microlens member or the light-guiding section is provided on the light emission side of the light-emitting element, and, for example, optimization of the resonator structure is achieved.

Further, in the display device of the present disclosure including the preferred modes and configurations described above, a mode may be adopted in which the panel may not only be flat, but may also be curved.

In a case where the display device, specifically, the projection display device of the present disclosure including the preferred modes and configurations described above is not provided with a means to synthesize images emitted from a plurality of panels into one image, it is sufficient to perform appropriate position matching of the plurality of panels and to simultaneously perform various corrections such as trapezoidal correction, distortion correction, and magnification correction of images formed on a screen, in order to appropriately display (synthesize) images from the plurality of panels on a screen, for example. In order to appropriately display (synthesize) the images from the plurality of panels on a screen, for example, pixels of the images from the plurality of panels may be in a state of being partially overlapped, instead of being completely overlapped. Occurrence of pixel misalignment raises no issue as long as it is equal to or lower than a resolution limit of the eyes of an observer.

In the light-emitting element or the like of the present disclosure including the preferred modes and the configurations described above, a mode may be adopted in which the light-emitting section configuring the light-emitting element includes an organic electroluminescence layer. That is, modes may be adopted in which: the surface-emitting device or the panel configuring the display device (e.g., projection display device) of the present disclosure including the various preferred modes and configurations described above includes the organic electroluminescence panel (organic EL panel); the light-emitting element includes the organic electroluminescence element (organic EL element); and the organic layer includes the organic electroluminescence layer. In addition, the organic EL panel may be a top-emission type (top face light-emitting type) organic EL panel (top face light-emitting organic EL panel) that emits light from the second substrate, thus causing light from the organic layer to be emitted to the outside through the second substrate.

Hereinafter, description is given of a state where the light-emitting section configuring the light-emitting element includes the organic electroluminescence layer, and of a state where the panel includes the top emission type organic EL panel.

The light-emitting section in the light-emitting element includes the first electrode, the organic layer, and the second electrode. In addition, the first electrode may be configured to be in contact with a portion of the organic layer; alternatively, the organic layer may be configured to be in contact with a portion of the first electrode. Specifically, the size of the first electrode may be configured to be smaller than that of the organic layer. Alternatively, an insulating layer may be configured to be formed in a portion between the first electrode and the organic layer, although the size of the first electrode is the same size as that of the organic layer. Alternatively, the size of the first electrode may be configured to be larger than that of the organic layer. A region of an opening provided in the insulating layer, which is region where the first electrode and the organic layer are in contact with each other, is the light-emitting region. Alternatively, the region where the first electrode and the organic layer are in contact with each other is the light-emitting region.

The first electrode is provided for each light-emitting element. The organic layer is provided for each light-emitting element, or is provided in common to the light-emitting elements. The second electrode may be a common electrode in a plurality of light-emitting elements. That is, the second electrode may be a so-called solid electrode. The first substrate is disposed below or under a base, and the second substrate is disposed above the second electrode. The light-emitting region is provided on the base. The light-emitting element is formed on side of the first substrate.

As a material configuring the base, an insulating material, for example, $SiO_2$, SiN, or SiON may be exemplified. The base may be formed on the basis of a formation method suitable for the material configuring the base, specifically, for example, a known method such as various CVD methods, various coating methods, various PVD methods including a sputtering method and a vacuum deposition method, various printing methods such as a screen printing method, a plating method, an electrodeposition method, an immersion method, and a sol-gel method.

A light-emitting element drive section is provided under or below the base, although no limitation is made thereto. The light-emitting element drive section is configured, for example, by a transistor (specifically, e.g., a MOSFET) formed in a silicon semiconductor substrate configuring the first substrate, and a thin film transistor (TFT) provided in various substrates configuring the first substrate. A mode may be adopted in which the transistor or the TFT configuring the light-emitting element drive section and the first electrode are coupled to each other through a contact hole (contact plug) formed in the base or the like. The light-emitting element drive section may be a well-known circuit configuration. The second electrode is coupled to the light-emitting element drive section through the contact hole (contact plug) formed in the base or the like in an outer peripheral part of the organic EL panel.

The first substrate or the second substrate may be configured by a silicon semiconductor substrate, a high strain point substrate, a soda glass ($Na_2O.CaO. SiO_2$) substrate, a borosilicate glass ($Na_2O.B_2O_3. SiO_2$) substrate, a forsterite ($2MgO.SiO_2$) substrate, a lead glass ($Na_2O.PbO. SiO_2$) substrate, various glass substrates with an insulating material layer formed on a surface thereof, a quartz substrate, a quartz substrate with an insulating material layer formed on a surface thereof, an organic polymer exemplified by polymethyl methacrylate (polymethyl methacrylate, PMMA), polyvinyl alcohol (PVA), polyvinyl phenol (PVP), polyether sulfone (PES), polyimide, polycarbonate or polyethylene terephthalate (PET) (having a form of high polymeric material such as a plastic film, a plastic sheet, or a plastic substrate with flexibility configured by a high polymeric material). The materials configuring the first substrate and the second substrate may be the same or different. However, a substrate that transmits light from the light-emitting element is required to be transparent to the light from the light-emitting element.

The organic layer is provided with the light-emitting layer including an organic light-emitting material. Specifically, for example, the organic layer is configured by a stacked structure of a hole transport layer, the light-emitting layer, and an electron transport layer; a stacked structure of the hole transport layer and the light-emitting layer serving also as the electron transport layer; a stacked structure of the hole injection layer, the hole transport layer, the light-emitting layer, the electron transport layer, and the electron injection layer; or other stacked structures. As the method of forming the organic layer, there may be exemplified: a physical vapor deposition method (PVD method) such as a vacuum deposition method; a printing method such as a screen printing method or an inkjet printing method; a laser transfer method in which a laser is irradiated to a stacked structure of a laser absorption layer and the organic layer formed on a transfer substrate to thereby separate the organic layer on the laser absorption layer and to transfer the organic layer; and various coating methods. In a case where the organic layer is formed on the basis of a vacuum deposition method, for example, a so-called metal mask is used to deposit a material having passed through an opening provided in such a metal mask to thereby be able to obtain the organic layer.

A protective layer (planarizing layer) is preferably formed between the second electrode and the second substrate. As a material configuring the protective layer, an acrylic resin may be exemplified, and SiN, SiON, SiC, amorphous silicon ($\alpha$—Si), $Al_2O_3$, and $TiO_2$ may also be exemplified. As for a method of forming the protective layer, the formation may be performed on the basis of known methods such as various CVD methods, various coating methods, various PVD methods including a sputtering method and a vacuum deposition method, and various printing methods such as a screen printing method. In addition, as the method of forming the protective layer, further, an ALD (Atomic Layer Deposition) method may be employed. The protective layer may be common to a plurality of light-emitting elements, or may be provided individually in each light-emitting element. The protective layer and the second substrate are joined via a resin layer (sealing resin layer), for example. Examples of a material configuring the resin layer (sealing resin layer) may include thermosetting adhesives such as acrylic adhesives, epoxy-based adhesives, urethane-based adhesives, silicone-based adhesives and cyanoacrylate-based adhesives, and UV-curable adhesives.

A UV-absorbing layer, a contamination preventing layer, a hard coat layer, or an antistatic layer may be formed on an outermost surface (specifically, an outer surface of the second substrate) emitting light of the organic EL panel, or a protective member (e.g., a cover glass) may be disposed on the outermost surface.

In the organic EL panel, the base, the insulating layer, and the interlayer insulating layer are formed; examples of the insulating material configuring these components may include SiOx-based materials (materials configuring a silicon-based oxide film) such as $SiO_2$, NSG (non-doped silicate glass), BPSG (boron-phosphorus-silicate glass), PSG, BSG, AsSG, SbSG, PbSG, SOG (spin-on-glass), LTO (Low Temperature Oxide, low-temperature CVD-$SiO_2$), low-melting-point glass, and a glass paste; SiN-based materials including SiON-based materials; SiOC; SiOF; and SiCN. Alternative examples thereof may include inorganic insulating materials such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), and vanadium oxide ($VO_x$). Alternative examples thereof may include various resins such as polyimide-based resins, epoxy-based resins, and acrylic resins, and low-dielectric-constant insulating materials such as SiOCH, organic SOG, and fluorine-based resins (e.g., a material having dielectric constant k ($=\varepsilon/\varepsilon_0$) of, e.g., 3.5 or less; specifically, e.g., fluorocarbon, cycloperfluorocarbon polymers, benzocyclobutene, cyclic fluorine-based resins, polytetrafluoroethylene, amorphous tetrafluoroethylene, polyarylether, arylethyl fluoride, fluorinated polyimide, amorphous carbon, parylene (polyparaxylylene), or fluorinated fullerene). There may also be exemplified: Silk (a trademark of The Dow Chemical Co.; a coated low dielectric constant interlayer insulating film material); and Flare (a trademark of Honeywell Electronic Materials Co., polyallyl ether (PAE)-based material). In addition, these materials may be used alone or in combination as appropriate. The insulating layer, the interlayer insulating layer, and the base may be formed on the basis of known methods such as various CVD methods, various coating methods, various PVD methods including a sputtering method and a vacuum deposition method, and various printing methods such as a screen printing method, a plating method, an electrodeposition method, an immersion method, and a sol-gel method.

In the organic EL panel, the thickness of the hole transport layer (hole supply layer) and the thickness of the electron transport layer (electronic supply layer) are desirably approximately equal. Alternatively, the electron transport layer (electron supply layer) may be thicker than the hole transport layer (hole supply layer). This makes it possible to supply electrons necessary for high efficiency at a lower drive voltage as well as to supply sufficient electrons to the light-emitting layer. That is, by disposing the hole transport layer between the light-emitting layer and the first electrode corresponding to the anode electrode and forming the hole transport layer to have a thinner thickness than the electron transport layer, it is possible to increase the supply of holes. In addition, this makes it possible to obtain a carrier balance in which there is no excess or deficiency of holes and electrons and a carrier supply amount is sufficiently large, thus making it possible to obtain high luminous efficiency. Further, as a result of no excess or deficiency of holes and electrons, the carrier balance is hardly collapsed, and the drive deterioration is suppressed, thus making it possible to increase light emission lifetime.

Example 1

Figure 2A:
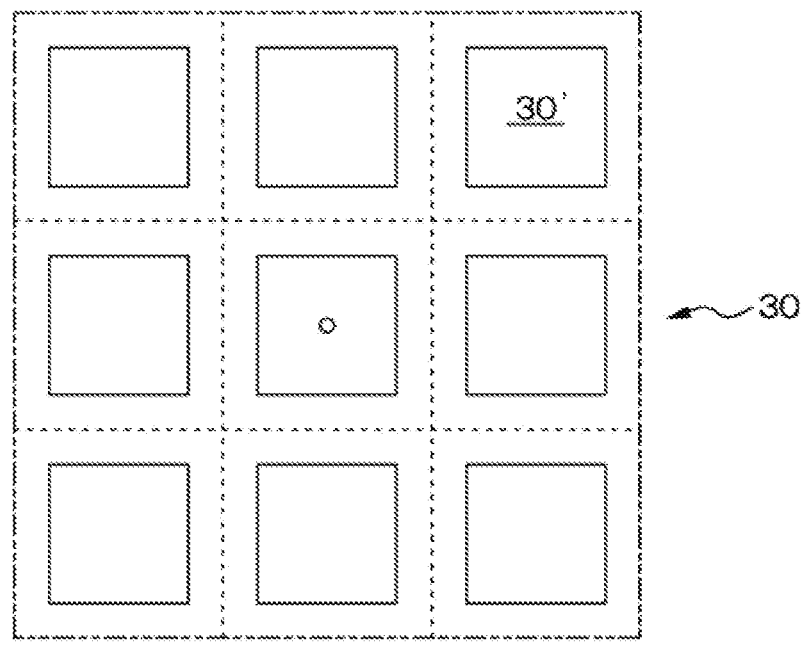
FIGS. 2A and 2B are, respectively, a schematic plan view of a light-emitting section including a plurality of light-emitting regions in one light-emitting element, and a schematic plan view of a light-emitting section including a plurality of microlens members, in Example 1.
Figure 2B:
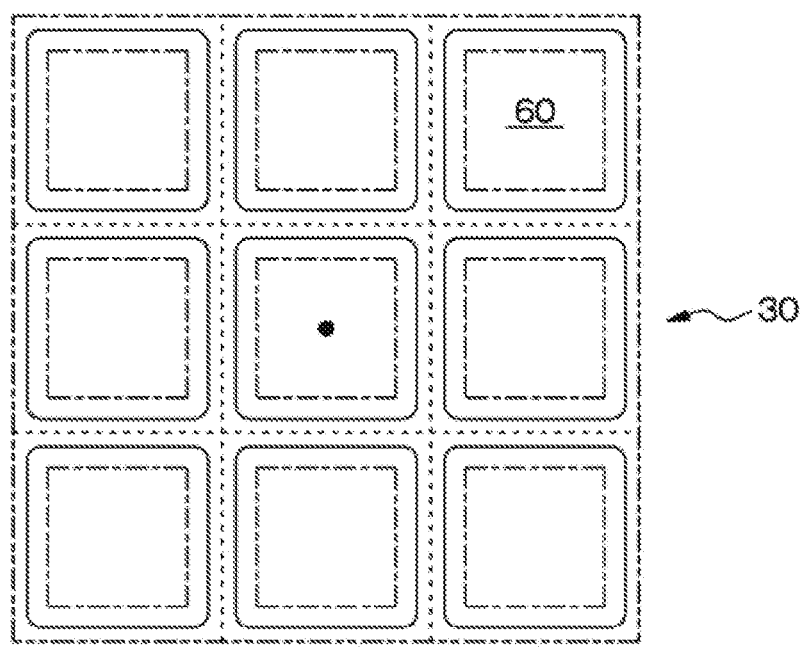
Figure 7A:
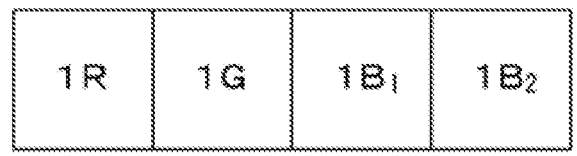
FIGS. 7A and 7B each illustrate a schematic arrangement of four panels configuring the projection display device of Example 1.
Figure 7B:
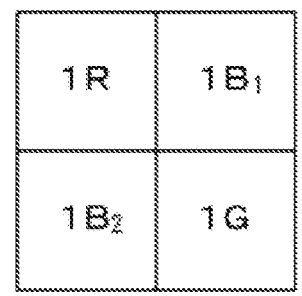
Figure 8:
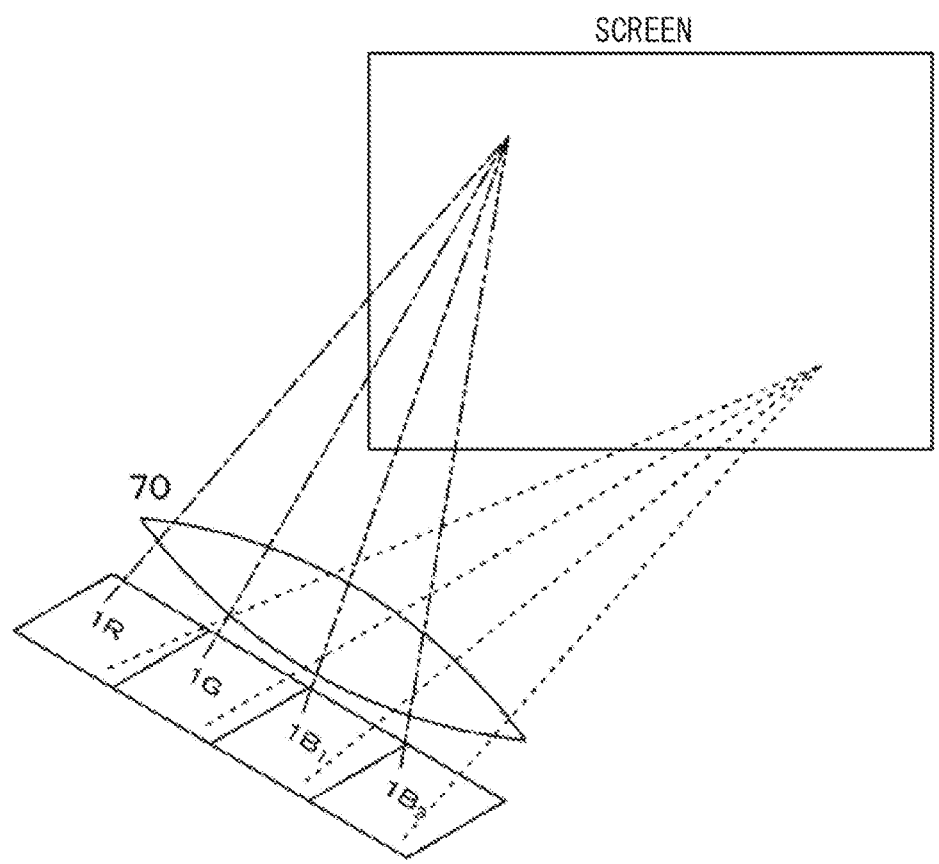
FIG. 8 schematically illustrates an image projection state of the four panels configuring the projection display device of Example 1 illustrated in FIG. 7A.
Figure 9:
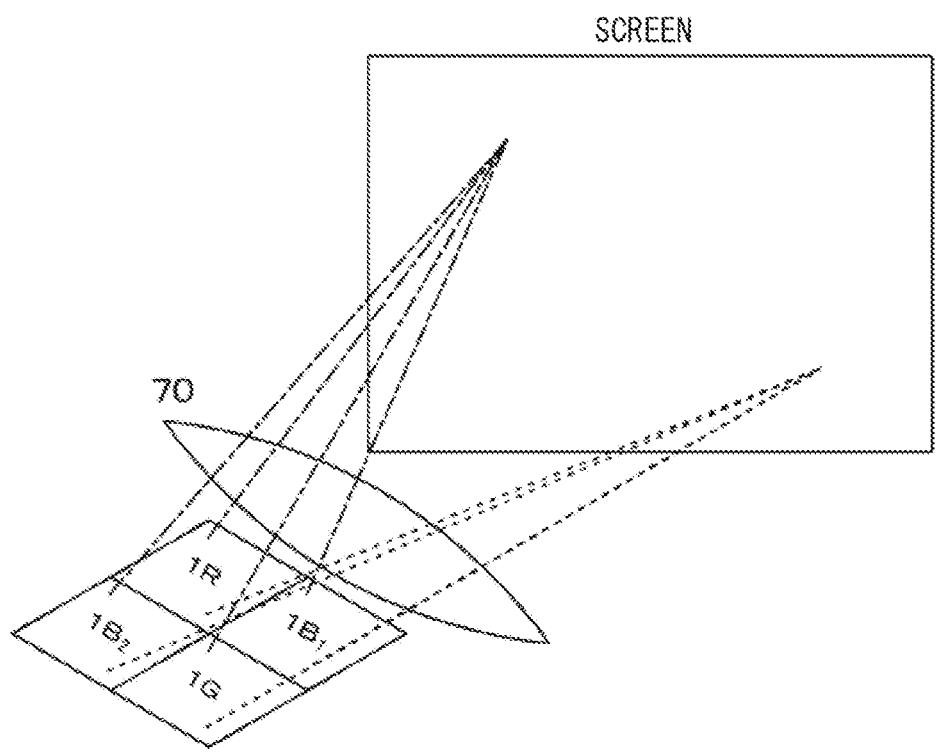
FIG. 9 schematically illustrates an image projection state of the four panels configuring the projection display device of Example 1 illustrated in FIG. 7B.
Figure 20A:
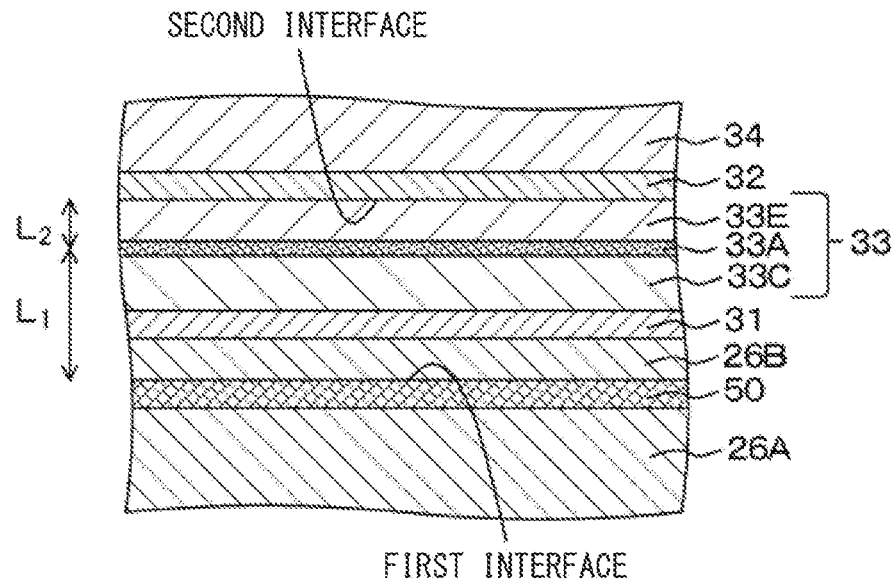
FIGS. 20A and 20B are schematic partial cross-sectional views of light-emitting elements of Example 1 and Example 5, respectively.

Example 1 relates to the light-emitting element according to the first aspect of the present disclosure and the display device of the present disclosure, and to the light-emitting element of the first embodiment. FIG. 1 illustrates a schematic partial cross-sectional view of the light-emitting element of Example 1 and a panel configuring the display device of Example 1 (specifically, projection display device). FIG. 2A illustrates a schematic plan view of the light-emitting section including a plurality of (M×N) light-emitting regions in one light-emitting element. FIG. 2B illustrates a schematic plan view of the light-emitting section including a plurality of (P×Q) microlens members. In addition, FIGS. 7A and 7B each illustrate a schematic arrangement of four panels configuring the projection display device of Example 1. FIGS. 8 and 9 each schematically illustrate an image projection state of the four panels configuring the projection display device of Example 1 illustrated in FIGS. 7A and 7B. Further, FIG. 20A illustrates a schematic partial cross-sectional view of the light-emitting element of Example 1.

It is to be noted that, in FIGS. 2A, 3A, 4A, 5A, 6A, 21A, 22A, and 23A, one light-emitting region is indicated by a solid line; in FIGS. 2B, 3B, 4B, 5B, 6B, 21B, 22B, and 23B, one microlens member is indicated by a solid line, and one light-emitting region is indicated by an alternate long and short dash line; and, in FIGS. 2A, 2B, 3A, 3B, 4A, 4B, 5A, 5B, 6A, 6B, 21A, 21B, 22A, 22B, 23A, and 23B, one light-emitting section is surrounded by an alternate long and two short dashes line, and a region including one light-emitting region is surrounded by a dotted line. In addition, the center line passing through the center of the light-emitting region is indicated by a white circle, and the optical axis of the microlens member is indicated by a black circle.

A light-emitting element 10 of Example 1 includes:
a light-emitting section 30 including a plurality of light-emitting regions 30'; and
one or a plurality of microlens members 60 controlling a traveling direction of light emitted from each of the light-emitting regions 30'.

Specifically, the light-emitting element 10 of Example 1 includes:
the light-emitting section 30 including M×N (where M and N stand for integers of one or more, excluding a case of M=1 and N=1) light-emitting regions 30'; and
P×Q (where P=p×M and Q=q×N hold true, and p and q stand for integers of one or more) microlens members 60 controlling a traveling direction of each light emitted from the M×N light-emitting regions 30'.

In addition, the display device of Example 1 or Examples 2 to 6 described later, specifically, the projection display device (projector) includes:

a first substrate 11;

a second substrate 41; and a panel including a plurality of light-emitting elements interposed between the first substrate 11 and the second substrate 41.

Each of the light-emitting elements is configured by the light-emitting element 10 of Example 1 or Examples 2 to 6 described later.

In addition, the light-emitting element 10 of Example 1 is the light-emitting element of the first embodiment, and the light-emitting section 30 includes:

a first electrode 31 shared in the light-emitting region 30';

an organic layer 33 formed on the first electrode 31 and including a light-emitting layer 33A including an organic light-emitting material; and a second electrode 32 formed on the organic layer 33, and the light-emitting section 30 further includes a light reflective layer 50 below the first electrode 31, and resonates light emitted by the light-emitting layer 33A between an interface and the light reflective layer 50, the interface being between the second electrode 32 and the organic layer 33, and emits a portion of the light from the second electrode 32. In addition, an insulating layer 28 is formed between the first electrode 31 and the organic layer 33, and the insulating layer 28 has an opening 29 defining the light-emitting region 30'. In addition, a resonator structure is formed between a surface (first interface) of the light reflective layer 50 on side of the first electrode 31 and an interface (second interface) between the second electrode 32 and the organic layer 33.

Here, in Example 1, M=N=3, P=Q=3, and p=q=1 hold true. The size of one light-emitting section 30 was set to 7.8 μm×7.8 μm, the size of one opening 29 (one light-emitting region 30') was set to 2.2 μm×2.2 μm, and the size of a region including one light-emitting region 30' was set to 2.6 μm×2.6 μm, although no limitations are made thereto. The planar shape of the one opening 29 (one light-emitting region 30') is a square shape. In addition, the planar shape of the microlens member 60 is a shape of a square with corner portions being rounded, and the size thereof is, for example, 2.2 μm×2.2 μm. It is to be noted that the microlens member 60 is desirably larger than the opening 29 (light-emitting region 30'). One reason for this is that the microlens member 60, which covers a divergence angle of light emitted from the light-emitting section 30, achieves an improvement in light-condensing efficiency more. The microlens member 60 is one type of an aspherical lens, is configured by a plano-convex lens, and has a convex surface in a direction away from the light-emitting region 30'. In the examples illustrated in FIGS. 2A and 2B, the microlens member 60 has an optical axis that is positioned on a center line passing through the center of the light-emitting region 30', and an orthogonal projection image of the light-emitting region 30' is included within an orthogonal projection image of the microlens member 60. Specifically, the orthogonal projection image of the one light-emitting region 30' is included within the orthogonal projection image of one microlens member 60. The microlens member 60 has positive optical power. It is sufficient for the plurality of light-emitting regions 30' to be arranged at desired positions; specifically, the light-emitting regions 30' are arranged regularly. That is, for example, the center of the light-emitting region 30' is disposed on a lattice point of the virtual lattice (square lattice).

Figure 28A:
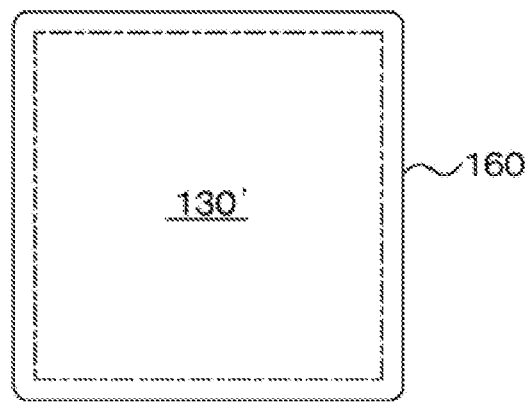
FIGS. 28A, 28B, and 28C are each an explanatory schematic view of a relationship in a planar shape between the light-emitting region and the microlens member.
Figure 28B:
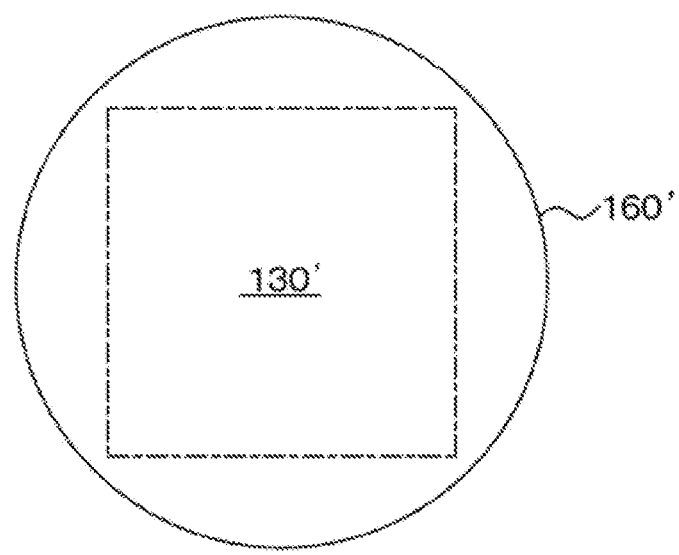
Figure 28C:
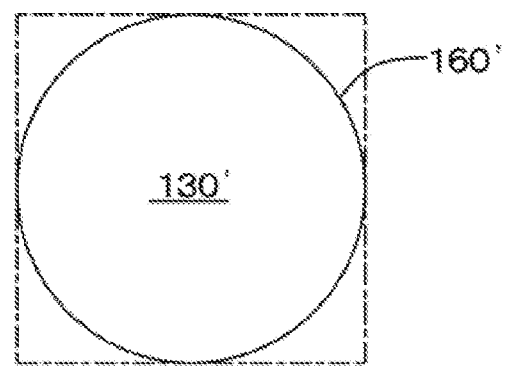

In a case where the planar shape of a light-emitting region 130' is a square shape and the planar shape of a microlens member 160' is a circular shape, the size of the microlens member 160' used to pass through light emitted from the light-emitting region 130' is larger than the light-emitting region 130', as illustrated in FIG. 28B. Alternatively, as illustrated in FIG. 28C, it is difficult for the microlens member 160' to efficiently condense light emitted in a corner region of the light-emitting region 130'. Meanwhile, in a case where the planar shape of the light-emitting region 130' is a square shape and the planar shape of a microlens member 160 is a square shape, the size of the microlens member 160 used to pass through the light emitted from the light-emitting region 130' is not too large as illustrated in FIG. 28A, and the microlens member 160 is able to efficiently condense the light emitted in the corner region of the light-emitting region 130'. As described above, in the case where the planar shape of the light-emitting region 130' is a square shape and the planar shape of the microlens member 160 is a square shape, it is possible to reduce an area occupied by the microlens member 160, and further to efficiently condense the light from the light-emitting region 130'.

In Example 1 or Examples 2 to 6 described later, the panels configuring the projection display device includes an organic EL panel, the light-emitting element 10 includes an organic EL element, and the organic layer 33 includes an organic electroluminescence layer. In addition, the organic EL panel is a top-emission type organic EL panel that emits light from the second substrate 41, and light from the organic layer 33 is emitted to the outside through the second substrate 41.

In addition, the projection display device of Example 1 or Examples 2 to 6 described later includes:

one red light emission panel (a first panel 1R) that emits red light, one green light emission panel (a second panel 1G) that emits green light, and one blue light emission panel (a third panel 1B$_1$) that emits blue light, and further includes one blue light emission panel (a fourth panel 1B$_2$) that emits blue light; the projection display device is configured by the four panels 1R, 1G, 1B$_1$, and 1B$_2$. In addition, a projection lens system 70 is provided on light emission side of the projection display device. The four panels may be arranged in an array (1×4 state) as illustrated in FIGS. 7A and 8, or the four panels may be arranged in a 2×2 state as illustrated in FIGS. 7B and 9. It is to be noted that FIGS. 8 and 9 illustrate light beams emitted from the panels in dotted lines and alternate long and short dash lines. The number of pixels of the panels is, for example, 1920×1080, and one light-emitting element 10 configures one pixel. In addition, the size of the panel is, for example, 10 mm×10 mm.

Each of the panels emits a single color light beam. The light-emitting layer in the light-emitting element that configures the first panel 1R includes a red light light-emitting layer that emits red light, and light emitted by the first panel 1R is red light (having an emission spectrum peak within a range of a wavelength from 620 nm to 750 nm), and, specifically, a peak wavelength $\lambda_R$ is as exhibited in Table 1 below. In addition, the light-emitting layer in the light-emitting element that configures the second panel 1G includes a green light light-emitting layer that emits green light, and light emitted by the second panel 1G is green light (having an emission spectrum peak within a range of a wavelength from 495 nm to 570 nm), and, specifically, the peak wavelength $\lambda_G$ is as exhibited in Table 1 below. Further, the light-emitting layers in the light-emitting elements that configure the third panel $1B_1$ and the fourth panel $1B_2$ include blue light light-emitting layers that emit blue light beams, and light beams emitted by the third panel $1B_1$ and the fourth panel $1B_2$ are each blue light (having an emission spectrum peak within a range of a wavelength from 450 nm to 495 nm), and the peak wavelength $\lambda_B$ is as exhibited in Table 1 below.

Here, the light-emitting element 10 of Example 1 satisfies the above-mentioned expressions (1-1) and (1-2). Specifically, $m_1=m_2=1$ holds true. However, no limitation is made to these values; for example, $m_1=m_2=0$ may also hold true. Values of an optical distance ($OL_1+OL_2$) obtained from the expressions (1-1) and (1-2) are exhibited in Table 1 below.

TABLE 1

| | $m_1$ | $m_2$ | Peak Wavelength λ | $OL_1 + OL_2$ |
|---|---|---|---|---|
| 1st panel | 1 | 1 | 530 nm | 280 nm |
| 2nd panel | 1 | 1 | 630 nm | 230 nm |
| 3rd panel/4th panel | 1 | 1 | 440 nm | 170 nm |

The second electrode 32 is covered with a protective layer (planarizing layer) 34 including an acrylic resin. The microlens member 60 is disposed on the light emission side of the organic layer 33. That is, the microlens member 60 including a well-known material is formed on the protective layer 34 in a well-known method. Light emitted from the microlens member 60 is parallel light (telecentric light). The protective layer 34 and the microlens member 60 are attached to the second substrate 41 via a sealing resin layer 35. Examples of a material configuring the sealing resin layer 35 may include thermosetting adhesives such as acrylic adhesives, epoxy-based adhesives, urethane-based adhesives, silicone-based adhesives and cyanoacrylate-based adhesives, and UV-curable adhesives.

The light reflective layer 50 including Al—Cu, Ag, or Ag—Cu is formed inside a base (interlayer insulating layer) 26 including $SiO_2$ formed on the basis of the CVD method. That is, the base (interlayer insulating layer) 26 is configured by two layers of a lower interlayer insulating layer 26A and an upper interlayer insulating layer 26B, and the light reflective layer 50 is formed between the lower interlayer insulating layer 26A and the upper interlayer insulating layer 26B. In a case where the light reflective layer 50 is configured by silver (Ag), a base film including TiN, for example, is preferably formed on the lower interlayer insulating layer 26A in order to control a crystalline state of the light reflective layer 50 to be formed. There is no need to form a TiN layer on the light reflective layer 50. In addition, the lower interlayer insulating layer and the upper interlayer insulating layer may be configured by the same material, or may be configured by different materials in order to have an appropriate value for $OL_1$.

In addition, the light-emitting element drive section is provided below the base (interlayer insulating layer) 26. The light-emitting element drive section may have a well-known circuit configuration. The light-emitting element drive section is configured by a transistor (specifically, MOSFET) formed in a silicon semiconductor substrate corresponding to the first substrate 11. A transistor 20 including the MOSFET is configured by a gate insulating layer 22 formed on the first substrate 11, a gate electrode 21 formed on the gate insulating layer 22, a source/drain region 24 formed in the first substrate 11, a channel formation region 23 formed between the source/drain regions 24, and an element separation region 25 surrounding the channel formation region 23 and the source/drain region 24. The transistor 20 and the first electrode 31 are electrically coupled together via a contact plug 27 provided in the base 26. It is to be noted that, in the drawing, one transistor 20 is illustrated for one light-emitting element drive section.

The second electrode 32 is coupled to the light-emitting element drive section via an unillustrated contact hole (contact plug) formed in the base (interlayer insulating layer) 26, in an outer peripheral part of the organic EL panel. In the outer peripheral part of the organic EL panel, an auxiliary electrode coupled to the second electrode 32 may be provided below the second electrode 32, and the auxiliary electrode may be coupled to the light-emitting element drive section.

The first electrode 31 functions as an anode electrode, and the second electrode 32 functions as a cathode electrode. In addition, the first electrode 31 includes a light-transmissive material, and the second electrode 32 includes a semi-light-transmissive material. Specifically, the first electrode 31 includes a transparent electrically-conductive material layer, and, more specifically, ITO and IZO, and the second electrode 32 includes silver (Ag). The first electrode 31 is formed on the base (interlayer insulating layer) 26 on the basis of a combination of the vacuum deposition method and the etching method. In addition, the second electrode 32 is formed, particularly, by a film-forming method with smaller energy of a film-forming particle such as the vacuum deposition method, and is not patterned. The organic layer 33 is not also patterned. However, this is not limitative; the organic layer 33 may also be patterned.

In Example 1, the organic layer 33 has a stacked structure of, for example, a hole injection layer (HIL: Hole Injection Layer), a hole transport layer (HTL: Hole Transport Layer), the light-emitting layer 33A, an electron transport layer (ETL: Electron Transport Layer), and an electron injection layer (EIL: Electron Injection Layer). In FIG. 20A, the hole injection layer and the hole transport layer are collectively denoted by a reference numeral 33C, and the electron transport layer and the electron injection layer are collectively denoted by a reference numeral 33E.

The hole injection layer is a layer that enhances hole injection efficiency, and functions as a buffer layer that prevents leakage; a thickness thereof is, for example, about 2 nm to 10 nm. The hole injection layer includes, for example, a hexaazatriphenylene derivative represented by the following formula (A) or formula (B). It is to be noted that a state in which an end face of the hole injection layer is in contact with the second electrode becomes a major cause of occurrence of dispersion in luminance between pixels, which leads to a decrease in display image quality.

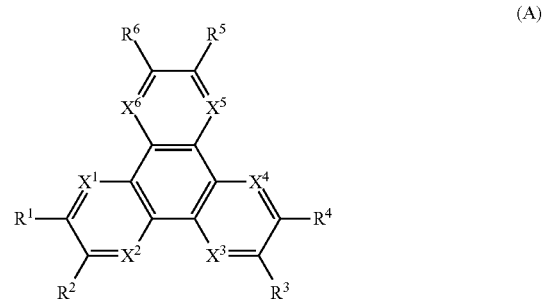

(A)

Here, $R^1$ to $R^6$ are each independently a substituent selected from hydrogen, a halogen, a hydroxy group, an amino group, an arylamino group, a substituted or unsubstituted carbonyl group having 20 carbon atoms or less, a substituted or unsubstituted carbonyl ester group having 20 carbon atoms or less, a substituted or unsubstituted alkyl group having 20 carbon atoms or less, a substituted or unsubstituted alkenyl group having 20 carbon atoms or less, a substituted or unsubstituted alkoxy group having 20 carbon atoms or less, a substituted or unsubstituted aryl group having 30 carbon atoms or less, a substituted or unsubstituted heterocyclic group having 30 carbon atoms or less, a nitrile group, a cyano group, a nitro group, or a silyl group, in which adjacent $R^m$ (m=1 to 6) may be linked to each other via a cyclic structure. In addition, $X^1$ to $X^6$ are each independently a carbon or nitrogen atom.

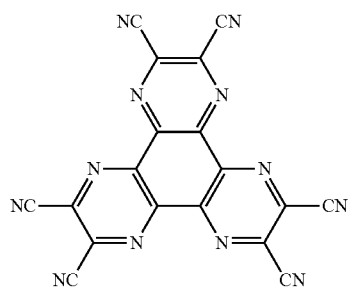

(B)

The hole transport layer is a layer that enhances efficiency of hole transportation to the light-emitting layer 33A. In the light-emitting layer 33A, application of an electric field causes recombination of electrons and holes, thus generating light. The electron transport layer is a layer that enhances efficiency of electron transportation to the light-emitting layer 33A, and the electron injection layer is a layer that enhances efficiency of electron injection into the light-emitting layer 33A.

The hole transport layer includes, for example, 4, 4', 4"-tris(3-methylphenylamino)triphenylamine (m-MTDATA) or α-naphthylphenyldiamine (α NPD) having a thickness of about 40 nm.

In the red light light-emitting layer, the application of an electric field causes recombination of a portion of holes injected from the first electrode 31 and a portion of electrons injected from the second electrode 32, thus generating red light. Such a red light light-emitting layer includes, for example, at least one type of a material among a red light light-emitting material, a hole transporting material, an electron transporting material, and a both charge transporting material. The red light light-emitting material may be a fluorescent material or a phosphorescent material. The red light light-emitting layer having a thickness of about 5 nm includes, for example, a mixture of 4, 4-bis(2,2-diphenylvinyl)biphenyl (DPVBi) with 30% by mass of a 2,6-bis[(4'-methoxydiphenylamino)styryl]-1,5-dicyanonaphthalene (BSN).

In the green light light-emitting layer, the application of an electric field causes recombination of a portion of holes injected from the first electrode 31 and a portion of electrons injected from the second electrode 32, thus generating green light. Such a green light light-emitting layer includes, for example, at least one type of a material among a green light light-emitting material, a hole transporting material, an electron transporting material, and a both charge transporting material. The green light light-emitting material may be a fluorescent material or a phosphorescent material. The green light light-emitting layer having a thickness of about 10 nm includes, for example, a mixture of DPVBi with 5% by mass of coumarin 6.

In the blue light light-emitting layer, the application of an electric field causes recombination of a portion of holes injected from the first electrode 31 and a portion of electrons injected from the second electrode 32, thus generating blue light. Such a blue light light-emitting layer includes, for example, at least one type of a material among a blue light light-emitting material, a hole transporting material, an electron transporting material, and a both charge transporting material. The blue light light-emitting material may be a fluorescent material or a phosphorescent material. The blue light light-emitting layer having a thickness of about 30 nm includes, for example, a mixture of DPVBi with 2.5% by mass of 4,4'-bis[2-{4-(N,N-diphenylamino)phenyl}vinyl] biphenyl (DPAVBi).

The electron transport layer having a thickness of about 20 nm includes, for example, 8-hydroxyquinoline aluminum ($Alq_3$). The electron injection layer having a thickness of about 0.3 nm includes, for example, LiF, $Li_2O$, or the like.

However, the material configuring each layer is illustrative, and no limitation is made to these materials. Configuring the light-emitting layer 33A by a phosphorescent material makes it possible to achieve an increase in luminance by about 2.5 times to 3 times as compared with the case where the light-emitting layer 33A is configured by a fluorescent material. In addition, the light-emitting layer 33A may also be configured by a thermally activated delayed fluorescent (TADF, Thermally Activated Delayed Fluorescence) material.

Hereinafter, description is given of an overview of a method of manufacturing the light-emitting element 10 of Example 1 illustrated in FIG. 1.

[Step-100]

First, the light-emitting element drive section is formed in the silicon semiconductor substrate (first substrate 11) on the basis of a known MOSFET manufacturing process.

[Step-110]

Next, the base (interlayer insulating layer) 26 is formed on the entire surface. Specifically, first, the lower interlayer insulating layer 26A is formed on the basis of the CVD method; the light reflective layer 50 is formed on the lower interlayer insulating layer 26A on the basis of the sputtering method; the light reflective layer 50 is patterned on the basis of the etching method; and, further, the upper interlayer insulating layer 26B is formed on the lower interlayer insulating layer 26A and the light reflective layer 50 on the basis of the CVD method. The illustrated interlayer insulating layer 26 includes the lower interlayer insulating layer 26A and the upper interlayer insulating layer 26B.

[Step-120]

Then, a coupling hole is formed on a portion (including the light reflective layer 50), of the base 26, positioned above one of the source/drain regions of the transistor 20 on the basis of a photolithography technique and an etching technique. Then, a metal layer is formed on the base 26 including the coupling hole, for example, on the basis of the sputtering method, and subsequently the metal layer is patterned on the basis of the photolithography technique and the etching technique to thereby enable formation of the first electrode 31 on a portion of the base 26. The first electrode 31 is separated for each light-emitting element. In addition, the contact hole (contact plug) 27 electrically coupling first electrode 31 and the transistor 20 together is able to be formed in the coupling hole. The contact hole (contact plug) 27 includes, for example, tungsten (W). The light reflective layer 50 is coupled to the contact hole (contact plug) 27.
[Step-130]

Next, for example, the insulating layer 28 is formed on the entire surface on the basis of the CVD method, and thereafter the insulating layer 28 is left on the base 26 between the first electrodes 31 on the basis of the photolithography technique and the etching technique. In addition, the opening 29 is formed in the insulating layer 28 on the first electrode 31.
[Step-140]

Thereafter, the organic layer 33 is formed on the insulating layer 28 and the first electrode 31 exposed to a bottom portion of the opening 29 by means of, for example, the PVD method such as the vacuum deposition method or the sputtering method, a coating method such as a spin coating method or a die coating method, or the like. In some cases, the organic layer 33 may be patterned into a desired shape.
[Step-150]

Next, the second electrode 32 is formed on the entire surface, for example, on the basis of the vacuum deposition method or the like. In some cases, the second electrode 32 may be patterned into a desired shape. In this manner, the organic layer 33 and the second electrode 32 are able to be formed on the first electrode 31
[Step-160]

Thereafter, the protective layer 34 is formed on the entire surface on the basis of the coating method, and thereafter a top surface of the protective layer 34 is subjected to planarizing processing. Enabling the formation of the protective layer 34 on the basis of the coating method allows for less restriction on a working process as well as wider selection of materials. Thereafter, the microlens member 60 facing the opening 29 is formed on the protective layer 34. It is sufficient for the microlens member 60 to be formed pursuant to a well-known method. That is, for example, a resist material having a square planar shape is provided on the protective layer 34, and the resist material is subjected to heating processing, thereby making it possible to obtain the microlens member 60 having a planar shape of a square with corner portions being rounded.
[Step-170]

Then, the protective layer 34, the microlens member 60, and the second substrate 41 are attached together by the sealing resin layer 35 including an acrylic adhesive. In this manner, the light-emitting element (organic EL element) 10 illustrated in FIG. 1 and the organic EL panel of Example 1 are able to be obtained.

Figure 19:
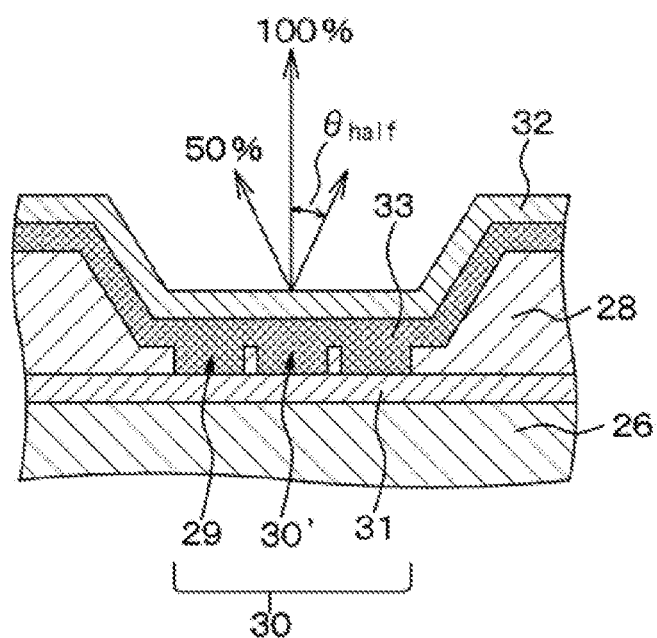
FIG. 19 schematically illustrates a state of light emission from the light-emitting element.

FIG. 19 schematically illustrates a state of light emission from the light-emitting element 10; a light beam is indicated by an arrow, and a directivity half-value angle is denoted by "$\theta_{half}$".

Here, in the existing organic EL element, the light-emitting layer configuring the organic EL element is configured, for example, by stacking the red light light-emitting layer, the green light light-emitting layer, and the blue light light-emitting layer. A white color light is emitted, and a red color filter layer is provided to obtain a red light organic EL element 100R; a green color filter layer is provided to obtain a green light organic EL element 100G; and a blue color filter layer is provided to obtain a blue light organic EL element 100B. Hereinafter, such a stacked structure of the red light light-emitting layer, the green light light-emitting layer, and the blue light light-emitting layer may be referred to as an "RGB stacked structure" in some cases for the sake of convenience. In addition, the resonator structure is employed, and each value of $m_1$ and $m_2$ in the expressions (1-1) and (1-2) is usually set to "0" or "1", but no limitation is made to these values.

In the light-emitting element 10 of Example 1, when $I_0$ stands for light intensity (light intensity of light emitted from the light-emitting element 10) in the center line passing through the center of the light-emitting section 30 of the light-emitting element 10, and $I_{conv}$ stands for light intensity (light intensity of light emitted from the light-emitting element 10) in the center line passing through the center of the light-emitting section 30 of the light-emitting element 10 not including the light reflective layer 50, $$I_0/I_{conv} \geq 5$$

is satisfied.

Figure 30A:
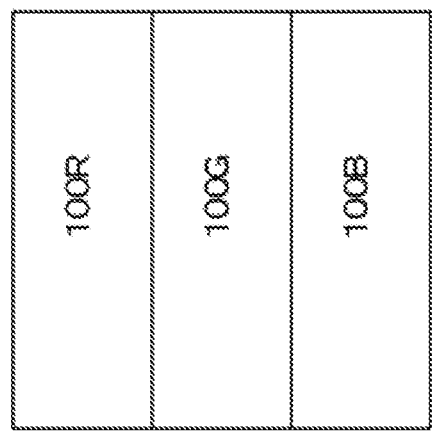
FIGS. 30A and 30B are, respectively, a schematic arrangement diagram of three organic electroluminescence elements configuring one pixel of an existing organic electroluminescence display device, and a schematic arrangement diagram of the light-emitting region.
Figure 30B:
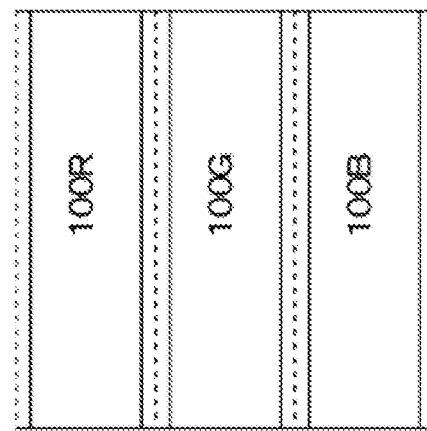

The FIGS. 30A and 30B illustrate, respectively, a schematic arrangement diagram of the color filter layers in the existing organic EL element and a schematic arrangement diagram of the light-emitting regions. A length of one side of one pixel having a square planar shape is set as "a". An area occupied by the red light organic EL element 100R, the green light organic EL element 100G, and the blue light organic EL element 100B is (⅓) $a^2$. In addition, the red light organic EL element 100R, the green light organic EL element 100G, and the blue light organic EL element 100B are spaced apart from each other; therefore, as for the light-emitting region, for example, (⅓)×0.75=0.25$a^2$ holds true. When a current flowing to the red light organic EL element 100R, the green light organic EL element 100G, and the blue light organic EL element 100B for light emission of these organic EL elements is set to "1.00", for example, a percentage of a current flowing to the green light organic EL element 100G is 0.38, for example. In addition, each of the red light organic EL element 100R, the green light organic EL element 100G, and the blue light organic EL element 100B is provided with the color filter layer, and about 10% of light emitted by the light-emitting layer of the organic EL element is absorbed by the color filter layer. Therefore, as for luminance efficiency in the existing green light organic EL element 100G, (Percentage of a current flowing to the green light organic EL element 100G)×(Optical transmittance of the color filter layer)×(Percentage occupied by the light-emitting region of the green light organic EL element 100G in one pixel)

$$=0.38 \times 0.9 \times 0.25 a^2$$

$$=0.0855 \times a^2$$

holds true.

Meanwhile, in the light-emitting element 10 of Example 1, the percentage of a current flowing to the light-emitting element 10 is 1.00, with no color filter layer being provided, and an area occupied by the light-emitting element 10 in one pixel is $a^2$. Therefore, as for luminance efficiency of the light-emitting element 10 of Example 1, $$1/0.0855 = 12 \text{ times}$$

holds true, as compared with luminance efficiency of an existing green light organic EL element G. In this manner, the light-emitting element 10 of Example 1 is able to achieve much higher luminance efficiency than the existing the organic EL element.

In addition, the existing organic EL element involves difficulty in designing the maximum light-emitting position in the light-emitting layer and in controlling the maximum light-emitting position during manufacture of the light-emitting layer. In addition, a material configuring the blue light light-emitting layer generally has shorter lifetime than materials configuring the red light light-emitting layer and the green light light-emitting layer. Therefore, when a light-luminescence state of the blue light light-emitting layer is degraded, a chromaticity point of a white color results in being moved from a desired chromaticity point, and the panels becomes unusable. That is, the lifetime of the light-emitting element having the RGB stacked structure results in being defined by the material configuring the blue light light-emitting layer. In addition, when the RGB stacked structure is adopted, there is a possibility that an unintentional interference may occur.

Meanwhile, the projection display device of Example 1 is configured by the four panels of one red light emission panel emitting red light, one green light emission panel emitting green light, and two blue light emission panels emitting blue light, thus making it possible to reduce a drive current in the blue light emission panel, which consequently makes it possible to achieve longer lifetime of the blue light emission panel. Moreover, the achievement in longer lifetime of the blue light emission panel allows for wider selection as well as higher selection flexibility of materials configuring the light-emitting layer of the light-emitting element configuring the red light emission panel and the green light emission panel. In addition, as described above, it is possible, in Example 1, to provide the projection display device that makes it possible to form an image by a self-luminous light-emitting element, and the light-emitting element suitable for use in such a projection display device or a surface-emitting device. In addition, it is possible to reduce the number of layers configuring the organic layer as compared with the existing organic EL element, thus making it possible to achieve lower voltage of the drive voltage of the light-emitting element.

The existing organic EL element is of Lambertian radiation, and a directivity half-value angle in Lambertian radiation is about 70 degrees. Therefore, in the existing display device, it is preferable to use an organic EL element having Lambertian radiation in order to have a wider viewing angle, i.e., to reduce viewing angle dependency.

Figure 29A:
FIGS. 29A, 29B, 29C, and 29D are each an explanatory schematic view of luminance or the like obtained when using a lens having a low F-value and a lens having a high F-value.

Incidentally, as illustrated in the conceptual diagram in FIG. 29A, in a case of using a lens having a small numerical aperture NA (e.g., F=1.8; hereinafter, referred to as a "lens-A" for the sake of convenience) configuring the projection lens system 70 in the projection display device, a considerable portion of light emitted from the organic EL element 200 (indicated by a small arrow) is not incident on the lens-A. Meanwhile, as illustrated in the conceptual diagram in FIG. 29C, in a case of using a lens having a large numerical aperture NA (e.g., F=1.1; hereinafter, referred to as a "lens-B" for the sake of convenience) configuring the projection lens system 70, a considerable portion of the light emitted from the organic EL element 200 is incident on the lens-B. The use of the lens-B having a large numerical aperture NA in this manner allows for high use efficiency of the light emitted from the existing organic EL element 200. However, the lens-B having a large numerical aperture NA is expensive, large and heavy, and have a shallow depth of field (DOF).

Meanwhile, in the light-emitting element 10 of Example 1, the light-emitting section 30 includes the plurality of light-emitting regions 30', and the microlens member 60 is provided in a manner corresponding to each of the light-emitting regions 30'. This makes it possible to easily and reliably perform precise and fine control of a direction of the light (control of a light beam angle) emitted from the light-emitting element 10 as well as control of light parallelism (control of light beam divergence angle) and to achieve high luminance. Therefore, it is possible to provide a high-luminance display device that makes it possible to form an image by the light-emitting element 10 of self-luminous type.

Figure 29B:
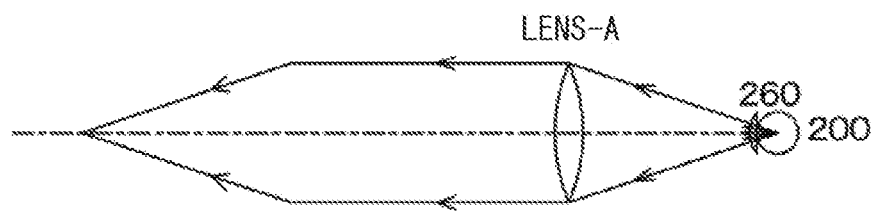
Figure 29C:
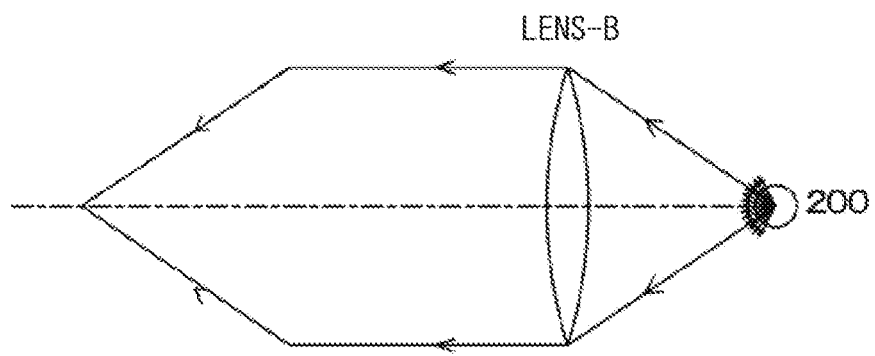
Figure 29D:
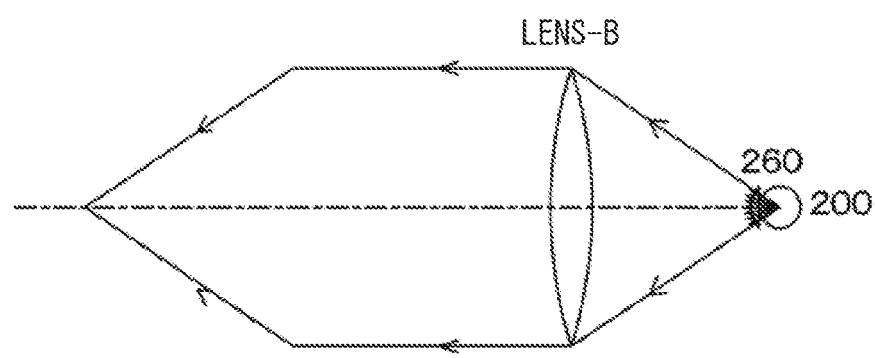

That is, as illustrated in FIGS. 29B and 29D, disposing a microlens member 260 makes it possible to control the light beam divergence angle of the light emitted from the organic EL element 200. Table 2 exhibits the directivity half-value angle of the organic EL element 200, the luminance of the organic EL element 200, and the front illuminance of the display device in each state illustrated in FIG. 29A, FIG. 29B, and FIGS. 29C and 29D. It is to be noted that, in Table 2, the directivity half-value angle is denoted by "$\theta_{half}$" (unit: degree); a relative value of the luminance of the organic EL element 200 is denoted by "relative luminance"; and a relative value of illuminance of the display device is denoted by "relative illuminance". Here, the relative luminance 'a' is a value obtained by dividing the value of the luminance (luminance of light emitted from the microlens member 260) of the organic EL element 200 including the microlens member 260 in the example illustrated in FIG. 29B by the value of the luminance of the organic EL element 200 in the example illustrated in FIG. 29A. In addition, the relative luminance 'b' is a value obtained by dividing the value of the luminance (luminance of light emitted from the microlens member 260) of the organic EL element 200 including the microlens member 260 in the example illustrated in FIG. 29D by the value of the luminance of the organic EL element 200 in the example illustrated in FIG. 29C. In addition, relative illuminance A is a value obtained by dividing the value of the illuminance of the display device in the example illustrated in FIG. 29B by the value of the illuminance of the display device in the example illustrated in FIG. 29A, whereas relative illuminance B is a value obtained by dividing the value of the illuminance of the display device in the example illustrated in FIG. 29D by the value of the illuminance of the display device in the example illustrated in FIG. 29C.

TABLE 2

|  | θ half | relative luminance | relative illuminance |
| --- | --- | --- | --- |
| Lens-A (see FIG. 29A) | 60 | — | — |
| Lens-A (see FIG. 29B) | 19 | a = 2 | A = 1.7 |
| Lens-B (see FIG. 29C) | 60 | — | — |
| Lens-A (see FIG. 29B) | 19 | b = 2 | B = 1.07 |

It may be derived, from Table 2, that disposing the microlens member 60 in the light-emitting region makes it possible to increase the luminance of the light-emitting section. In addition, it is appreciated that, in a case of using the lens-A which is dark, disposing the microlens member 60 in the light-emitting region makes it possible to achieve a 1.7-fold improvement in the illuminance. Meanwhile, in a case of using the lens-B which is bright, even disposing the microlens member 60 in the light-emitting region only achieves a 1.07-fold increase in the illuminance. As described above, it is appreciated that, even in a case of using the dark lens-A, disposing the microlens member 60 in the light-emitting region makes it possible to achieve a significant increase in the illuminance of the display device as compared with the case where the microlens member 60 is not disposed in the light-emitting region.

As described above, disposing the microlens member in the light-emitting region makes it possible to use a lens having a high F-number or a high depth of field (DOF) as the lens configuring the projection lens system. In addition, light incident on the projection lens system or the image synthesizing means is preferably parallel light relative to the optical axis of the lens in the paraxial region of the lens. In a case of using a lens having a high F-number, it is necessary to reduce the divergence angle (directivity half-value angle) of the light emitted from the light-emitting element; for this reason, the microlens member is provided on the light emission side of the light-emitting element, and the resonator structure is optimized. In particular, the light emitted from a peripheral part of the panel is incident on a peripheral part of the lens, and thus providing the microlens member makes it possible to achieve such optimization of the incidence on the lens configuring the projection lens system of the light. That is, the use of the light-emitting element of Example 1 makes it possible to use a lens having a high F-number or a high depth of field (DOF). In addition, even in a case where dispersion occurs in values of $OL_1$ and $OL_2$ in the resonator structure at the time of manufacturing the light-emitting element, providing the microlens member makes it possible to suppress influences caused by the dispersion in the resonator structure.

In addition, in a case where the microlens member is configured by a plano-convex lens, for example, providing a plurality of microlens members in one light-emitting section makes it possible to reduce an area of a bottom surface of the plano-convex lens, thus making it possible to increase a height of a top surface of the convex lens surface from the bottom surface of the plano-convex lens, and thus to reduce a curvature radius of the convex lens surface. Therefore, it is possible to easily optimize the optical power of the microlens member. In addition, providing a plurality of light-emitting regions in one light-emitting section makes it possible to reduce the amount of light traveling upward from the outer edge part of the light-emitting section, thus making it possible to achieve an increase in the luminous efficiency of the light-emitting section as a whole. In addition, when the luminous efficiency is increased, driving the light-emitting element at a lower current value also achieves higher luminance; consequently, it is possible to achieve longer lifetime of the light-emitting element.

Figure 3A:
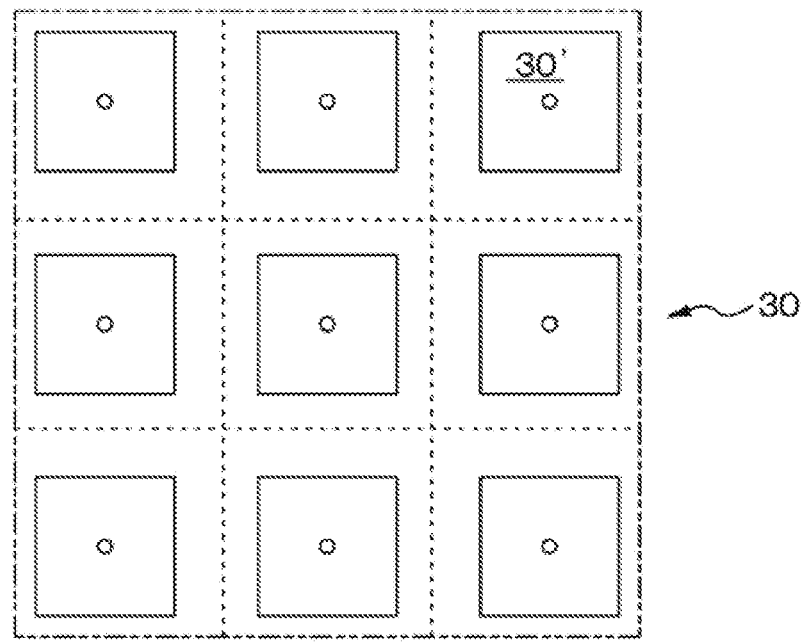
FIGS. 3A and 3B are, respectively, a schematic plan view of a light-emitting section including a plurality of light-emitting regions in one light-emitting element, and a schematic plan view of a light-emitting section including a plurality of microlens members, in Modification Example-1 of Example 1.
Figure 3B:
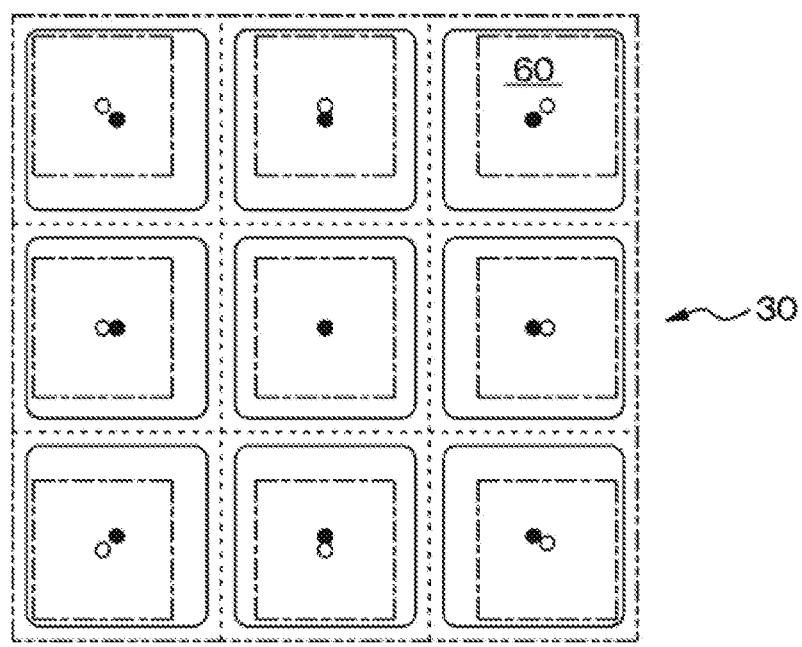
Figure 4A:
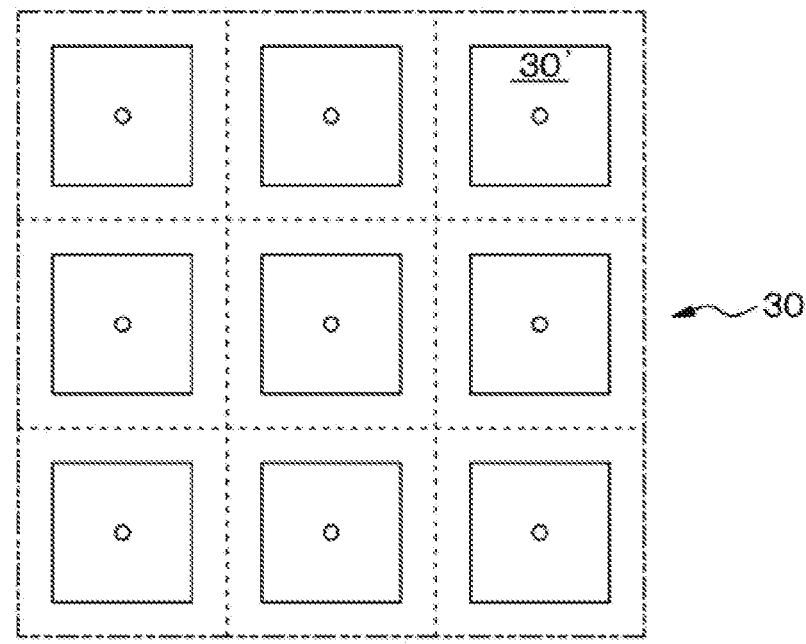
FIGS. 4A and 4B are, respectively, a schematic plan view of a light-emitting section including a plurality of light-emitting regions in one light-emitting element, and a schematic plan view of a light-emitting section including a plurality of microlens members, in Modification Example-2 of Example 1.
Figure 4B:
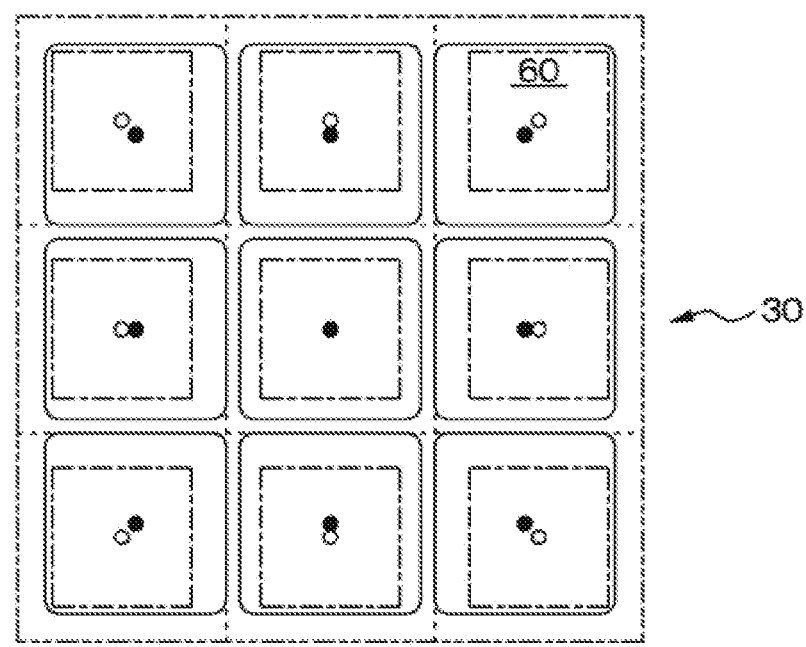

In Modification Example-1 and Modification Example-2 of Example 1, FIGS. 3A and 4A each illustrate a schematic plan view of the light-emitting section 30 including a plurality of (M×N) light-emitting regions 30' in one light-emitting element 10, and FIGS. 3B and 4B each illustrate a schematic plan view of the light-emitting section 30 including a plurality of (P×Q) microlens members 60. In Modification Example-1 of Example 1, the microlens member 60 is positioned at the same position as the microlens member 60 illustrated in FIG. 2B. Meanwhile, the light-emitting region 30' is positioned toward the outside of the light-emitting section 30 as compared with the light-emitting region 30' in the light-emitting element 10 illustrated in FIG. 2A. In this manner, in Modification Example-1 of Example 1, the optical axis of the microlens member 60 is not positioned on the center line passing through the center of the light-emitting region 30', thereby making it possible to set, as a desired direction, a direction in which light emitted from one light-emitting section 30 travels. In addition, in Modification Example-2 of Example 1, the light-emitting region 30' is positioned at the same position as the light-emitting region 30' illustrated in FIG. 2A. Meanwhile, the microlens member 60 is positioned toward the outside of the light-emitting section 30 as compared with the microlens member 60 in the light-emitting element 10 illustrated in FIG. 2B. In this manner, also in Modification Example-2 of Example 1, the optical axis of the microlens member 60 is not positioned on the center line passing through the center of the light-emitting region 30', thereby making it possible to set, as a desired direction, a direction in which light emitted from one light-emitting section 30 travels. In these Modification Example-1 and Modification Example-2, in one light-emitting section 30, light emitted from the light-emitting region 30' positioned at the periphery is collected toward an upper position of the light-emitting region 30' positioned at the middle.

Figure 5A:
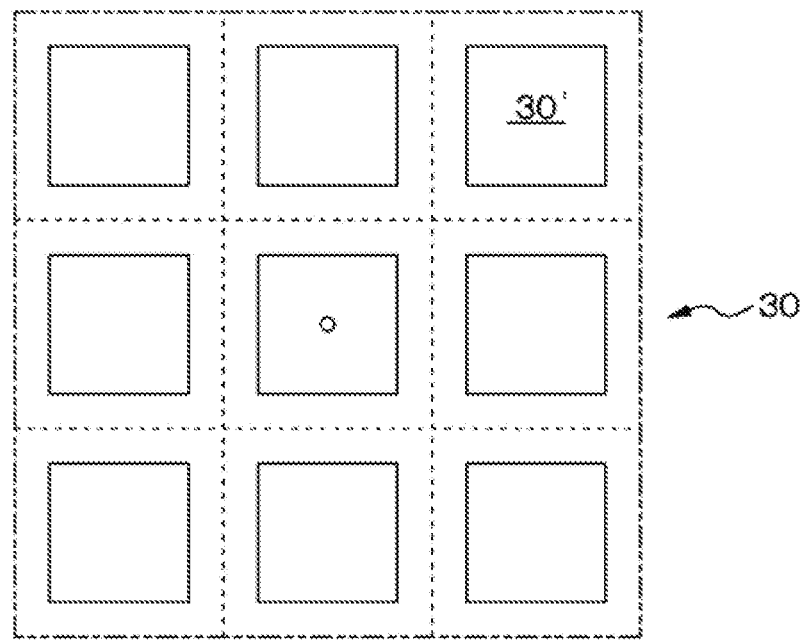
FIGS. 5A and 5B are, respectively, a schematic plan view of a light-emitting section including a plurality of light-emitting regions in one light-emitting element, and a schematic plan view of a light-emitting section including a plurality of microlens members, in Modification Example-3 of Example 1.
Figure 5B:
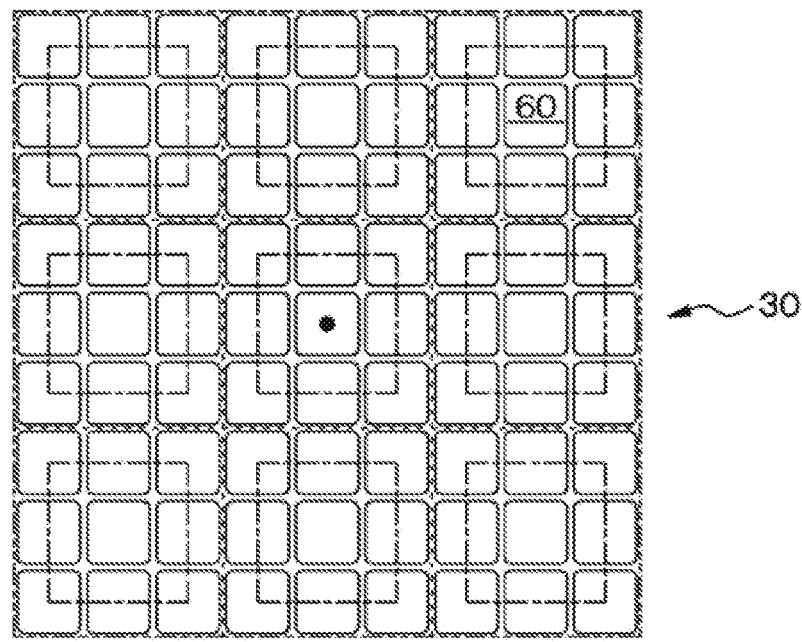

In Modification Example-3 of Example 1, FIG. 5A illustrates a schematic plan view of the light-emitting section 30 including the plurality of (M×N) light-emitting regions 30' in one light-emitting element 10, and FIG. 5B illustrates a schematic plan view of the light-emitting section 30 including the plurality of (P×Q) microlens members 60. In this Modification Example-3, M=N=3, p=q=3, and P=Q=9 hold true in P=p×M and Q=q×N. In this manner, setting the values of p and q to values of two or more, i.e., disposing the plurality of microlens members 60 for the one light-emitting region 30' eliminates the requirement of high accuracy in positioning between the light-emitting region 30' and the microlens member 60. Therefore, it is possible to achieve simplification of the manufacturing steps of the display device, and thus to reduce the manufacturing cost of the display device.

Figure 6A:
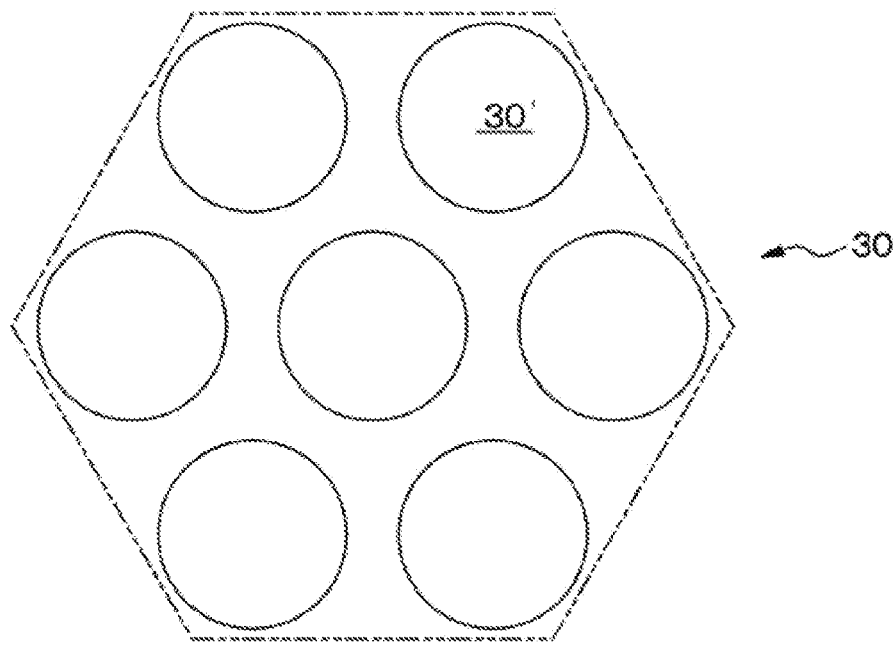
FIGS. 6A and 6B are, respectively, a schematic plan view of a light-emitting section including a plurality of light-emitting regions in one light-emitting element, and a schematic plan view of a light-emitting section including a plurality of microlens members, in Modification Example-4 of Example 1.
Figure 6B:
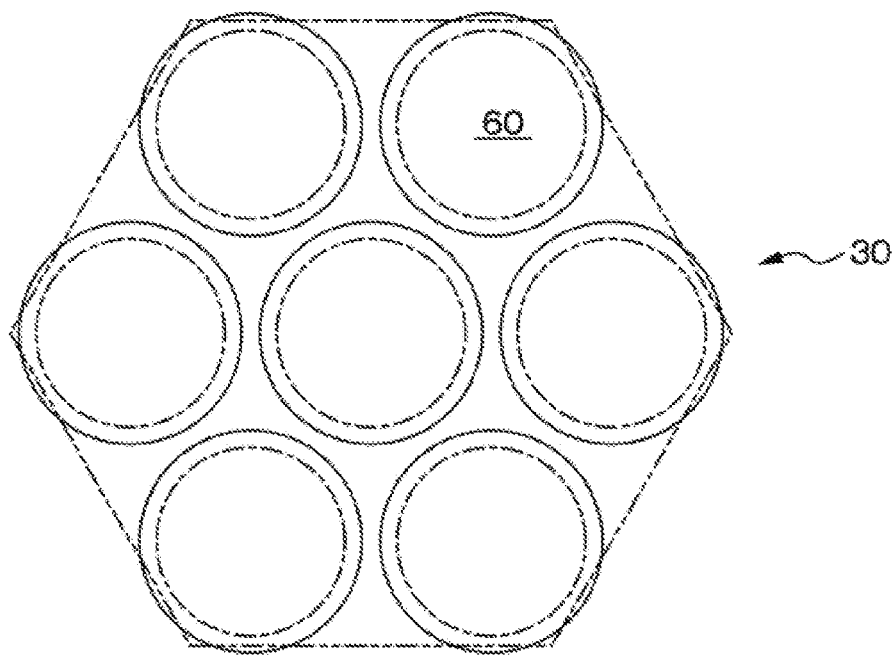

In Modification Example-4 of Example 1, the one light-emitting section 30 has a planar shape of a regular hexagon; six light-emitting regions 30' are provided in the one light-emitting section 30 (see a schematic plan view of FIG. 6A); and six microlens members 60 are provided to face the six light-emitting regions 30' (see a schematic plan view of FIG. 6B).

A mode may also be adopted in which the microlens member 60 has negative optical power; this makes it possible to provide a wide-angle display device. Alternatively, a configuration may also be adopted in which reversing the arrangement of the microlens member 60 and the light-emitting region 30' with respect to those of Modification Example-1 and Modification Example-2 allows the light emitted from the light-emitting region 30' to diverge in a direction away from the upper position of the light-emitting region 30' positioned at the middle in the one light-emitting section 30.

Figure 10:
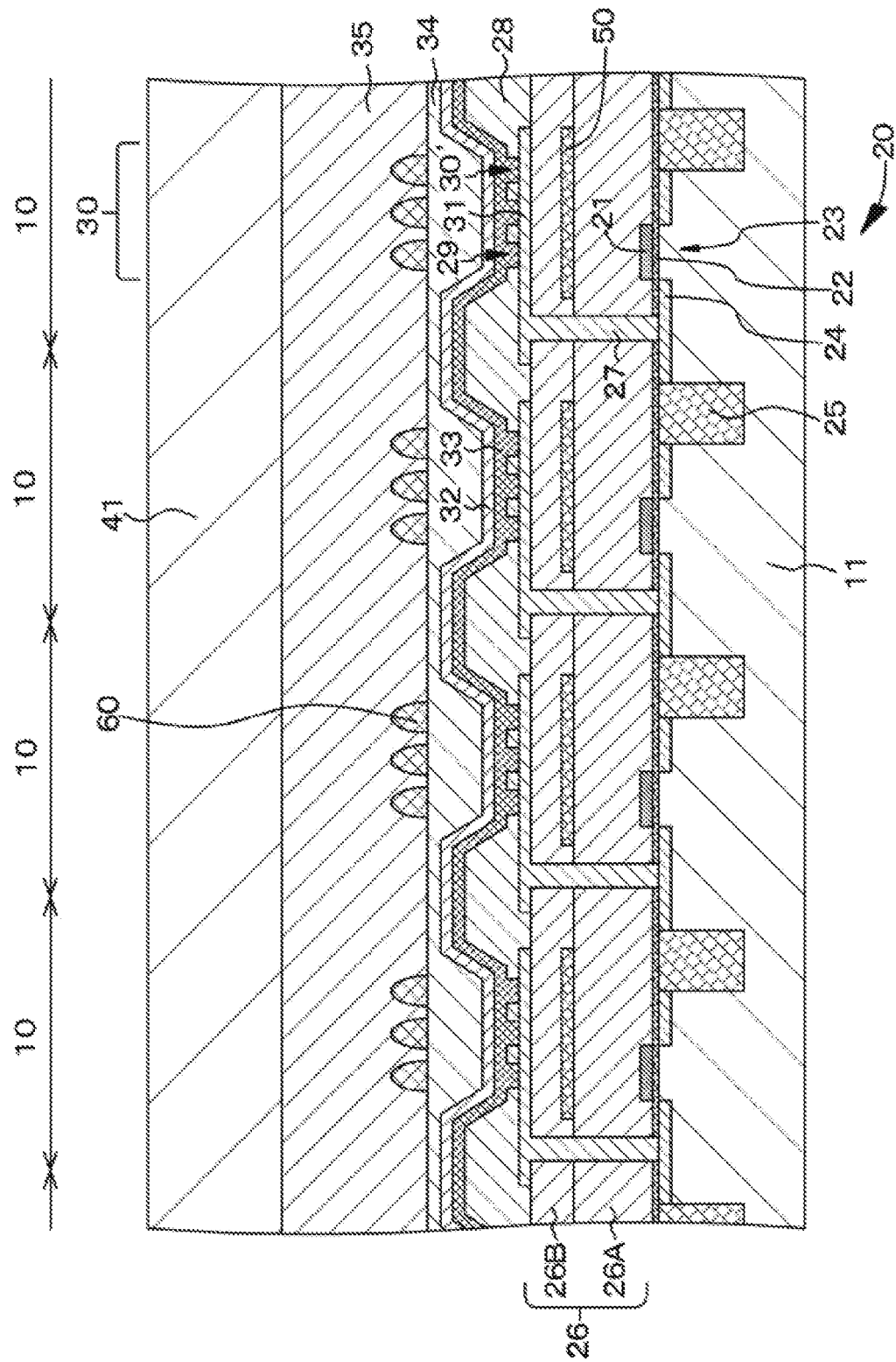
FIG. 10 is a schematic partial cross-sectional view of Modification Example-5 of the light-emitting element of Example 1 and the panel configuring the projection display device of Example 1.

FIG. 10 illustrates a schematic partial cross-sectional view of Modification Example-5 of the light-emitting element 10 of Example 1 and the panel configuring the projection display device of Example 1. In the light-emitting element 10 of Example 1 illustrated in FIG. 1, the light reflective layer 50 is coupled to the contact hole (contact plug) 27, whereas, in the light-emitting element 10 of this Modification Example-5, the light reflective layer 50 is not coupled to the contact hole (contact plug) 27.

Figure 11:
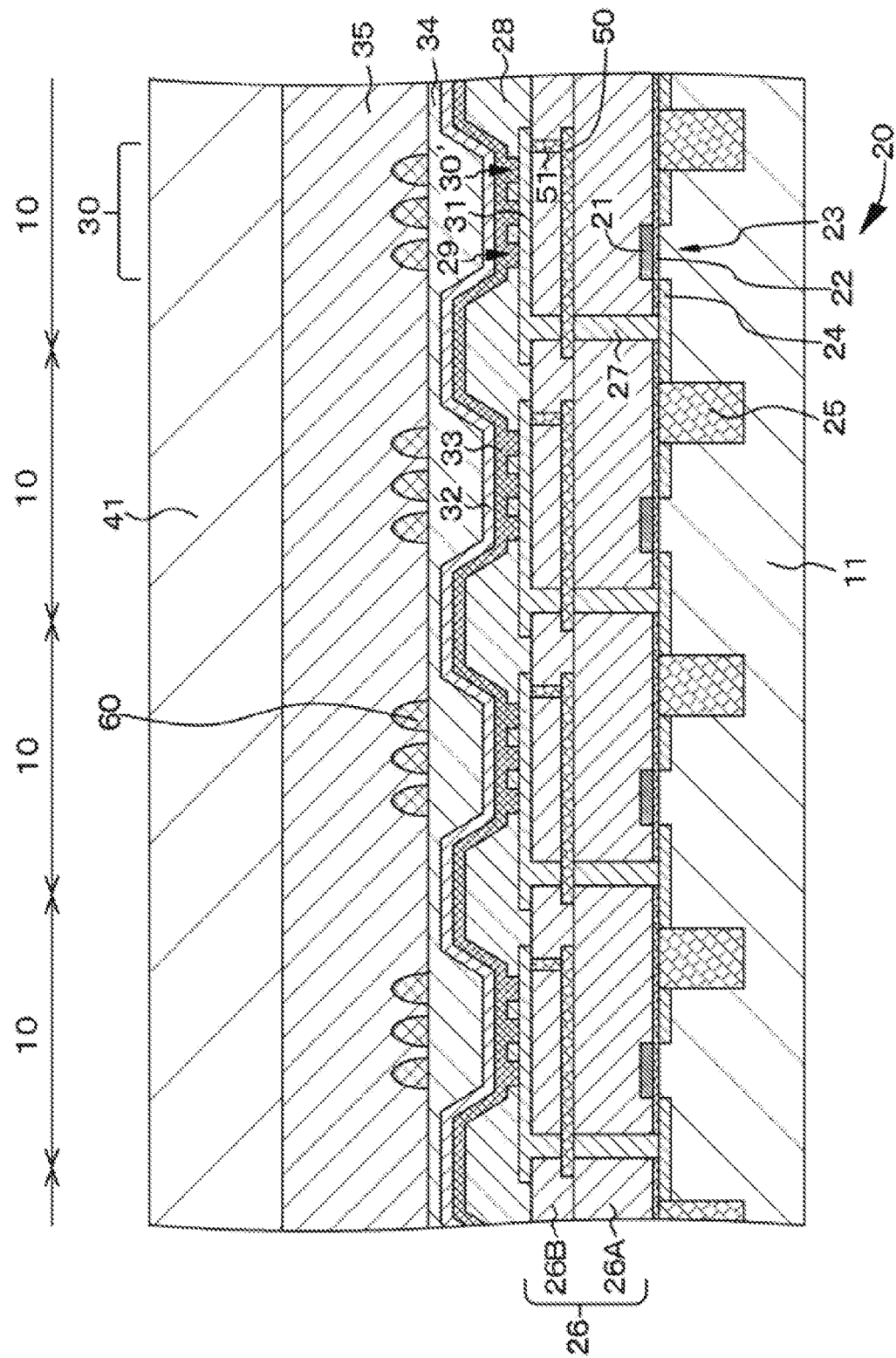
FIG. 11 is a schematic partial cross-sectional view of Modification Example-6 of the light-emitting element of Example 1 and the panel configuring the projection display device of Example 1.

FIG. 11 illustrates a schematic partial cross-sectional view of Modification Example-6 of the light-emitting element 10 of Example 1 and the panel configuring the projection display device of Example 1. In this Modification Example-6, the first electrode 31 and the light reflective layer 50 are surrounded by a light-blocking section or a light reflective section (reflector section). Between the light-emitting elements 10, a light-blocking section 51 is provided, or a light reflective section 51 is provided. The light-blocking section 51 or the light reflective section 51 is coupled to the light reflective layer 50 and the first electrode 31.

Figure 12:
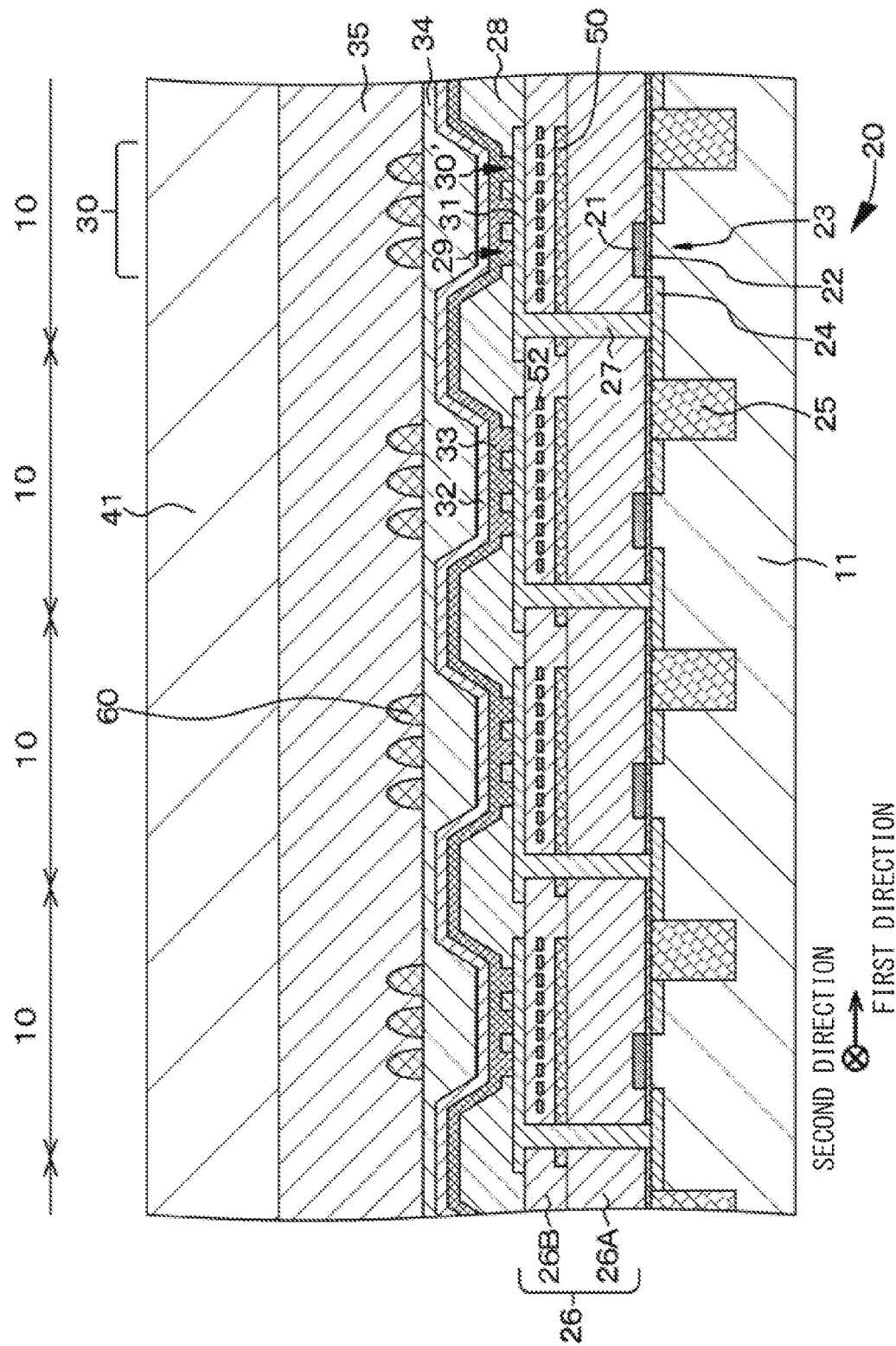
FIG. 12 is a schematic partial cross-sectional view of Modification Example-7 of the light-emitting element of Example 1 and the panel configuring the projection display device of Example 1.
Figure 13:
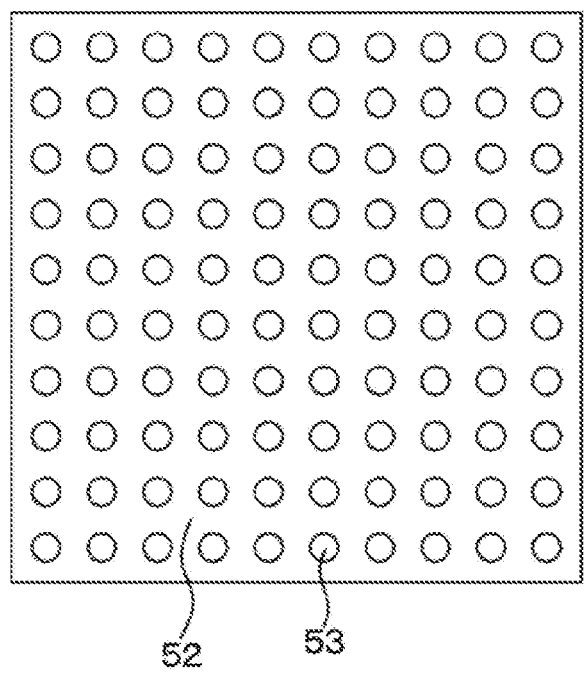
FIG. 13 is a plan view schematically illustrating a metal thin film filter layer in the light-emitting element of Example 1 and the panel configuring the projection display device of Example 1 illustrated in FIG. 12.

FIG. 12 illustrates a schematic partial cross-sectional view of Modification Example-7 of the light-emitting element 10 of Example 1 and the panel configuring the projection display device of Example 1, and FIG. 13 illustrates a plan view schematically illustrating a metal thin film filter layer in the light-emitting element 10 of Example 1 and the panel configuring the projection display device of Example 1. In this Modification Example-7, a metal thin film filter layer 52 is further formed between the first electrode 31 and the light reflective layer 50. The metal thin film filter layer 52 is configured by, for example, a gold (Au) thin film or a silver (Ag) thin film, and a large number of voids 53 of about 200 nm are formed in the thin film, and are arranged two-dimensionally.

Figure 14:
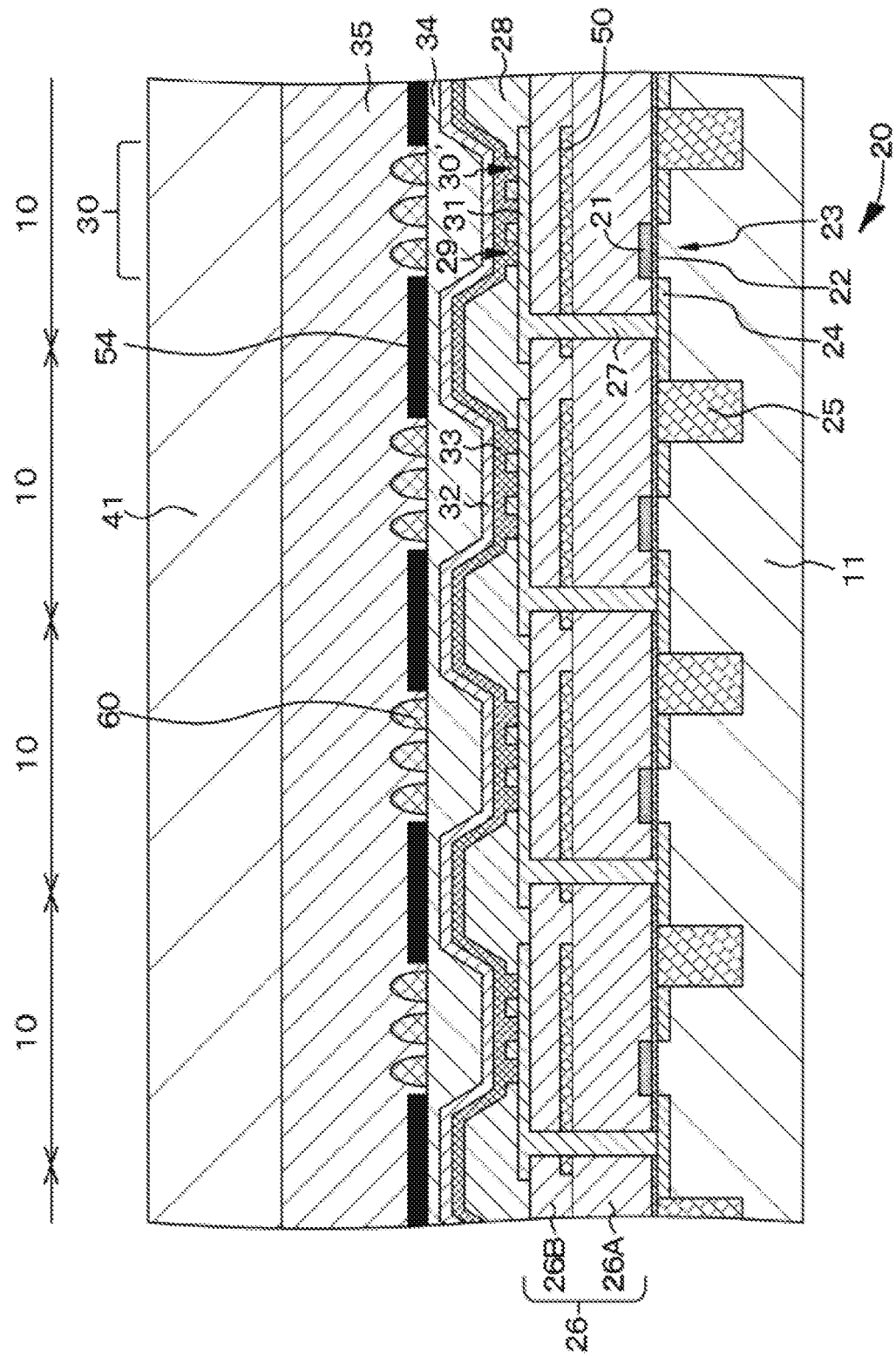
FIG. 14 is a schematic partial cross-sectional view of Modification Example-8 of the light-emitting element of Example 1 and the panel configuring the projection display device of Example 1.

FIG. 14 illustrates a schematic partial cross-sectional view of Modification Example-8 of the light-emitting Element 10 of Example 1 and the panel configuring the projection display device of Example 1. In this Modification Example-8, a light-absorbing layer (black matrix layer) 54 is formed between the microlens members 60 of adjacent light-emitting elements 10. This makes it possible to reliably suppress occurrence of partial overlap of unit pixels.

Figure 15:
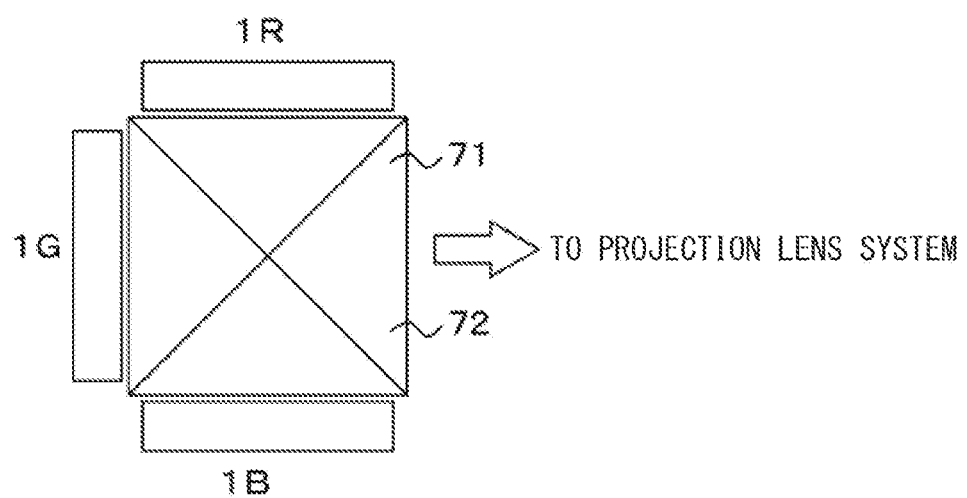
FIG. 15 is a conceptual diagram of Modification Example-9 of the panels configuring the projection display device of Example 1.
Figure 16A:
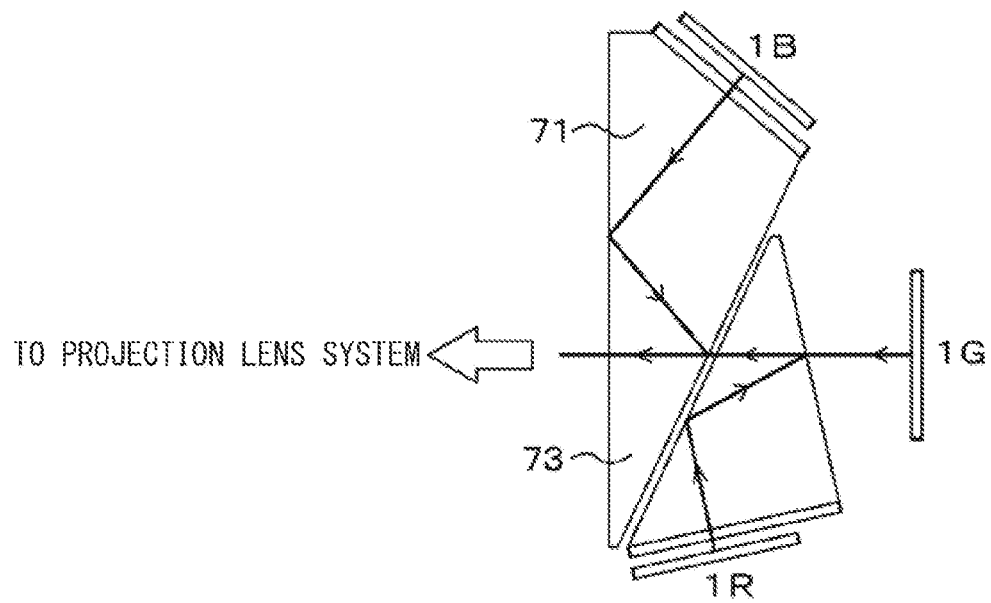
FIGS. 16A and 16B are each a conceptual diagram of Modification Example-10 of the panels configuring the projection display device of Example 1.
Figure 16B:
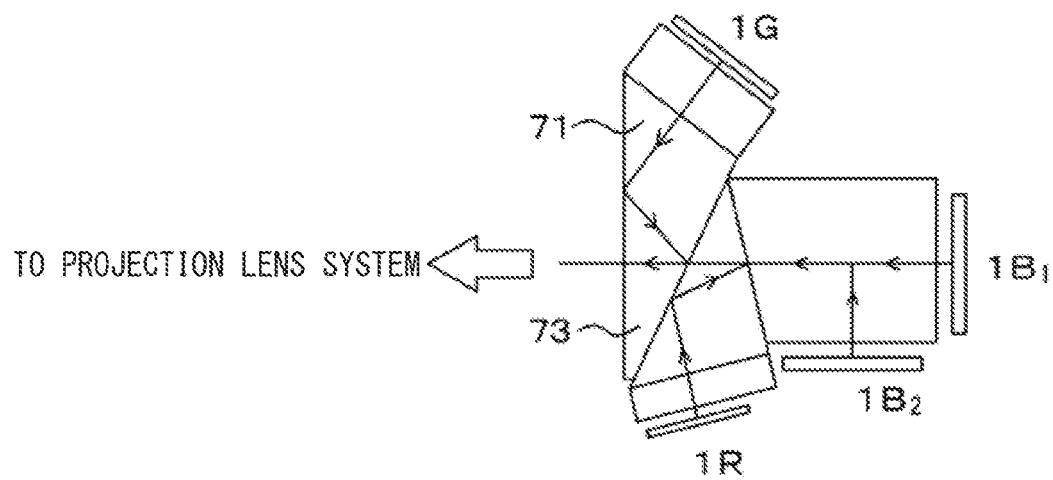

FIG. 15 illustrates a conceptual diagram of Modification Example-9 of the panels configuring the projection display device of Example 1. In this Modification Example-9, there are provided an image synthesizing means 71 (specifically, a non-polarizing dichroic prism 72) that synthesizes images emitted from a plurality of (specifically, three) panels 1R, 1G, and 1B into one image, and a projection lens system 70 on light emission side of the image synthesizing means 71. Alternatively, FIGS. 16A and 16B each illustrate a conceptual diagram of Modification Example-10 of the panels configuring the projection display device of Example 1. In this Modification Example-10, there are provided the image synthesizing means 71 (specifically, a Philips prism 73) that synthesizes images emitted from the plurality of (specifically, three or four) panels 1R, 1G, and 1B (see FIG. 16A) or panels 1R, 1G, 1B$_1$, and 1B$_2$ (see FIG. 16B) into one image, and the projection lens system 70 on the light emission side of the image synthesizing means 71. Although the Phillips prism 73 includes an air gap between two prisms, there may also be gapless one with no air gap. Here, the light incident on the image synthesizing means 71 is preferably parallel light; this enables bright light to be incident on the image synthesizing means 71 and to group three or four panels into one module.

Figure 17:
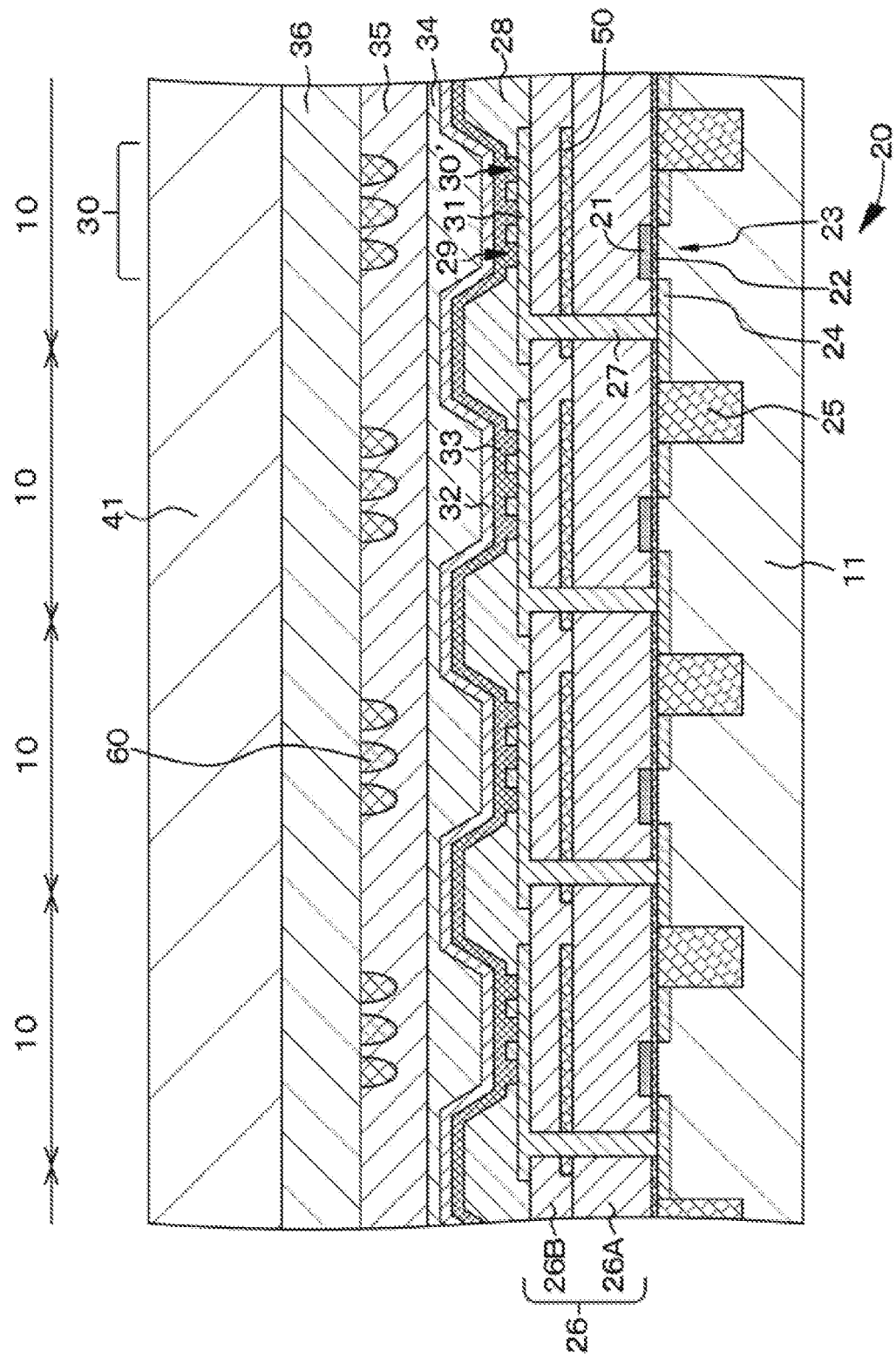
FIG. 17 is a schematic partial cross-sectional view of Modification Example-11 of the light-emitting element of Example 1 and the panel configuring the projection display device of Example 1.

FIG. 17 is a schematic partial cross-sectional view of Modification Example-11 of the light-emitting element 10 of Example 1 and the panel configuring the projection display device of Example 1. In the example illustrated in FIG. 1, the microlens member 60 is one type of aspherical lens, is configured by a plano-convex lens, and has a convex surface in a direction away from the light-emitting region 30'. Meanwhile, in Modification Example-11 illustrated in FIG. 17, the microlens member 60 is one type of aspherical lens, is configured by a plano-convex lens, but has a convex surface in a direction toward the light-emitting region 30'. Specifically, an underlayer 36 is formed on an inner surface of the second substrate 41, and the microlens member 60 is formed on the underlayer 36. The microlens member 60, the underlayer 36, and the protective layer 34 are attached together by the sealing resin layer 35.

Figure 18:
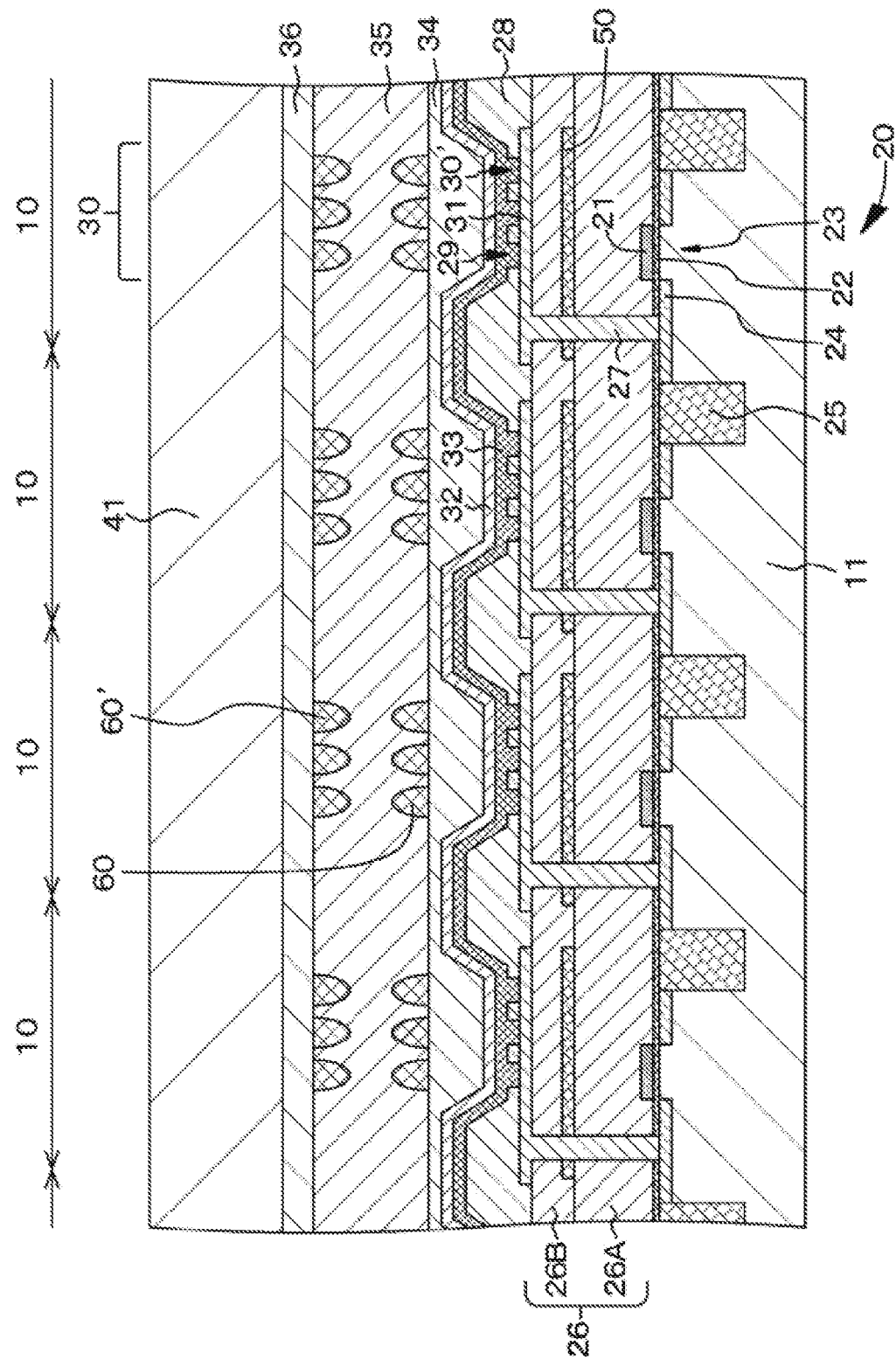
FIG. 18 is a schematic partial cross-sectional view of Modification Example-12 of the light-emitting element of Example 1 and the panel configuring the projection display device of Example 1.

A second microlens member 60', which controls a traveling direction of light emitted from the microlens member 60, may be disposed above the microlens member 60. The second microlens member 60' may be provided to face the microlens member 60; that is, P×Q second microlens members 60' may be disposed with respect to P×Q microlens members 60, or one second microlens member 60' may be disposed with respect to the P×Q microlens members 60. Specifically, FIG. 18 illustrates a combination of the examples illustrated in FIGS. 1 and 17, as a conceptual diagram of Modification Example-12 of the panel configuring the projection display device of Example 1.

Example 2

Figure 21A:
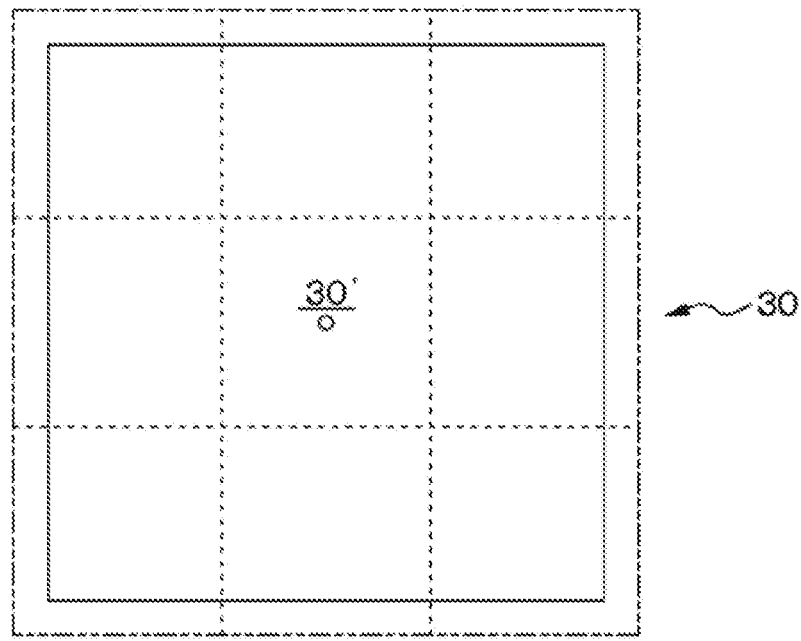
FIGS. 21A and 21B are, respectively, a schematic plan view of a light-emitting section including one light-emitting region in one light-emitting element, and a schematic plan view of a light-emitting section including a plurality of microlens members, in Example 2.
Figure 21B:
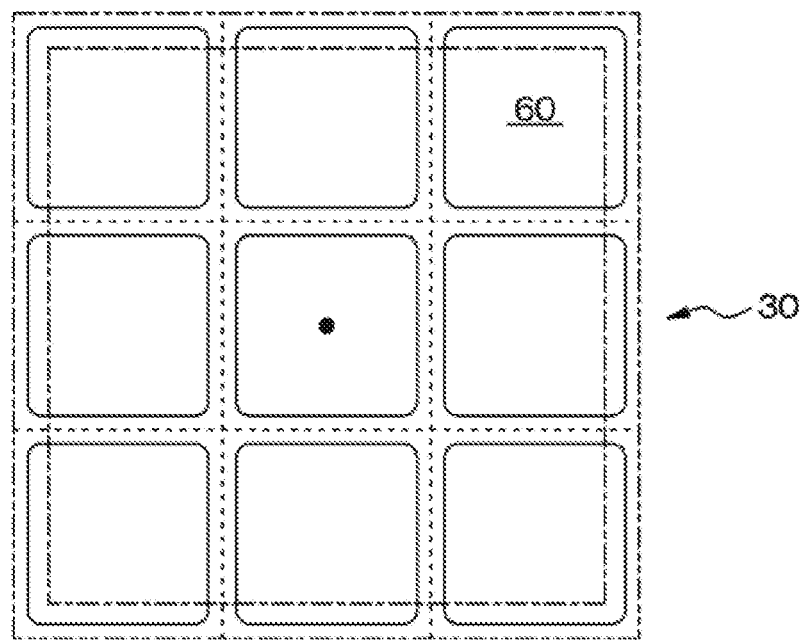

Example 2 relates to a light-emitting element according to the second aspect of the present disclosure, and relates to the light-emitting element of the first embodiment. In Example 2, FIG. 21A illustrates a schematic plan view of a light-emitting section including one light-emitting region in one light-emitting element, and FIG. 21B illustrates a schematic plan view of a light-emitting section including a plurality of (M×N) microlens members.

A light-emitting element of Example 2 includes:
a light-emitting section 30 including one light-emitting region 30'; and
a plurality of microlens members 60 controlling a traveling direction of light emitted from the one light-emitting region 30'. Specifically, the light-emitting element of Example 2 includes:
a light-emitting section 30 including one light-emitting region 30'; and
P×Q (where P and Q stand for integers of one or more, excluding a case of P=1 and Q=1) microlens members 60 controlling a traveling direction of light emitted from the one light-emitting region 30'.

In this manner, in the light-emitting element of Example 2, the plurality of microlens members are provided in the light-emitting section, thus making it possible to easily and reliably perform precise and fine control of a direction of the light (control of a light beam angle) emitted from the light-emitting element as well as control of light parallelism (control of light beam divergence angle) and to achieve high luminance. Therefore, it is possible to provide a high-luminance display device that makes it possible to form an image by the light-emitting element of self-luminous type.

It is to be noted that, a mode may be adopted in which, in a case where the optical axis of the microlens member 60 is positioned on the center line passing through the center of the light-emitting region 30', an orthogonal projection image of the one light-emitting region 30' is included within the orthogonal projection image of the entire P×Q microlens members 60.

Except for the above points, the configurations and structures of the light-emitting element and the display device of Example 2 may be substantially the same as the configurations and structures of the light-emitting element and the display device of Example 1, and therefore detailed descriptions thereof are omitted.

Example 3

Figure 22A:
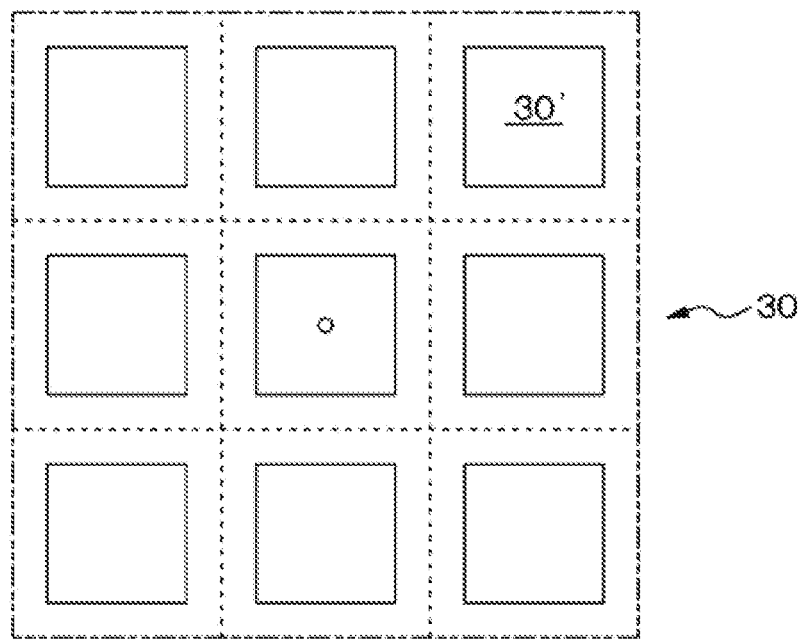
FIGS. 22A and 22B are, respectively, a schematic plan view of a light-emitting section including a plurality of light-emitting regions in one light-emitting element, and a schematic plan view of a light-emitting section including one microlens member, in Example 3.
Figure 22B:
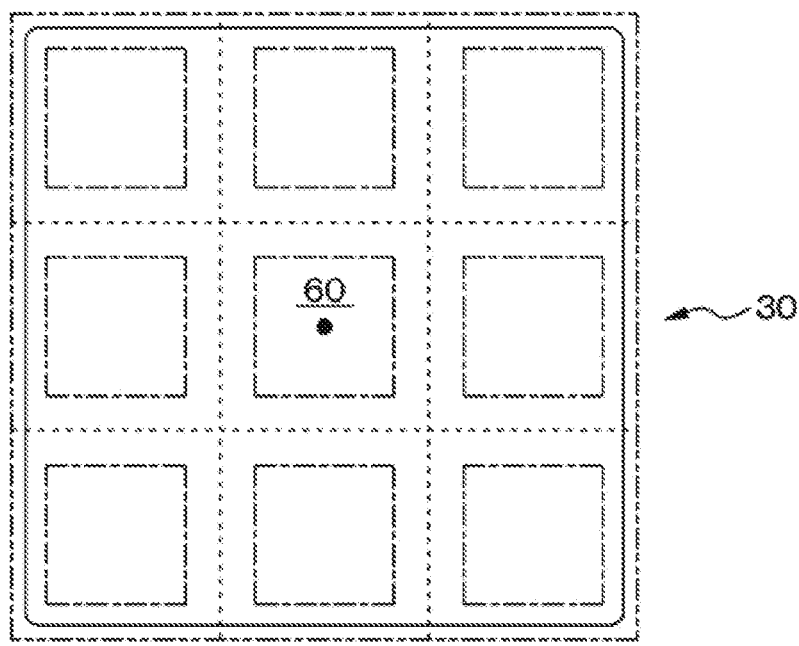

Example 3 relates to a light-emitting element according to the third aspect of the present disclosure, and relates to the light-emitting element of the first embodiment. In Example 3, FIG. 22A illustrates a schematic plan view of a light-emitting section including a plurality of (M×N) light-emitting regions in one light-emitting element, and FIG. 22B illustrates a schematic plan view of a light-emitting section including one or a plurality of (P×Q) microlens members.

A light-emitting element of Example 3 includes:
- a light-emitting section 30 including a plurality of light-emitting regions 30'; and
- one or a plurality of microlens members 60 (one microlens member 60 in the illustrated example) controlling a traveling direction of each light emitted from the plurality of light-emitting regions 30'. Specifically, the light-emitting element of Example 3 includes:
- the light-emitting section 30 including M×N (where M and N stand for integers of one or more, excluding a case of M=1 and N=1) light-emitting regions 30'; and
- one microlens member 60 controlling a traveling direction of each light emitted from the M×N light-emitting regions 30'.

In this manner, in the light-emitting element 10 of Example 3, the light-emitting section 30 includes the plurality of light-emitting regions, thus making it possible to easily and reliably perform precise and fine control of a direction of the light (control of a light beam angle) emitted from the light-emitting element as well as control of light parallelism (control of light beam divergence angle) and to achieve high luminance. Therefore, it is possible to provide a high-luminance display device that makes it possible to form an image by the light-emitting element of self-luminous type.

It is to be noted that, a mode may be adopted in which, in a case where the optical axis of the microlens member 60 is positioned on the center line passing through the center of the light-emitting region 30', an orthogonal projection image of the M×N light-emitting regions 30' is included within the orthogonal projection image of the one microlens member 60.

Except for the above points, the configurations and structures of the light-emitting element and the display device of Example 3 may be substantially the same as the configurations and structures of the light-emitting element and the display device of Example 1, and therefore detailed descriptions thereof are omitted.

Figure 23A:
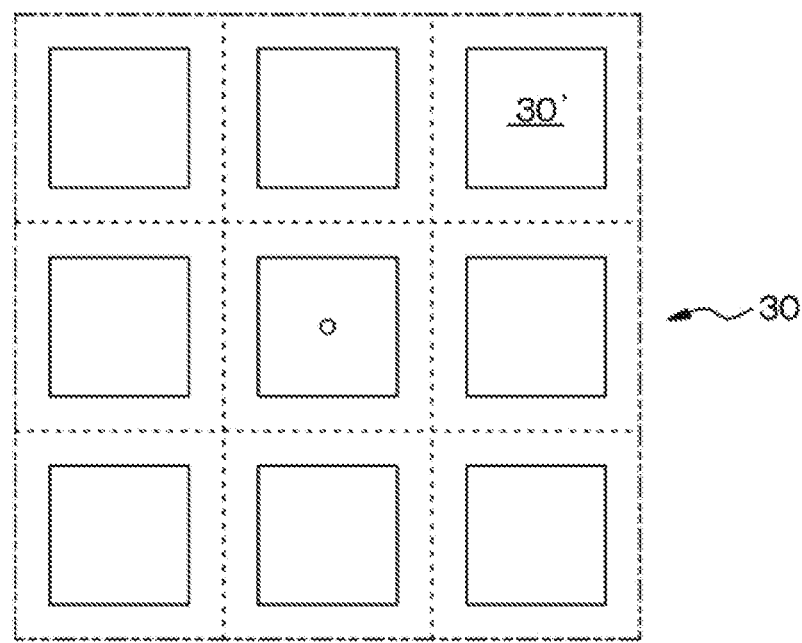
FIGS. 23A and 23B are, respectively, a schematic plan view of a light-emitting section including a plurality of light-emitting regions in one light-emitting element, and a schematic plan view of a light-emitting section including three microlens members, in Modification Example-1 of Example 3.
Figure 23B:
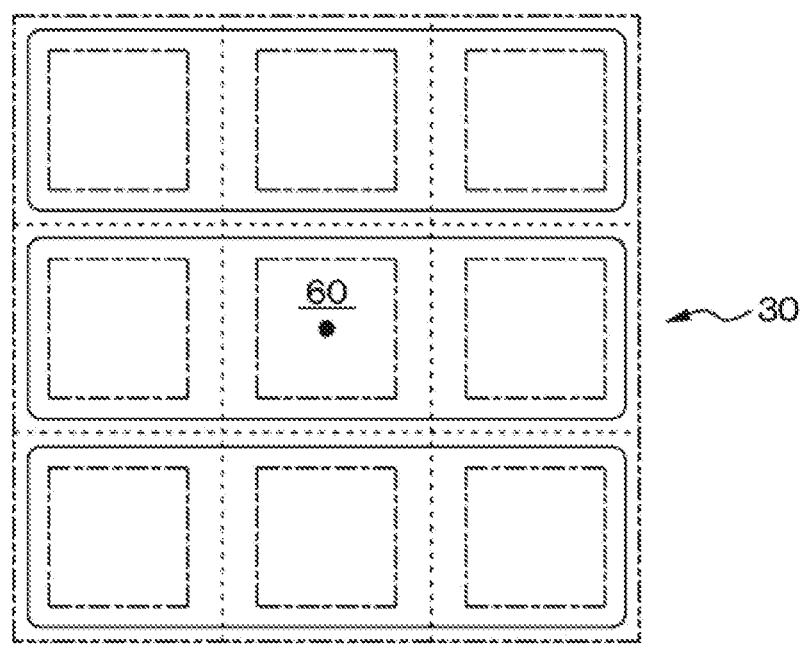

In Modification Example-1 of Example 3, FIG. 23A illustrates a schematic plan view of the light-emitting section 30 including the plurality of (M×N) light-emitting regions 30' in one light-emitting element, and FIG. 23B illustrates a schematic plan view of the light-emitting section 30 including three microlens members 60. In this Modification Example-1 of Example 3, there are provided:
- the light-emitting section 30 including a plurality of light-emitting regions 30'; and
- one or a plurality of microlens members 60 (three microlens members 60 in the illustrated example) controlling a traveling direction of each light emitted from the plurality of light-emitting regions 30'. That is, the number of the plurality of microlens members 60 may be P'×Q' (where P'=M/p' and Q'=N/q' hold true, and p' and q' stand for integers of one or more). Here, M=N=3, P'=1, p'=3, Q'=3, and q'=1 hold true.

Example 4

Figure 24:
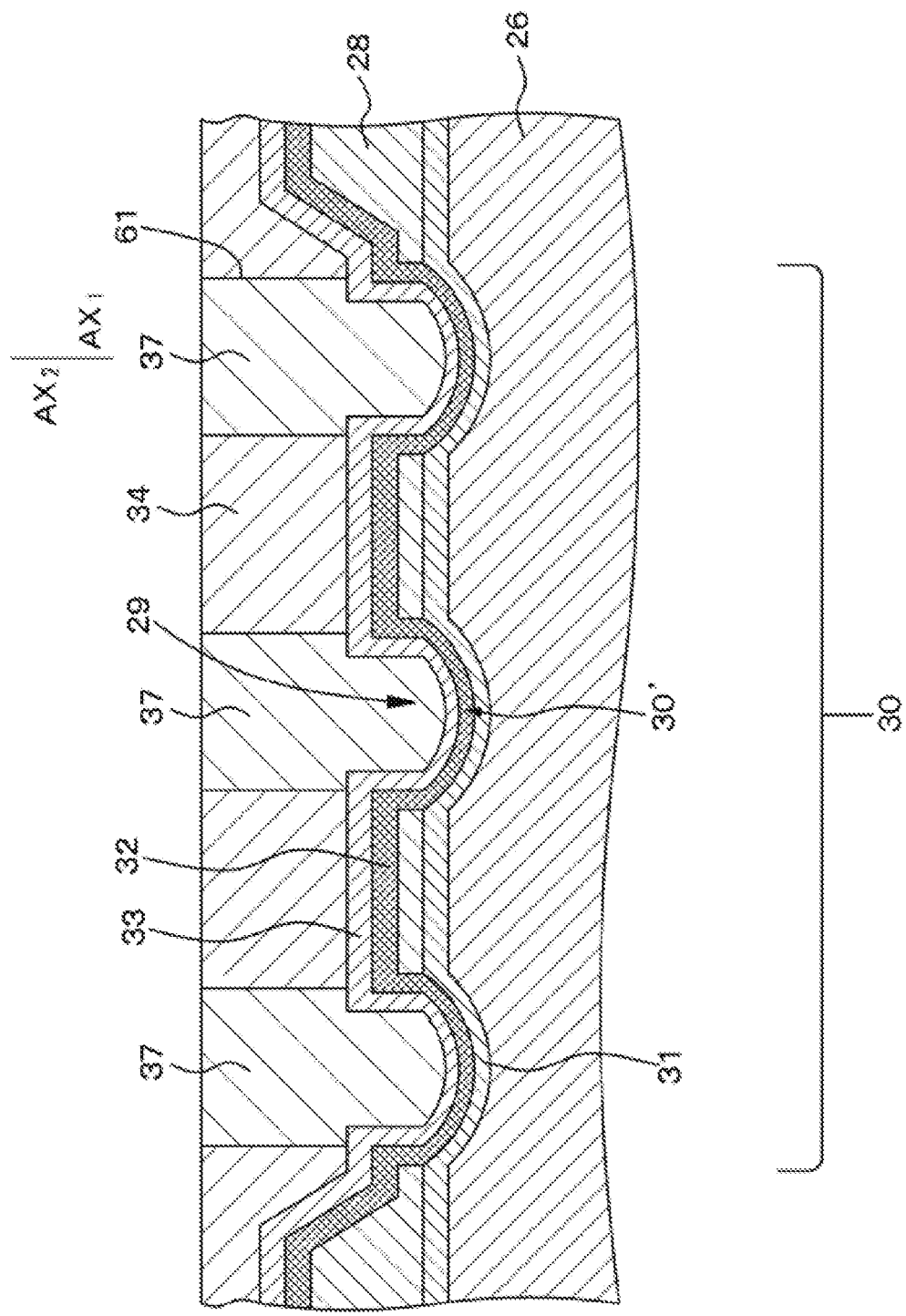
FIG. 24 is a schematic partial cross-sectional view of one light-emitting section in a panel configuring a light-emitting element of Example 4 and a projection display device of Example 4.

Example 4 relates to a light-emitting element according to the fourth aspect of the present disclosure, and relates to the light-emitting element of the first embodiment. FIG. 24 illustrates a schematic partial cross-sectional view of one light-emitting section in the light-emitting element of Example 4 and the panel configuring the projection display device of Example 4.

A light-emitting element of Example 4 includes:
- a light-emitting section 30 including a plurality of light-emitting regions 30'; and
- a light-guiding section 61 controlling a traveling direction of light emitted from each of the light-emitting regions 30', and
- the light-emitting region 30' has a convex shape in a direction away from the light-guiding section 61. Specifically, the light-emitting element of Example 4 includes:
- the light-emitting section 30 including M×N (where M and N stand for integers of one or more, excluding a case of M=1 and N=1) light-emitting regions 30'; and
- the light-guiding section 61 controlling a traveling direction of light emitted from each of the light-emitting regions 30', and the light-emitting region 30' has a convex shape in a direction away from the light-guiding section 61.

Specifically, one light-guiding section 61 is provided for the one light-emitting region 30'. In the illustrated example, M=N=3 holds true. The value of a refractive index of a material configuring the second electrode 32 is higher than the value of a refractive index of a material 37 filling the interior (inside) of the light-guiding section 61. Therefore, the light-emitting region 30' has positive optical power. In addition, the value of the refractive index of the material 37 filling the interior (inside) of the light-guiding section 61 is higher than the value of a refractive index of the protective layer 34 surrounding the light-guiding section 61. Therefore, at least a portion of the light emitted from the light-emitting region 30' is reflected at the light-guiding section 61. The material 37 and the protective layer 34 are attached to the second substrate 41 (unillustrated) via the sealing resin layer 35 (unillustrated). In addition, an orthogonal projection image of the light-emitting region 30' is included within an orthogonal projection image at the bottom portion of the light-guiding section 61. Further, an axis line $AX_2$ at the bottom portion of the light-guiding section 61 is positioned on a center line $AX_1$ passing through the center of the light-emitting region 30'. The inner surface of the light-guiding section 61 (a surface of the light-guiding section 61 with which the light emitted from the light-emitting region 30' collides) at the time when being cut by a virtual plane orthogonal to a normal direction of the light-emitting region 30' may be parallel to the normal direction of the light-emitting region 30', or may be non-parallel. In the illustrated example, the inner surface of the light-guiding section 61 is parallel to the normal direction. However, this is not limitative; the inner surface of the light-guiding section 61 may have a forward tapered shape (a shape expanding toward the second substrate 41), or may be a reverse tapered shape (a shape diminishing toward the second substrate 41) with respect to the light-emitting region 30'. However, from the viewpoint of light condensing, the reverse tapered shape (the shape diminishing toward the second substrate 41) is preferable.

In this manner, in the light-emitting element of Example 4, the light-emitting section includes a plurality of light-emitting regions, and the light-guiding section 61 is provided to correspond to each of the light-emitting regions 30'. This makes it possible to easily and reliably perform precise and fine control of a direction of the light (control of a light beam angle) emitted from the light-emitting element as well as control of light parallelism (control of light beam divergence angle) and to achieve high luminance. Therefore, it is possible to provide a high-luminance display device that makes it possible to form an image by the light-emitting element of self-luminous type.

Except for the above points, the configurations and structures of the light-emitting element and the display device of Example 4 may be substantially the same as the configurations and structures of the light-emitting element and the display device of any of Examples 1 to 3, and therefore detailed descriptions thereof are omitted.

Figure 25:
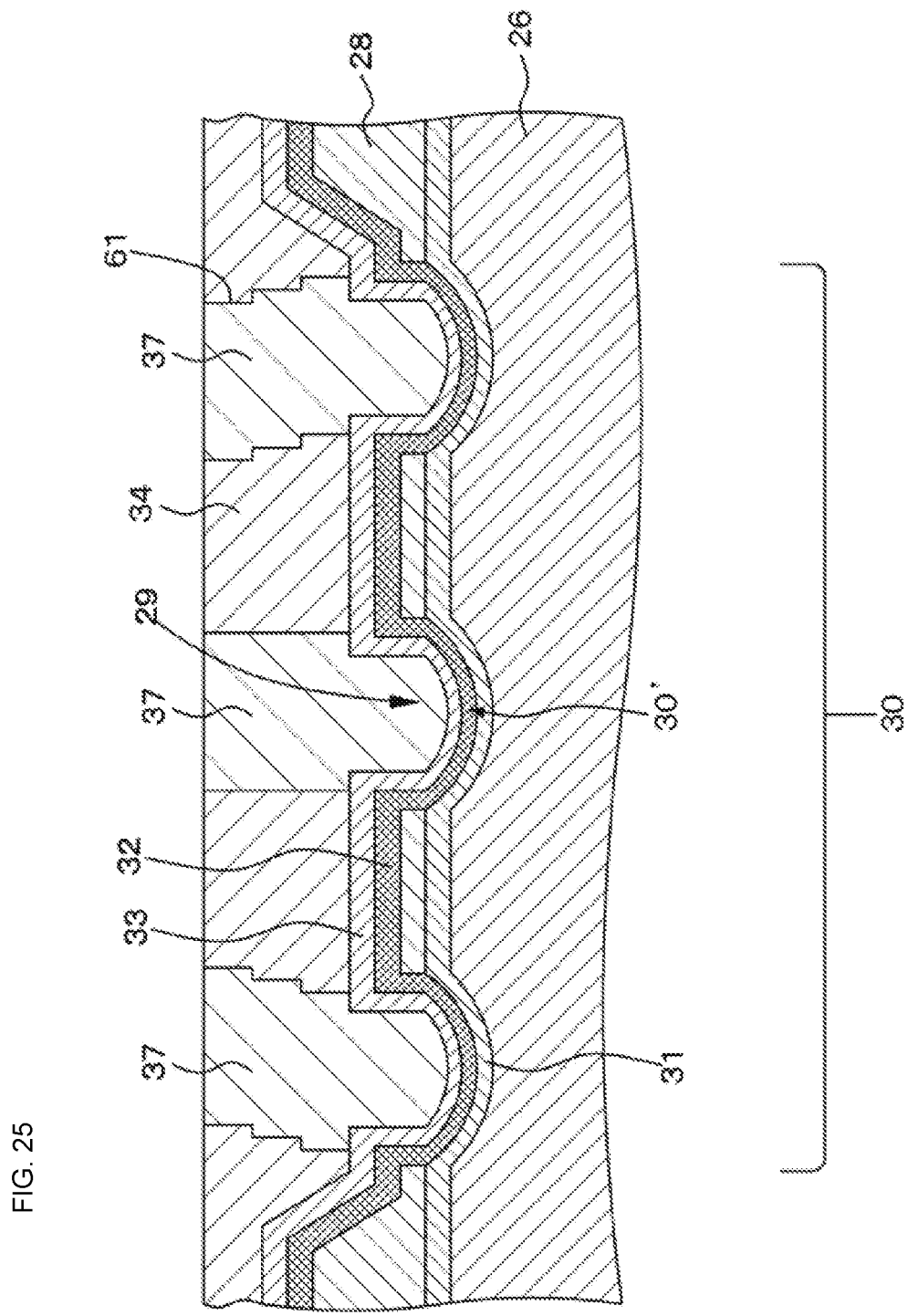
FIG. 25 is a schematic partial cross-sectional view of one light-emitting section in a panel configuring Modification Example-1 of the light-emitting element of Example 4 and the projection display device of Example 4.

FIG. 25 illustrates a schematic partial cross-sectional view of Modification Example-1 of the light-emitting element of Example 4 and the panel configuring the projection display device of Example 4; however, a mode may be adopted in which a plurality of light-guiding sections 61 are configured to be stacked, and axis lines of the plurality of light-guiding sections 61 are not on the same straight line. This makes it possible to control a traveling direction of light emitted from a final stage of the light-guiding section 61.

Figure 26:
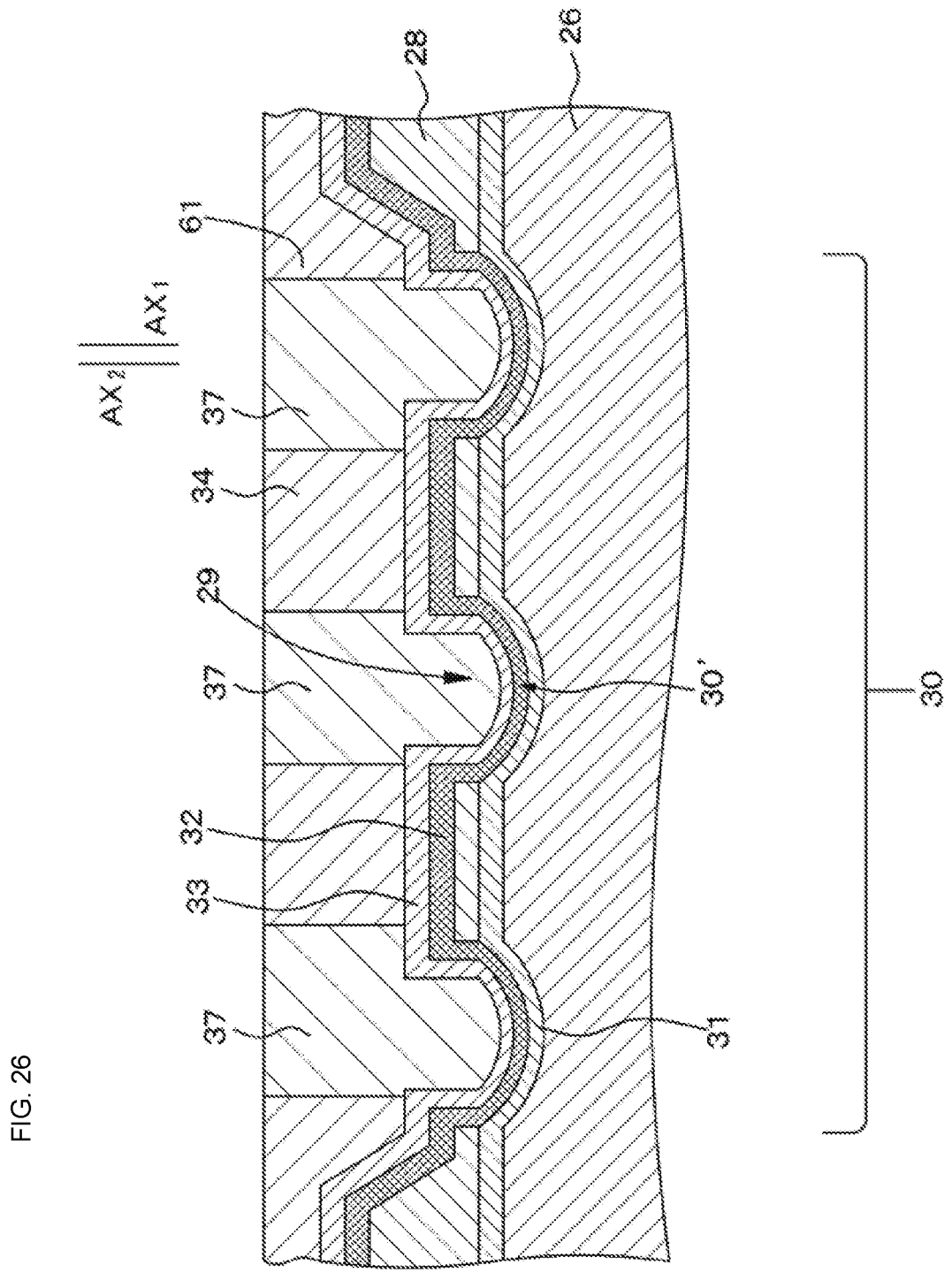
FIG. 26 is a schematic partial cross-sectional view of one light-emitting section in a panel configuring Modification Example-2 of the light-emitting element of Example 4 and the projection display device of Example 4.

In addition, FIG. 26 illustrates a schematic partial cross-sectional view of Modification Example-2 of the light-emitting element of Example 4 and the panel configuring the projection display device of Example 4; however, a mode may also be adopted in which the axis line $AX_2$ of the light-guiding section 61 is not positioned on the center line $AX_1$ passing through the center of the light-emitting region 30'. Specifically, a mode may be adopted in which the plurality of light-emitting regions 30' are regularly arrayed (specifically, e.g., the center of the light-emitting region 30' is disposed on a lattice point of the virtual lattice), and the axis line of the light-guiding section 61 is not positioned on this lattice point. Alternatively, a mode may be adopted in which the plurality of light-emitting regions 30' are not regularly arrayed (specifically, e.g., the center of the light-emitting region 30' is not disposed on a lattice point of the virtual lattice), and the axis line of the light-guiding section 61 is positioned on this lattice point; a combination of these modes may also be adopted.

In addition, in the illustrated example, a mode has been adopted in which the P×Q light-guiding sections 61 are provided for the light-emitting section 30 including the M×N light-emitting regions 30'; however, a mode may also be adopted in which, for example, one light-guiding section 61 is provided for the light-emitting section 30 including the M×N light-emitting regions 30'.

It is to be noted that, the configurations and structures of the light-emitting region 30' in Example 4 described above is applicable to Examples 1 to 3, and disposing the light-guiding section 61 in Example 4 on light emission side of the microlens member 60 in any of Examples 1 to 3 makes it possible to cause the light-guiding section 61 to control a traveling direction of light emitted from the microlens member 60.

Example 5

Figure 20B:
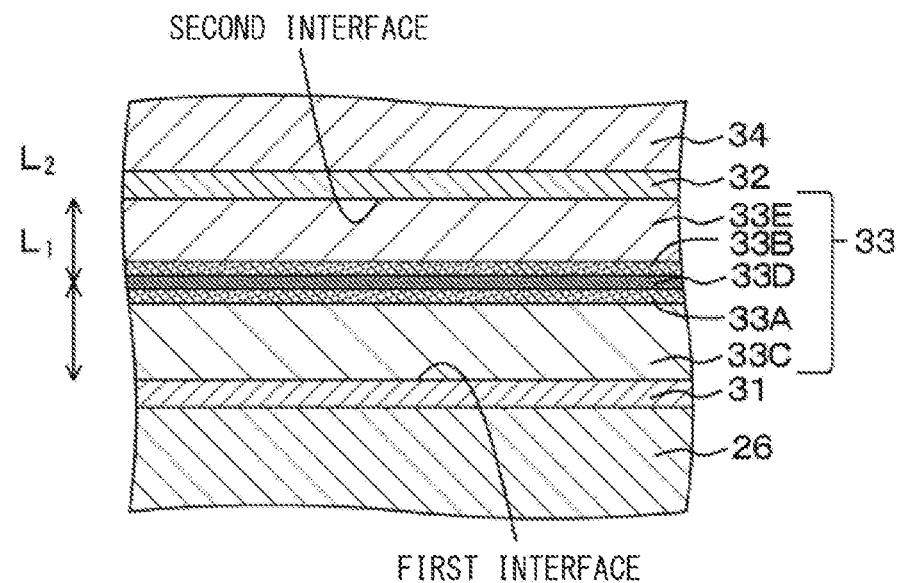
Figure 27:
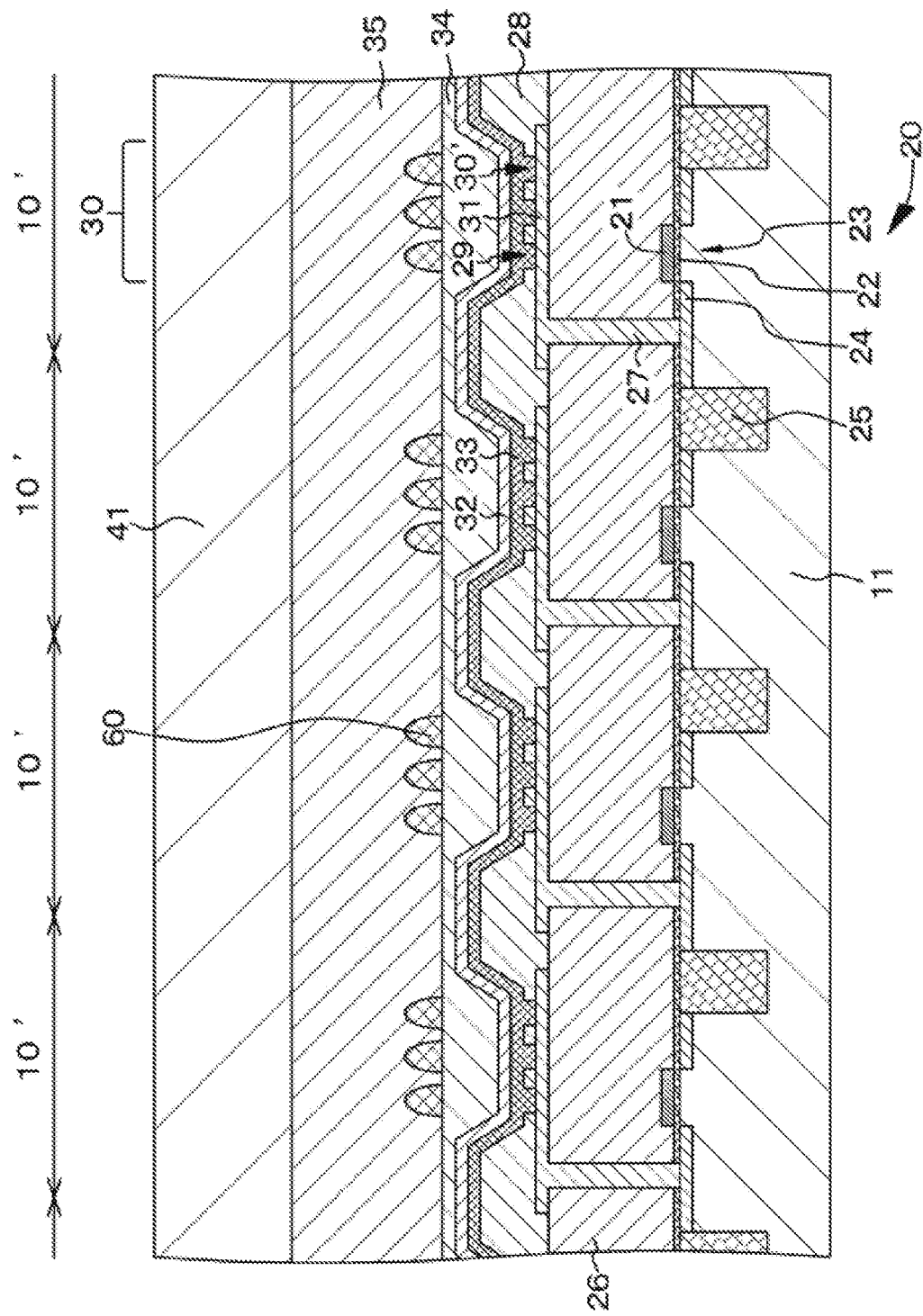
FIG. 27 is a schematic partial cross-sectional view of a light-emitting element of Example 5 and a panel configuring a projection display device of Example 5.

Example 5 relates to the light-emitting element according to any of the first to fourth aspects of the present disclosure, and relates to the light-emitting element of the second aspect. FIG. 20B illustrates a schematic partial cross-sectional view of the light-emitting element of Example 5, and FIG. 27 illustrates a schematic partial cross-sectional view of the light-emitting element of Example 5 and the panel configuring the projection display device of Example 5.

In a light-emitting element 10' of Example 5,
the light-emitting section 30 includes:
the first electrode 31 shared in the light-emitting region 30';
the organic layer 33 formed on the first electrode 31 and including the light-emitting layer 33A including an organic light-emitting material; and
the second electrode 32 formed on the organic layer 33,
the light-emitting layer 33A is formed by stacking a plurality of (specifically, NL=2 layers in Example 5) light-emitting layers 33A and 33B emitting light beams of the same color,
the insulating layer 28 is formed between the first electrode 31 and the organic layer 33, and
the insulating layer 28 is provided with the opening 29 defining the light-emitting region 30'.

In addition, in the display device (e.g., projection display device) of Example 5, the light-emitting layer is formed by stacking the plurality of light-emitting layers 33A and 33B emitting light beams of the same color. It is to be noted that the light-emitting element includes no resonator structure. Except for these points, the configurations and structures of the light-emitting element, the display device, and the projection display device of Example 5 may be substantially the same as the configurations and structures of the light-emitting element, the display device, and the projection display device of any of Examples 1 to 4, and thus detailed descriptions thereof are omitted.

Here, an interlayer (charge-generating layer) 33D including Li, for example, is formed between the light-emitting layer 33A and the light-emitting layer 33B on the basis of the sputtering method. The thickness of the interlayer 33D is, for example, 2 nm to 10 nm. The plurality of light-emitting layers 33A and 33B have the same composition.

The existing organic EL element is of Lambertian radiation. Meanwhile, it is appreciated, in the light-emitting element 10 of Example 5, that the directivity half-value angle $\theta_{half}$ is 25 degrees or less. It is to be noted that the directivity half-value angle of the existing organic EL element in Lambertian radiation is about 70 degrees, as described above. In this manner, it is appreciated that the light emitted from the light-emitting element of Example 5 is light having higher directivity than that of the existing organic EL element, or light close to parallel light.

It is possible, in the light-emitting element of Example 5, to have a smaller θ value than that of the existing organic EL element. Therefore, it is possible to increase a value of electric field intensity Et of light emitted from the second electrode 32. That is, it is possible to achieve an increase in intensity of light from the light-emitting element.

In addition, in the light-emitting element 10 of Example 5, a value of full width at half maximum (FWHM) of the light emitted from the light-emitting element is 30 nm or less. That is, the light-emitting element of Example 5 has a sharper emission spectrum than that of the existing organic EL element.

Moreover, in Example 5, the light-emitting layer is formed by stacking the plurality of light-emitting layers emitting light beams of the same color. Therefore, the panel configured by the light-emitting element including the light-emitting layer formed by stacking the plurality of light-emitting layers emitting light beams of the same color is able to have approximately doubled light intensity as compared with the panel of Example 1 configured by the light-emitting element including a single-layer light-emitting layer. That is, the luminance efficiency of the light-emitting element of Example 5 is about 24 times (=2×12 times) as compared with the luminance efficiency in the existing green light organic EL element.

Example 6

A panel in the projection display device of Example 6 is a combination of the panel in the projection display device of any of Examples 1 to 4 and the panel in the projection display device of Example 5. That is, the light-emitting element in the projection display device (projector) of Example 6 is configured by a combination of the light-emitting element of the first embodiment and the light-emitting element of the second embodiment.

That is, in Example 6, the light-emitting layer in the light-emitting element configuring the panel is formed by stacking the plurality of light-emitting layers 33A and 33B emitting light beams of the same color. Moreover, the light-emitting element of Example 6 further includes the light reflective layer 50, and resonates light emitted by the light-emitting layer between the light reflective layer 50 and the second interface which is located between the second electrode 32 and the organic layer 33, to emit a portion of the light from the second electrode 32. Similarly to Example 1, the light reflective layer 50 may be disposed below the first electrode 31, or may be disposed at a location above the first electrode 31 and below the light-emitting layer 33A. Alternatively, the formation of the light reflective layer 50 may be omitted to cause the first electrode 31 to also serve as the light reflective layer 50. Such a resonator structure may be substantially similar to the resonator structure described in Example 1.

In a case where the resonator structure is formed between the light reflective layer 50 and the second interface as described in Example 1, in a Fabry-Perot optical resonator, when $r_F$ stands for an optical reflectance of the light reflective layer 50, $t_F$ stands for an optical transmittance thereof, $r_B$ stands for an optical reflectance of the second electrode 32, $t_B$ stands for an optical transmittance thereof, $E_i$ stands for electric field intensity of light emitted in the light-emitting layer 33A, and $E_t$ stands for electric field intensity of light emitted from the second electrode 32, the following holds true:

$$|E_t/E_i|^2 = t_F 2/\{1 + (a \cdot r_F)^2 + 2a \cdot r_F \cos(\delta)\} \quad (2)$$

where 'a' stands for an absolute value of light intensity. When λ stands for a maximum peak wavelength of a spectrum of light generated in the light-emitting layer 33A, L stands for a resonator length, and θ stands for incident angle of light, relative to the second interface, resonating in the resonator upon collision with the second interface, $$\delta = 2\pi(2nL/\lambda)\cos(\theta) \quad (3)$$

holds true. Here, n stands for a positive integer, and L is a value of an optical distance ($OL_1+OL_2$).

In addition, a value of full width at half maximum (FWHM) of light emitted from the light-emitting element may be represented by:

$$FWHM = c(1 - r_F)/\{2\pi L(r_F)^{1/2}\} \quad (4)$$

where 'c' stands for a speed of light. In Example 6, the values of $m_1$ and $m_2$ are each "1". That is, the value of the resonator length L is set to a large value. Therefore, the value of FWHM represented by the expression (4) may be a value smaller than that of the existing organic EL element.

Even in the light-emitting element of Example 6, the above-mentioned expressions (1-1) and (1-2) are satisfied. Specifically, as described above, $m_1=m_2=1$ holds true. However, no limitation is made to these values; for example, $m_1=m_2=0$ may also hold true. Values of the optical distance ($OL_1+OL_2$) obtained from the expressions (1-1) and (1-2) at the time when $m_1=m_2=0$ holds true are exhibited in Table 3 below. It is to be noted that the peak wavelength λ is as exhibited in Table 1.

TABLE 3

|  | $m_1$ | $m_2$ | $OL_1 + OL_2$ |
|---|---|---|---|
| 1st panel | 0 | 0 | 110 nm |
| 2nd panel | 0 | 0 | 70 to 90 nm |
| 3rd panel/4th panel | 0 | 0 | 60 nm |

Except for the above points, the configurations and structures of the light-emitting element, the display device, and the projection display device of Example 6 may be substantially the same as the configurations and structures of the light-emitting element, the display device, and the projection display device of any of Examples 1 to 4 and 5, and therefore detailed descriptions thereof are omitted.

While the description has been given of the present disclosure on the basis of preferred Examples, the present disclosure is not limited to these Examples. The configurations and structures of the light-emitting element, the display device, the projection display device, and the panel described in Examples are illustrative, and may be modified as appropriate; a method of manufacturing the light-emitting element is also illustrative, and may be modified as appropriate. A mode may also be adopted in which the panel is not only flat, but is also curved. In addition, it may be possible to configure the display device and the projection display device by a panel including a light-emitting element that emits light other than visible light, e.g., infrared light, or by a combination of such a panel and a panel including a light-emitting element that emits visible light.

The display device and the projection display device of the present disclosure including the various preferred modes described above may be incorporated into a personal computer, a mobile phone, a PDA (portable information terminal, Personal Digital Assistant), a game machine, a wristwatch, a bracelet, a ring, or the like, for example.

It may also be possible to configure a surface-emitting device by the light-emitting element and the panel described in any of Examples. That is, the surface-emitting device includes:

the first substrate 11;

the second substrate 41; and a panel including a plurality of light-emitting elements interposed between the first substrate 11 and the second substrate 41.

Each of the light-emitting elements is configured by the light-emitting element 10 or 10' of any of Examples 1 to 6. Such a surface-emitting device is able to configure, for example, a bulletin board such as a signboard, poster, or black board, an electronic advertisement, or an electronic POP, and is also able to configure various illumination apparatuses including various backlight devices and planar light source devices.

Optimizing a position of the microlens member or the light-guiding section with respect to the light-emitting section or the light-emitting region enables a light flux of the surface-emitting device or an image emitted from the display device to be emitted in a desired direction such as an oblique direction, instead of toward the front of the display device. This enables an observer to observe a bright and sharp image in this desired direction. Alternatively, optimizing specifications of the microlens member or the light-guiding section with respect to the light-emitting section or the light-emitting region also makes it possible to diverge the light flux of the surface-emitting device or an image emitted from the display device.

In order to prevent occurrence of an optical crosstalk in a light-emitting element adjacent to a certain light-emitting element as a result of entry of light emitted from the certain light-emitting element, a light blocking region may be provided between the light-emitting elements. That is, a groove part may be formed between the light-emitting elements, and the groove part may be filled with a light-blocking material to form a light-blocking region. Providing the light-blocking region in this manner makes it is possible to reduce the percentage of the entry of light emitted from the certain light-emitting element into the adjacent light-emitting element, and thus to reliably suppress occurrence of the partial overlap of unit pixels.

The projection display device of Example is applicable to various technical fields. For example, in a case of application to the display device configuring a head-mounted display (Head Mounted Display, HMD), the display includes:
a frame to be mounted on a head of an observer; and
an image display apparatus attached to the frame.
The image display apparatus includes:
an image formation unit provided with the projection display device including the light-emitting element of any of Examples 1 to 6; and
an optical unit to which light emitted from the image formation unit is incident and from which light is emitted.
The optical unit includes:
a light-guiding plate in which the light incident from the image formation unit propagates by total reflection and from which the light is then emitted toward the observer;
a first deflection means that deflects the light incident on the light-guiding plate to allow the light incident on the light-guiding plate to be totally reflected inside the light-guiding plate; and
a second deflection means that deflects the light propagated inside the light-guiding plate by total reflection a plurality of times in order to emit the light propagated inside the light-guiding plate by total reflection from the light-guiding plate. Alternatively, it is also possible to apply the projection display device including the light-emitting element of any of Examples 1 to 6 to the image formation unit in a retinal projection display based on Maxwell's vision, specifically, a retinal projection head-mounted display, which displays an image by direct projection of the image (light flux) onto retinae of the observer.

Alternatively, it is also possible to apply it to a light source (projector) for structured light (Structured Light); in this case, a three-dimensional sensing apparatus includes:
an image formation unit provided with the projection display device including the light-emitting element of any of Examples 1 to 6; and
an imaging unit that captures an image projected onto an object by the projection display device.
Alternatively, for example, a wearable apparatus such as a wristwatch, a bracelet, or a ring may also be configured to be provided with the projection display device including the light-emitting element of any of Examples 1 to 6.

It is to be noted that the present disclosure may also have the following configurations.

[A01]<<Light-Emitting Element: First Aspect>>
A light-emitting element including:
a light-emitting section including a plurality of light-emitting regions; and
one or a plurality of microlens members controlling a traveling direction of light emitted from each of the light-emitting regions.

[A02]<<Light-Emitting Element: Second Aspect>>
A light-emitting element including:
a light-emitting section including one light-emitting region; and
a plurality of microlens members controlling a traveling direction of light emitted from the one light-emitting region.

[A03]<<Light-Emitting Element: Third Aspect>>
A light-emitting element including:
a light-emitting section including a plurality of light-emitting regions; and
one or a plurality of microlens members controlling a traveling direction of each light emitted from the plurality of light-emitting regions.

[A04] The light-emitting element according to [A01], in which an optical axis of the microlens member is not positioned on a center line passing through a center of the light-emitting region.

[A05] The light-emitting element according to any one of [A01] to [A04], in which a planar shape of the microlens member includes a shape of a rectangle or a square with corner portions being rounded.

[A06] The light-emitting element according to any one of [A01] to [A05], in which an orthogonal projection image of the light-emitting region is included within an orthogonal projection image of the microlens member in a case where the optical axis of the microlens member is positioned on the center line passing through the center of the light-emitting region.

[A07] The light-emitting element according to any one of [A01] to [A06], further including a second microlens member controlling a traveling direction of light emitted from the microlens member.

[A08] The light-emitting element according to any one of [A01] to [A07], further including a light-guiding section controlling the traveling direction of light emitted from the microlens member.

[A09] The light-emitting element according to [A08], in which
a plurality of the light-guiding sections has a stacked structure, and
axis lines of the plurality of the light-guiding sections are not on same straight line.

[A10] The light-emitting element according to any one of [A01] to [A09], in which
the light-emitting section includes
a first electrode shared in the light-emitting region,
an organic layer formed on the first electrode and including a light-emitting layer including an organic light-emitting material, and
a second electrode formed on the organic layer,
the light-emitting section further includes a light reflective layer below the first electrode, and resonates light emitted by the light-emitting layer between an interface and the light reflective layer, the interface being between the second electrode and the organic layer, the light-emitting section emitting a portion of the light from the second electrode, and an insulating layer is formed between the first electrode and the organic layer, the insulating layer being provided with an opening defining the light-emitting region.

[A11] The light-emitting element according to any one of [A01] to [A09], in which the light-emitting section includes a first electrode shared in the light-emitting region, an organic layer formed on the first electrode and including a light-emitting layer including an organic light-emitting material, and a second electrode formed on the organic layer, the light-emitting layer includes a plurality of stacked light-emitting layers emitting light beams of same color, and an insulating layer is formed between the first electrode and the organic layer, the insulating layer being provided with an opening defining the light-emitting region.

[A12] The light-emitting element according to any one of [A01] to [A11], in which the microlens member has positive optical power.

[A13] The light-emitting element according to any one of [A01] to [A12], in which the light-emitting region has a convex shape in a direction away from the microlens member.

[A14] The light-emitting element according to any one of [A01] to [A11], in which the microlens member has negative optical power.

[A15] <<Light-Emitting Element: Fourth Aspect>>

A light-emitting element including:

a light-emitting section including a plurality of light-emitting regions; and a light-guiding section controlling a traveling direction of light emitted from each of the light-emitting regions, in which the light-emitting region has a convex shape in a direction away from the light-guiding section.

[A16] The light-emitting element according to [A15], in which the light-emitting region has positive optical power.

[A17] The light-emitting element according to [A15] or [A16], in which a plurality of the light-guiding sections has a stacked structure, and axis lines of the plurality of the light-guiding sections are not on same straight line.

[B01] The light-emitting element according to [A10] or any one of [A12] to [A14] depending on [A10], in which, when $OL_1$ stands for an optical distance from a maximum light-emitting position of the light-emitting layer to the light reflective layer, $OL_2$ stands for an optical distance from the maximum light-emitting position of the light-emitting layer to the interface, and $m_1$ and $m_2$ stand for integers, the following expressions (1-1) and (1-2):

$$0.7\{-\Phi_1/(2\pi)+m_1\} \le 2 \times OL_1/\lambda \le 1.2\{-\Phi_1/(2\pi)+m_1\} \quad (1\text{-}1)$$

$$0.7\{-\Phi_2/(2\pi)+m_2\} \le 2 \times OL_2/\lambda \le 1.2\{-\Phi_2/(2\pi)+m_2\} \quad (1\text{-}2)$$

are satisfied, where $\lambda$ denotes a maximum peak wavelength of a spectrum of light generated at the light-emitting layer (or a desired wavelength among light beams generated at the light-emitting layer), $\Phi_1$ denotes a phase shift amount (unit: radian) of reflected light generated at the light reflective layer (light reflected at the light reflective layer), provided that $-2\pi<\Phi_1\le 0$ holds true, and $\Phi_2$ denotes a phase shift amount (unit: radian) of reflected light generated at the interface (light reflected at the interface), provided that $-2\pi<\Phi_2\le 0$ holds true.

[B02] The light-emitting element according to [B01], in which $m_1\ge 1$ and $m_2\ge 1$ are satisfied.

[B03] The light-emitting element according to [A10], any one of [A12] to [A14] depending on [A10], or [B01] or [B02], further including a metal thin film filter layer formed between the first electrode and the light reflective layer.

[B04] The light-emitting element according to [A10], any one of [A12] to [A14] depending on [A10], or any one of [B01] to [B03], in which the first electrode and the light reflective layer are surrounded by a light-blocking section or a light reflective section.

[B05] The light-emitting element according to [A10], any one of [A12] to [A14] depending on [A10], or any one of [B01] to [B04], in which the first electrode includes a light-transmissive material, and the second electrode includes a semi-light-transmissive material.

[B06] The light-emitting element according to [B05], in which the first electrode includes ITO or IZO, and the second electrode includes at least one type of a material selected from the group consisting of Ag, Ag—Mg, Ag—Nd—Cu, Au, Ag—Cu, Al, and Al—Cu.

[C01] The light-emitting element according to [A11] or any one of [A12] to [A14] depending on [A11], in which an interlayer is formed between the light-emitting layers.

[C02] The light-emitting element according to [C01], in which the interlayer includes at least one type of a material selected from the group consisting of lithium (Li), calcium (Ca), sodium (Na), cesium (Cs), molybdenum oxide ($MoO_3$), vanadium oxide ($V_2O_5$), and tungsten oxide ($WO_3$).

[C03] The light-emitting element according to [A11], any one of [A12] to [A14] depending on [A11], or [C01] or [C02], in which the plurality of light-emitting layers have same composition.

[C04] The light-emitting element according to [A11], any one of [A12] to [A14] depending on [A11], or any one of [C01] to [C03], further including a light reflective layer, in which light emitted by the light-emitting layer is resonated between an interface and the light reflective layer, the interface being between the second electrode and the organic layer, and a portion of the light is emitted from the second electrode.

[C05] The light-emitting element according to [C04], in which the light reflective layer is disposed below the first electrode.

[C06] The light-emitting element according to [C04], in which the light reflective layer is disposed at a location above the first electrode and below the light-emitting layer.

[C07] The light-emitting element according to any one of [C04] to [C06], in which, when $OL_1$ stands for an optical distance from a maximum light-emitting position of the light-emitting layer to the light reflective layer, $OL_2$ stands for an optical distance from the maximum light-emitting position of the light-emitting layer to the interface, and $m_1$ and $m_2$ stand for integers, the following expressions (1-1) and (1-2):

$$0.7\{-\Phi_1/(2\pi)+m_1\} \le 2 \times OL_1/\lambda \le 1.2\{-\Phi_1/(2\pi)+m_1\} \quad (1\text{-}1)$$

-continued $$0.7\{-\Phi_2/(2\pi) + m_2\} \le 2 \times OL_2/\lambda \le 1.2\{-\Phi_2/(2\pi) + m_2\} \quad (1-2)$$

are satisfied, where $\lambda$ denotes a maximum peak wavelength of a spectrum of light generated at the light-emitting layer (or a desired wavelength among light beams generated at the light-emitting layer), $\Phi_1$ denotes a phase shift amount (unit: radian) of reflected light generated at the light reflective layer (light reflected at the light reflective layer), provided that $-2\pi<\Phi_1\le 0$ holds true, and $\Phi_2$ denotes a phase shift amount (unit: radian) of reflected light generated at the interface (light reflected at the interface), provided that $-2\pi<\Phi_2\le 0$ holds true.

[C08] The light-emitting element according to [C07], in which $m_1\ge 1$ and $m_2\ge 1$ are satisfied.

[C09] The light-emitting element according to [C05], further including a metal thin film filter layer formed between the first electrode and the light reflective layer.

[C10] The light-emitting element according to any one of [C04] to [C09], in which the first electrode and the light reflective layer are surrounded by a light-blocking section or a light reflective section.

[C11] The light-emitting element according to any one of [C01] to [C10], in which the first electrode includes a light-transmissive material, and the second electrode includes a semi-light-transmissive material.

[C12] The light-emitting element according to [C11], in which the first electrode includes ITO or IZO, and the second electrode includes at least one type of a material selected from the group consisting of Ag, Ag—Mg, Ag—Nd—Cu, Au, Ag—Cu, Al, and Al—Cu.

[D01] The light-emitting element according to any one of [A01] to [C12], in which a value of full width at half maximum of light emitted from the light-emitting element is 30 nm or less.

[D02] The light-emitting element according to any one of [A01] to [D01], in which, when $I_0$ stands for light intensity at a center line passing through a center of the light-emitting section of the light-emitting element, and $I_{conv}$ stands for light intensity at a center line passing through a center of the light-emitting section of the light-emitting element not including the light reflective layer, $$I_0/I_{conv} \ge 5$$

is satisfied.

[D03] The light-emitting element according to any one of [A01] to [D02], in which, when the light intensity at the center line passing through the center of the light-emitting section of the light-emitting element is set to 100%, a directivity half-value angle, which is an angle formed between a direction with respect to the center line obtaining 50% light intensity and the center line, is 25 degrees or less.

[E01]<<Display Device>>

A display device including:

a first substrate;

a second substrate; and a panel including a plurality of light-emitting elements interposed between the first substrate and the second substrate, in which each of the light-emitting elements is configured by the light-emitting element according to any one of [A01] to [D03].

[E02] The display device according to [E01], in which the display device includes a projection display device.

[E03] The display device according to [E02], in which the display device is configured by three panels of one red light emission panel emitting red light, one green light emission panel emitting green light, and one blue light emission panel emitting blue light.

[E04] The display device according to [E03], further including one blue light emission panel emitting blue light, in which the display device is configured by four panels.

[E05] The display device according to [E04], in which the four panels are arranged in an array.

[E06] The display device according to [E04], in which the four panels are arranged in a 2×2 state.

[E07] The display device according to any one of [E02] to [E06], further including a projection lens system on light emission side.

[E08] The display device according to any one of [E03] to [E06], including:

an image synthesizing means that synthesizes images emitted from a plurality of the panels into one image, and a projection lens system on light emission side of the image synthesizing means.

[E09] The display device according to [E08], in which the image synthesizing means includes a non-polarizing dichroic prism.

[E10] The display device according to [E08], in which the image synthesizing means includes a Philips prism.

[E11] The display device according to any one of [C08] to [E10], in which light incident on the projection lens system includes parallel light.

[E12] The display device according to any one of [E01] to [E11], in which the panel is curved.

[F01]<<Surface-Emitting Device>>

A surface-emitting device including:

a first substrate;

a second substrate; and a panel including a plurality of light-emitting elements interposed between the first substrate and the second substrate, in which each of the light-emitting elements is configured by the light-emitting element according to any one of [A01] to [D03].

[F02]<<Display Device (HMD)>>

A display device including:

a frame to be mounted on a head of an observer; and an image display apparatus attached to the frame, the image display apparatus including an image formation unit including the display device according to any one of [E01] to [E12], and an optical unit to which light emitted from the image formation unit is incident and from which light is emitted, the optical unit including a light-guiding plate in which the light incident from the image formation unit propagates by total reflection and from which the light is then emitted toward the observer, a first deflection means that deflects the light incident on the light-guiding plate to allow the light incident on the light-guiding plate to be totally reflected inside the light-guiding plate, and a second deflection means that deflects the light propagated inside the light-guiding plate by total reflection a plurality of times in order to emit the light propagated inside the light-guiding plate by total reflection from the light-guiding plate.

[F03]<<Three-Dimensional Sensing Apparatus>>

A three-dimensional sensing apparatus including:

an image formation unit including the display device according to any one of [E01] to [E12]; and an imaging unit that captures an image projected onto an object by the display device.

[F04]<<Wearable Apparatus>

A wearable apparatus including the display device according to any one of [E01] to [E12].

REFERENCE NUMERALS LIST 1R red light emission panel (first panel)
1G green light emission panel (second panel)
$1B_1$, $1B_2$ blue light emission panel (third panel, fourth panel)
10, 10' light-emitting element
11 first substrate
20 transistor
21 gate electrode
22 gate insulating layer
23 channel formation region
24 source/drain region
25 element separation region
26 base (interlayer insulating layer)
26A lower interlayer insulating layer
26B upper interlayer insulating layer
27 contact plug
28 insulating layer
29 opening
30 light-emitting section
30' light-emitting region
31 first electrode
32 second electrode
33 organic layer
33A, 33B light-emitting layer
33C hole injection layer and hole transport layer
33D interlayer (charge-generating layer)
33E electron transport layer and electron injection layer
34 protective layer (planarizing layer)
35 sealing resin layer
36 underlayer
37 material filling interior (inside) of light-guiding section
41 second substrate
50 light reflective layer
51 light-blocking section or light reflective section
52 metal thin film filter layer
53 void provided in metal thin film filter layer
54 light-absorbing layer (black matrix layer)
60 microlens member
61 light-guiding section (light reflective section, reflector section)
70 projection lens system
71 image synthesizing means
72 non-polarizing dichroic prism
73 Philips prism

What is claimed is:

1. A light-emitting element, comprising:

a light-emitting section including a plurality of light-emitting regions, wherein the light-emitting section includes a first electrode shared in the light-emitting region, an organic layer formed on the first electrode and including a light-emitting layer including an organic light-emitting material, and a second electrode formed on the organic layer, wherein the light-emitting section further includes a light reflective layer below the first electrode, and resonates light emitted by the light-emitting layer between an interface and the light reflective layer, the interface being between the second electrode and the organic layer, the light-emitting section emitting a portion of the light from the second electrode, and an insulating layer is formed between the first electrode and the organic layer, the insulating layer being provided with an opening defining the light-emitting region; and one or a plurality of microlens members controlling a traveling direction of light emitted from each of the light-emitting regions.

2. The light-emitting element according to claim 1, wherein an optical axis of the microlens member is not positioned on a center line passing through a center of the light-emitting region.

3. The light-emitting element according to claim 1, wherein a planar shape of the microlens member comprises a shape of a rectangle or a square with corner portions being rounded.

4. The light-emitting element according to claim 1, wherein an orthogonal projection image of the light-emitting region is included within an orthogonal projection image of the microlens member in a case where an optical axis of the microlens member is positioned on a center line passing through a center of the light-emitting region.

5. The light-emitting element according to claim 1, further comprising a second microlens member controlling a traveling direction of light emitted from the microlens member.

6. The light-emitting element according to claim 1, further comprising a light-guiding section controlling a traveling direction of light emitted from the microlens member.

7. The light-emitting element according to claim 6, wherein a plurality of the light-guiding sections has a stacked structure, and axis lines of the plurality of the light-guiding sections are not on same straight line.

8. A light-emitting element, comprising:

a light-emitting section including a plurality of light-emitting regions, wherein the light-emitting section includes a first electrode shared in the light-emitting region, an organic layer formed on the first electrode and including a light-emitting layer including an organic light-emitting material, and a second electrode formed on the organic layer, the light-emitting layer comprises a plurality of stacked light-emitting layers emitting light beams of same color, and an insulating layer is formed between the first electrode and the organic layer, the insulating layer being provided with an opening defining the light-emitting region; and one or a plurality of microlens members controlling a traveling direction of light emitted from each of the light-emitting regions.

9. The light-emitting element according to claim 8, wherein an optical axis of the microlens member is not positioned on a center line passing through a center of the light-emitting region.

10. The light-emitting element according to claim 8, wherein a planar shape of the microlens member comprises a shape of a rectangle or a square with corner portions being rounded.

11. The light-emitting element according to claim 8, wherein an orthogonal projection image of the light-emitting region is included within an orthogonal projection image of the microlens member in a case where an optical axis of the microlens member is positioned on a center line passing through a center of the light-emitting region.

12. The light-emitting element according to claim 8, further comprising a second microlens member controlling a traveling direction of light emitted from the microlens member.

13. The light-emitting element according to claim 8, further comprising a light-guiding section controlling a traveling direction of light emitted from the microlens member.

14. The light-emitting element according to claim 13, wherein a plurality of the light-guiding sections has a stacked structure, and axis lines of the plurality of the light-guiding sections are not on same straight line.

15. The light-emitting element according to claim 8, wherein the microlens member has positive optical power.

16. The light-emitting element according to claim 1, wherein the microlens member has positive optical power.

17. The light-emitting element according to claim 1, wherein the light-emitting region has a convex shape in a direction away from the microlens member.

18. The light-emitting element according to claim 1, wherein the microlens member has negative optical power.

19. A display device, comprising:

a first substrate;

a second substrate; and a panel including a plurality of light-emitting elements interposed between the first substrate and the second substrate, wherein each of the light-emitting elements is configured by the light-emitting element according to claim 1.

20. The display device according to claim 19, wherein the display device comprises a projection display device.

* * * * *